United States Patent [19]
Kondo et al.

[11] Patent Number: 5,283,468
[45] Date of Patent: Feb. 1, 1994

[54] ELECTRIC CIRCUIT APPARATUS

[75] Inventors: Hiroshi Kondo, Yokohama; Yoshimi Terayama, Odawara; Takashi Sakaki, Tokyo; Shunichi Haga; Tetsuo Yoshizawa, both of Yokohama; Yasuteru Ichida, Tokyo; Masaki Konishi, Ebina, all of Japan

[73] Assignee: Canon Kabushiki Kaisha, Tokyo, Japan

[21] Appl. No.: 43,629

[22] Filed: Apr. 8, 1993

Related U.S. Application Data

[63] Continuation of Ser. No. 803,904, Dec. 9, 1991, abandoned, which is a continuation of Ser. No. 358,641, May 30, 1989, abandoned.

[30] Foreign Application Priority Data

| | | |
|---|---|---|
| May 30, 1988 [JP] | Japan | 133136 |
| May 30, 1988 [JP] | Japan | 133137 |
| May 31, 1988 [JP] | Japan | 133391 |
| May 31, 1988 [JP] | Japan | 133392 |
| May 31, 1988 [JP] | Japan | 133393 |
| May 31, 1988 [JP] | Japan | 133394 |

[51] Int. Cl.⁵ ............... H01L 23/16; H01L 39/02; H01L 23/48
[52] U.S. Cl. .................. 257/774; 257/698; 257/724; 257/726; 257/730; 257/777; 257/785; 257/787
[58] Field of Search ............ 357/75, 63, 66, 67, 357/71, 72, 80; 257/698, 724, 726, 730, 774, 777, 785, 787

[56] References Cited

U.S. PATENT DOCUMENTS

| 4,744,008 | 5/1988 | Black et al. | 357/75 |
| 4,893,174 | 1/1990 | Yamada et al. | 357/82 |
| 4,926,241 | 5/1990 | Carey | 357/75 |

FOREIGN PATENT DOCUMENTS

| 245179 | 11/1987 | European Pat. Off. |
| 284820 | 10/1988 | European Pat. Off. |
| 329133 | 8/1989 | European Pat. Off. |

*Primary Examiner*—Ngan Ngo
*Attorney, Agent, or Firm*—Fitzpatrick, Cella, Harper & Scinto

[57] ABSTRACT

An electric circuit apparatus comprises an electrically connecting member including a holding body made of an electrically insulating material and a plurality of electrically conductive members embedded in the holding body. First end portions of the electrically conductive member extend through a first side of the holding body and second end portions of the electrically conductive member extend through the other side of the holding body. A plurality of electric circuit components are connected to the second end portions of the electrically conductive members.

8 Claims, 55 Drawing Sheets

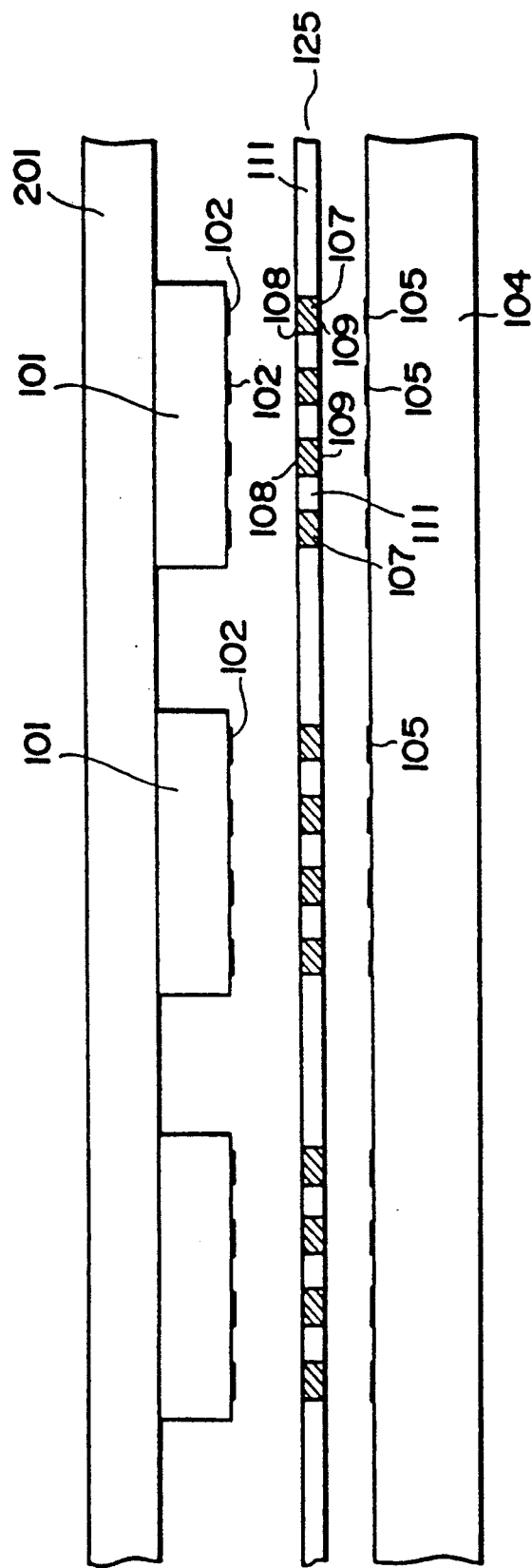

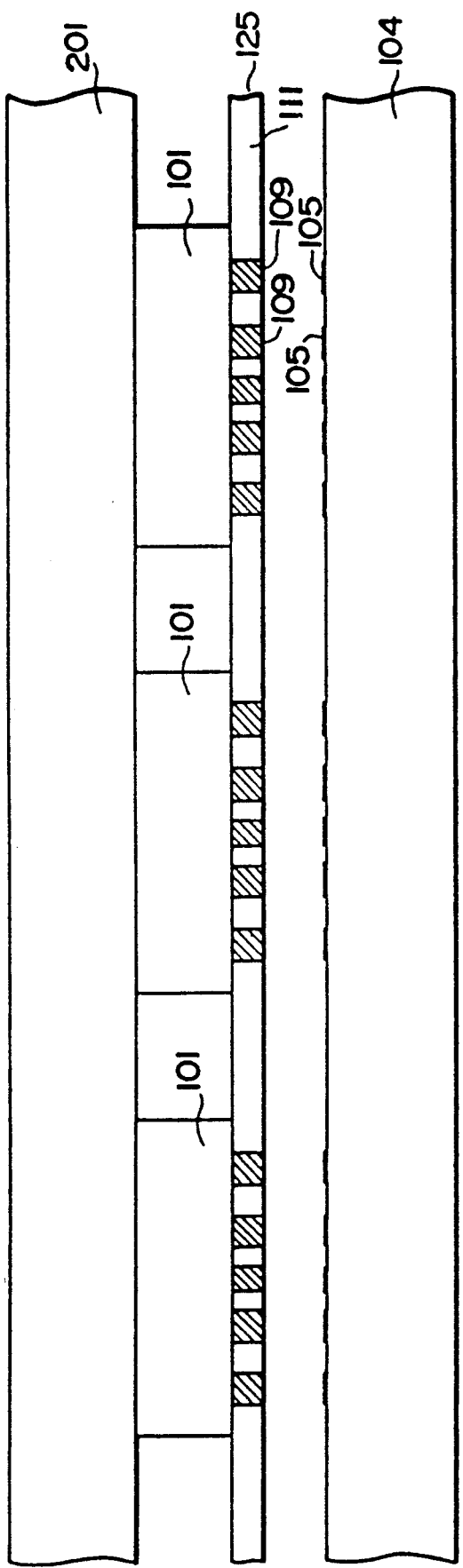
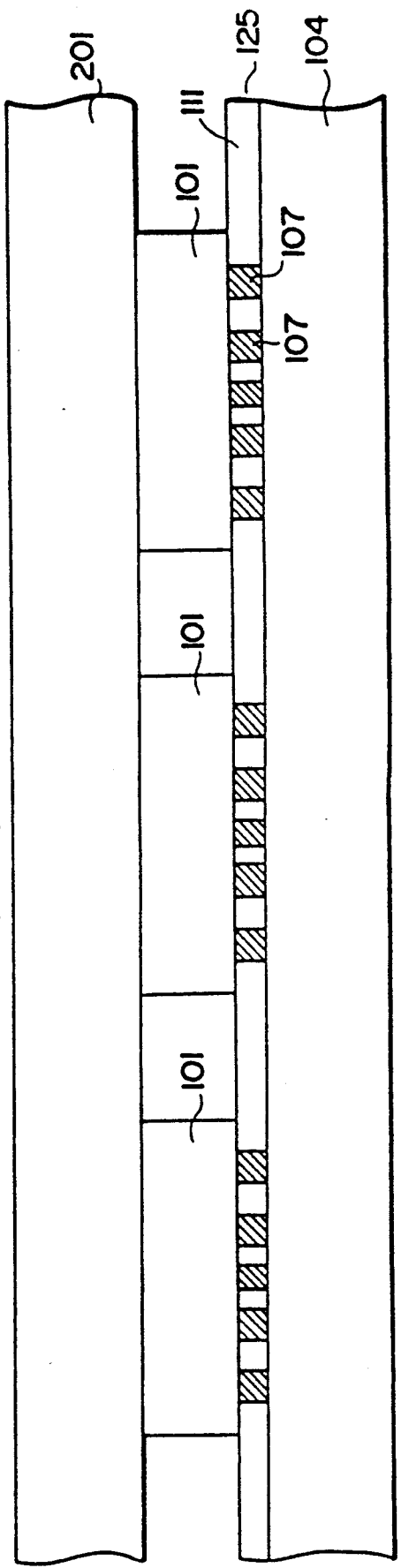

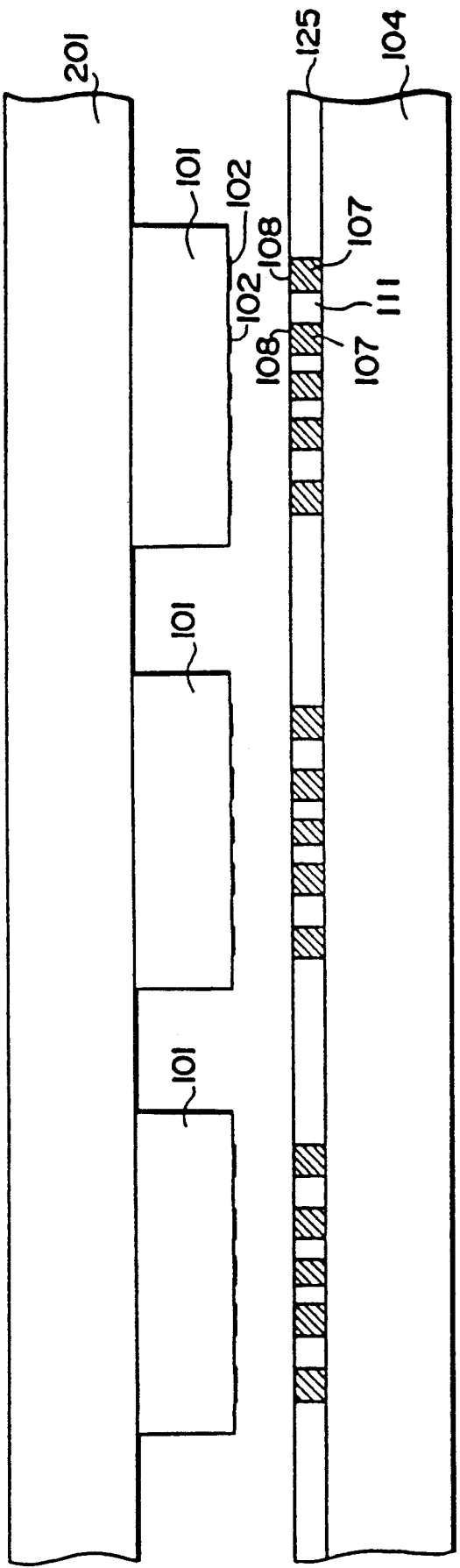
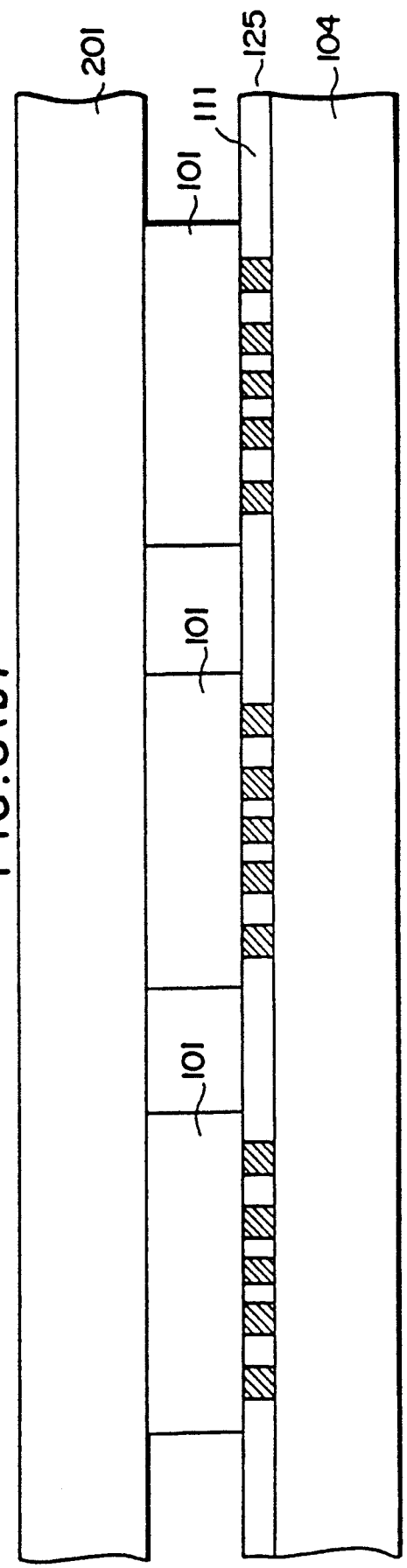

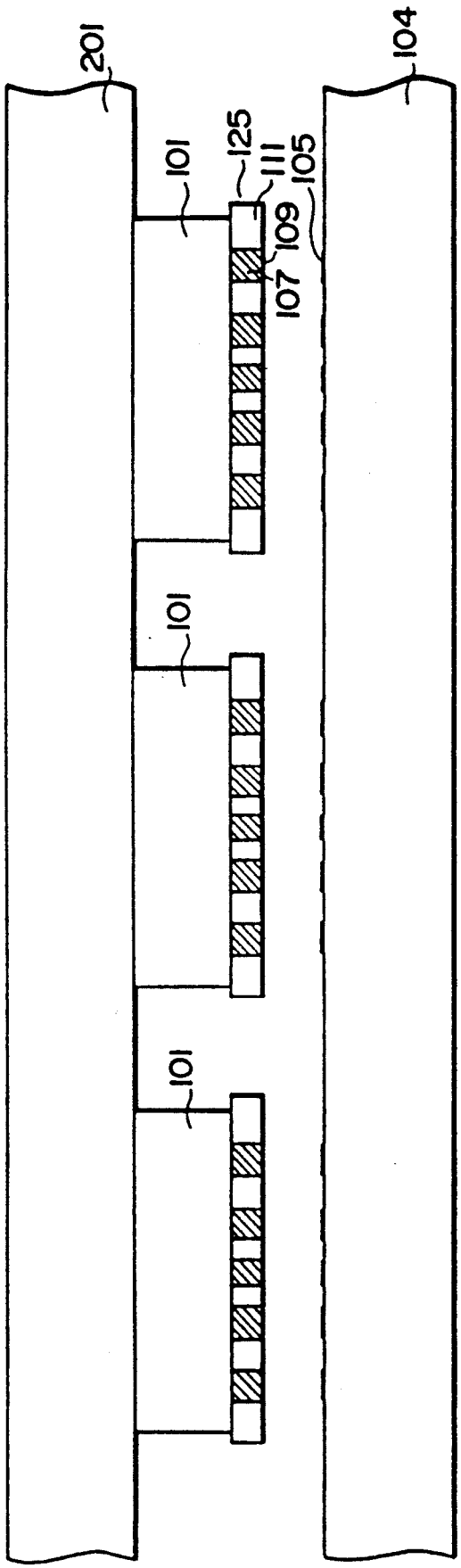
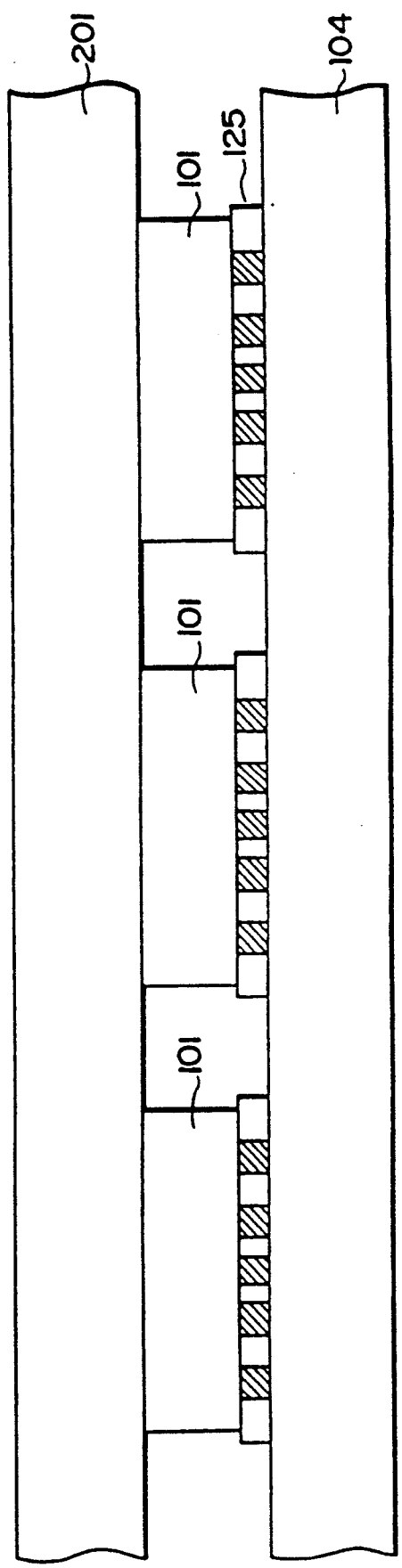

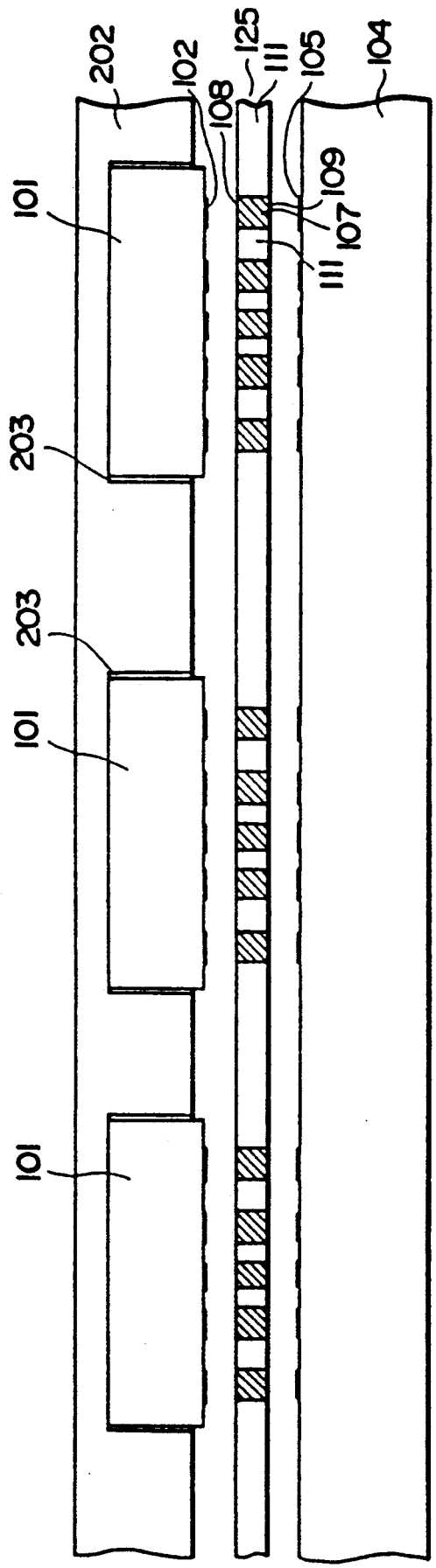
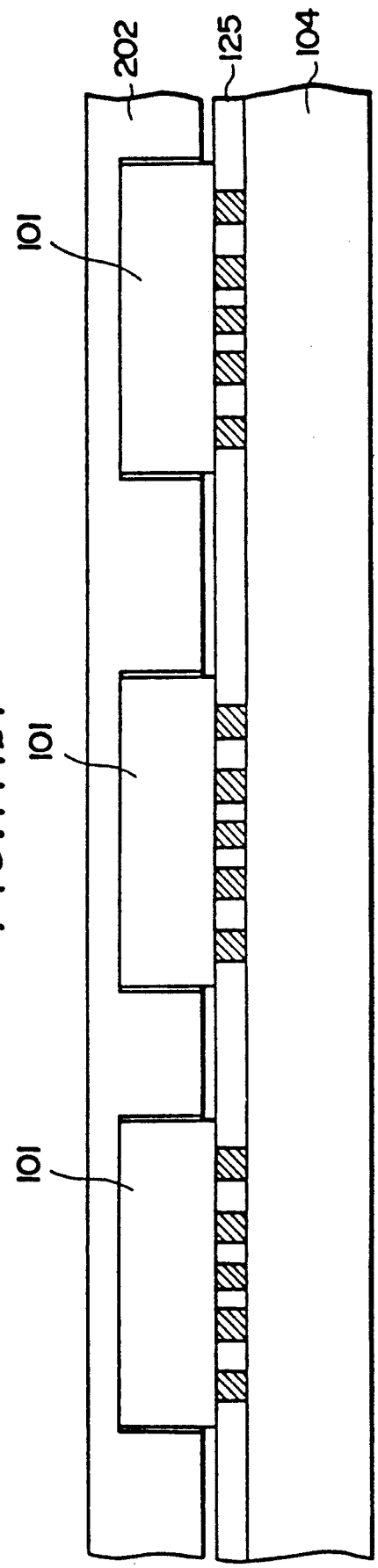
FIG.11(a)
FIG.11(b)

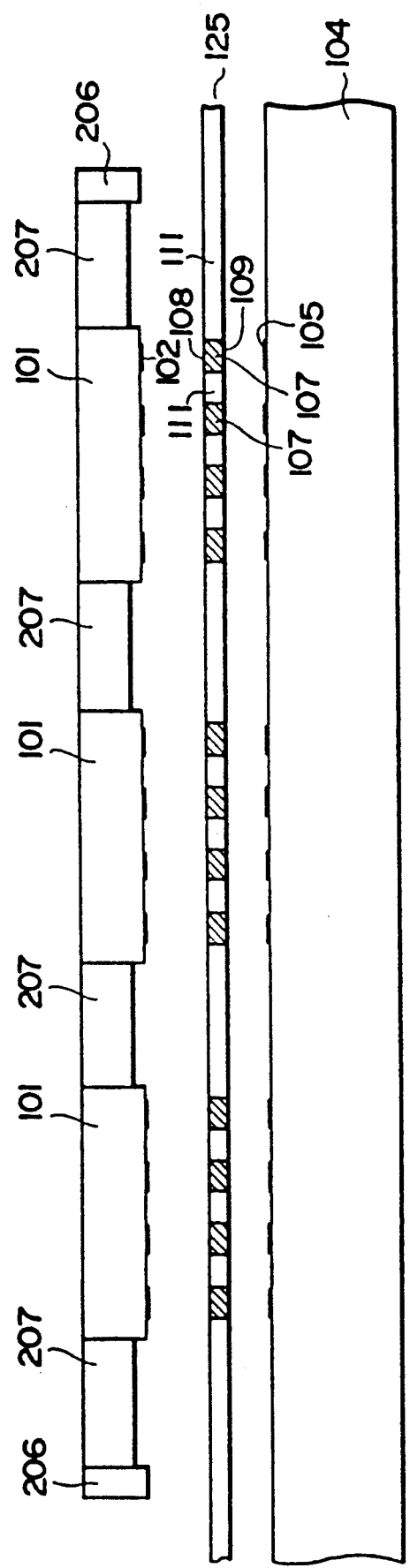
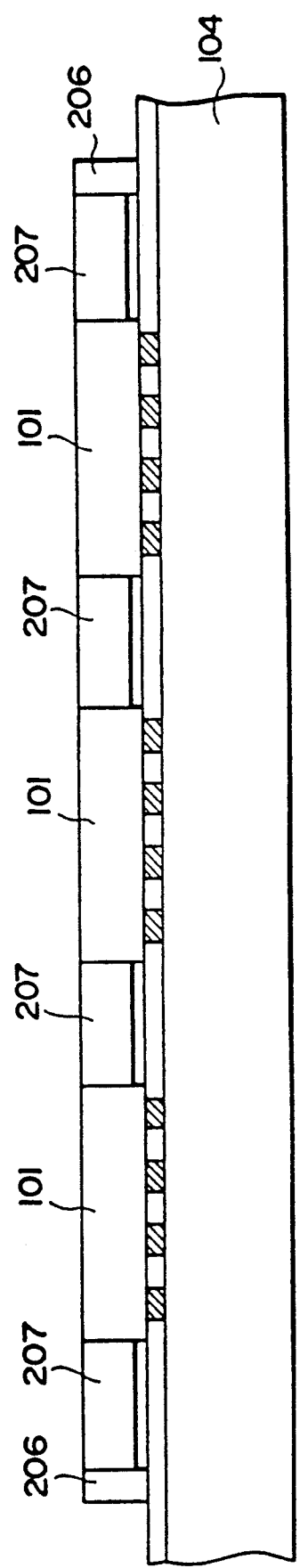
FIG.13(c)
FIG.13(d)

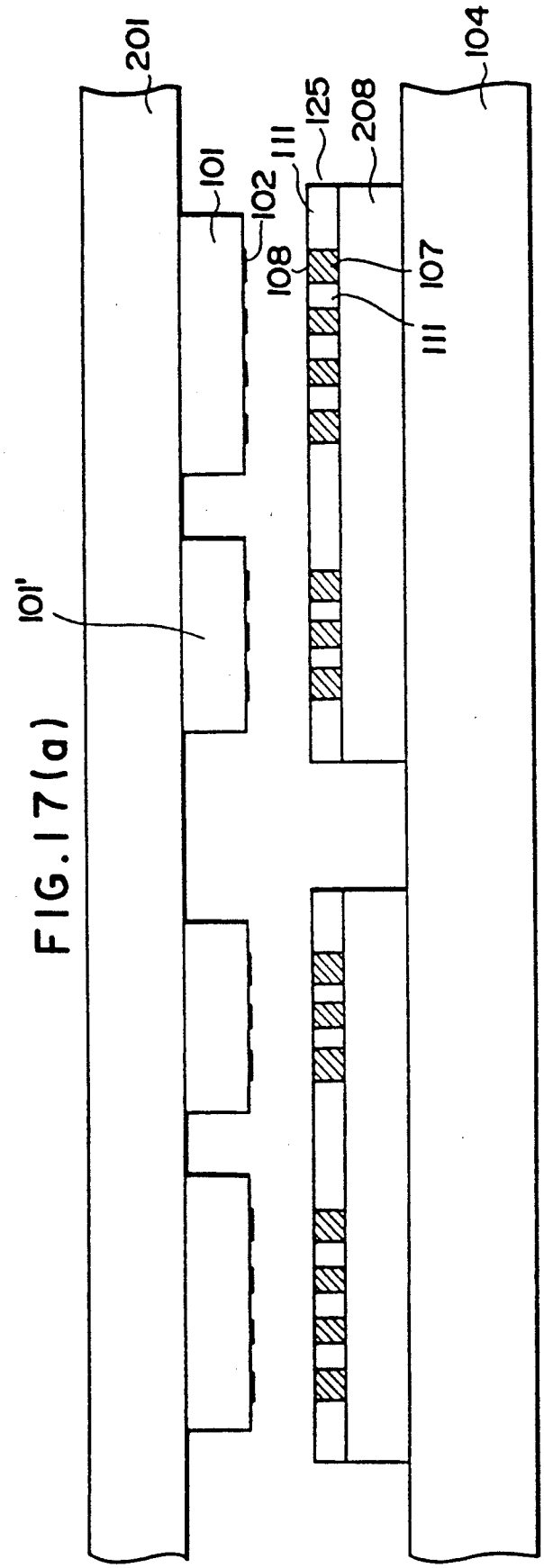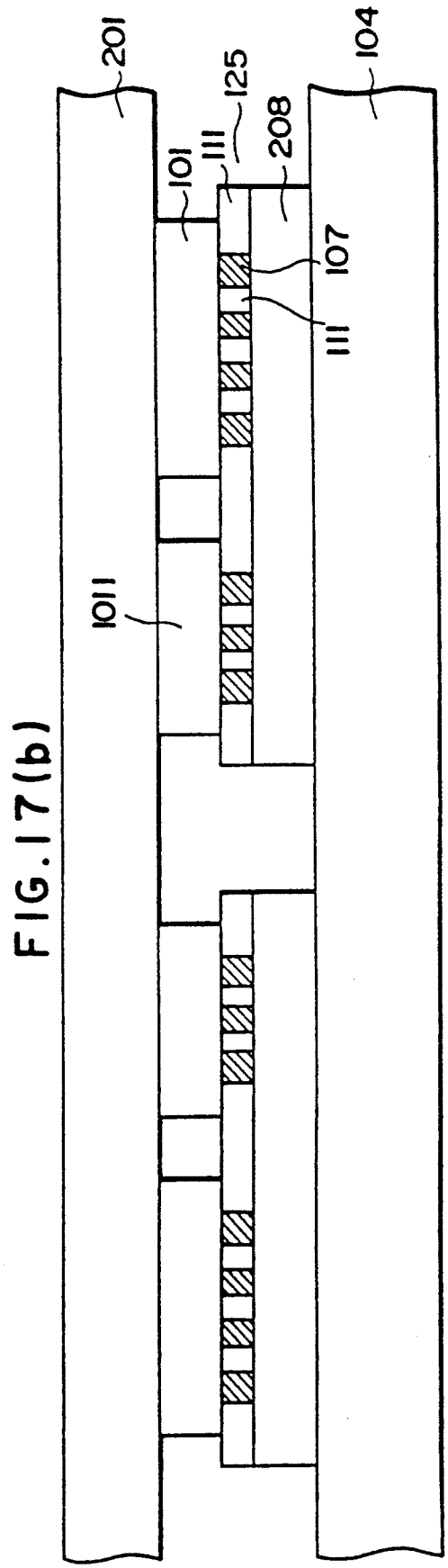
FIG.17(a)
FIG.17(b)

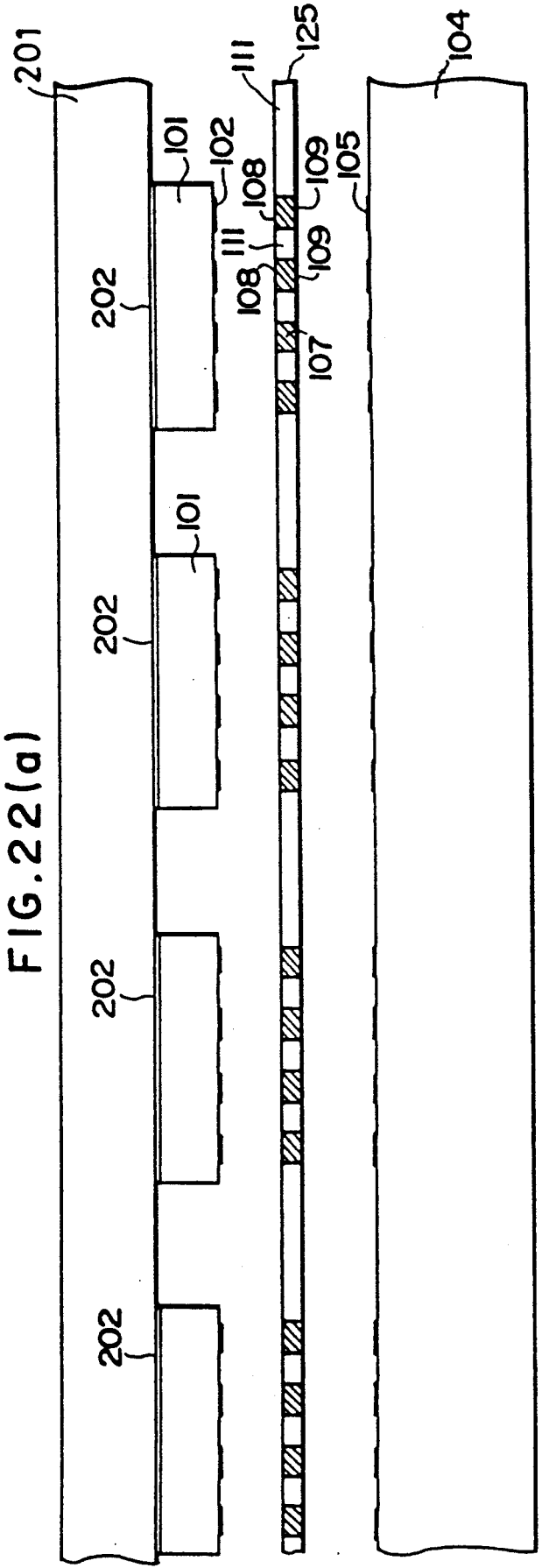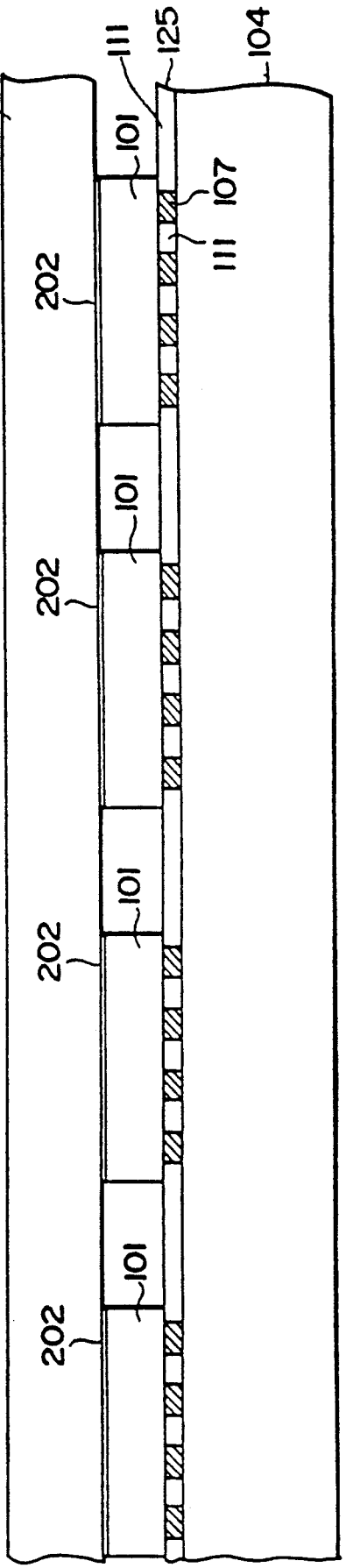

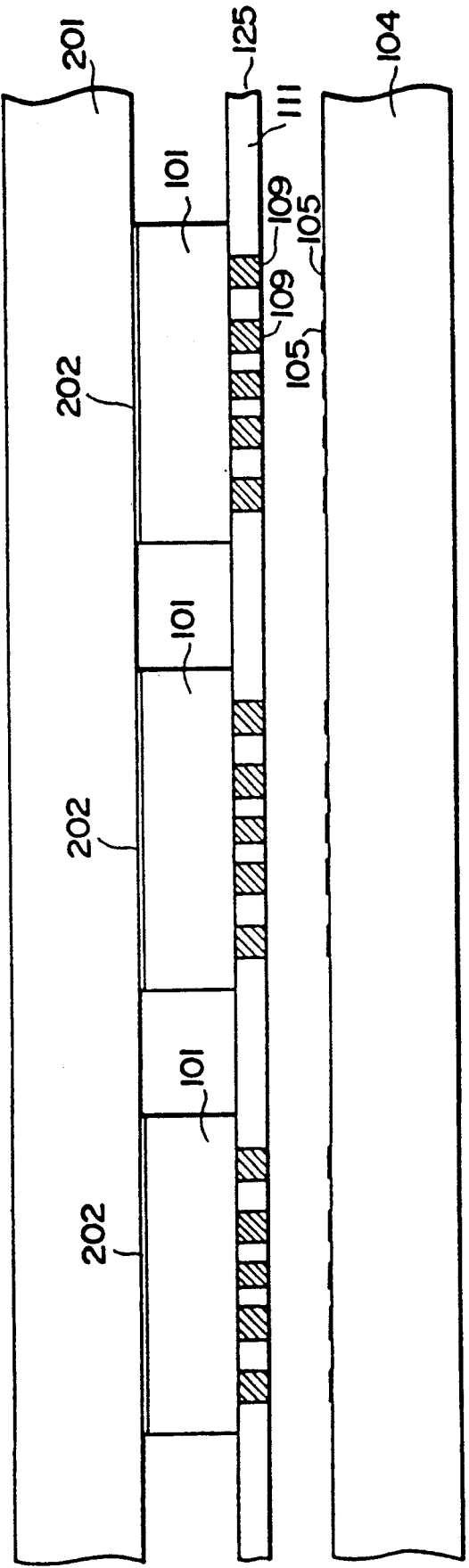
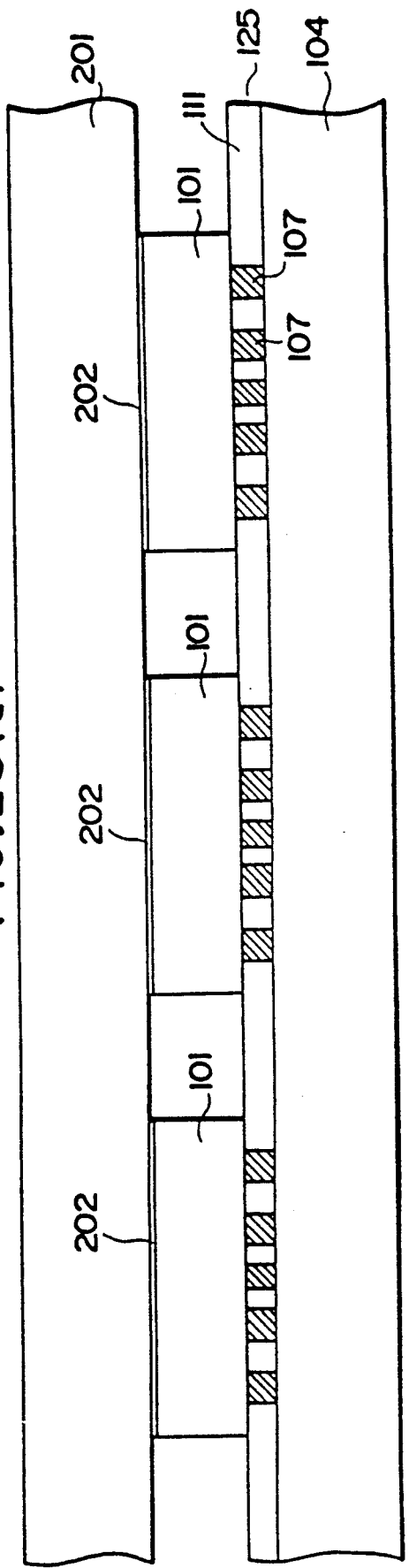

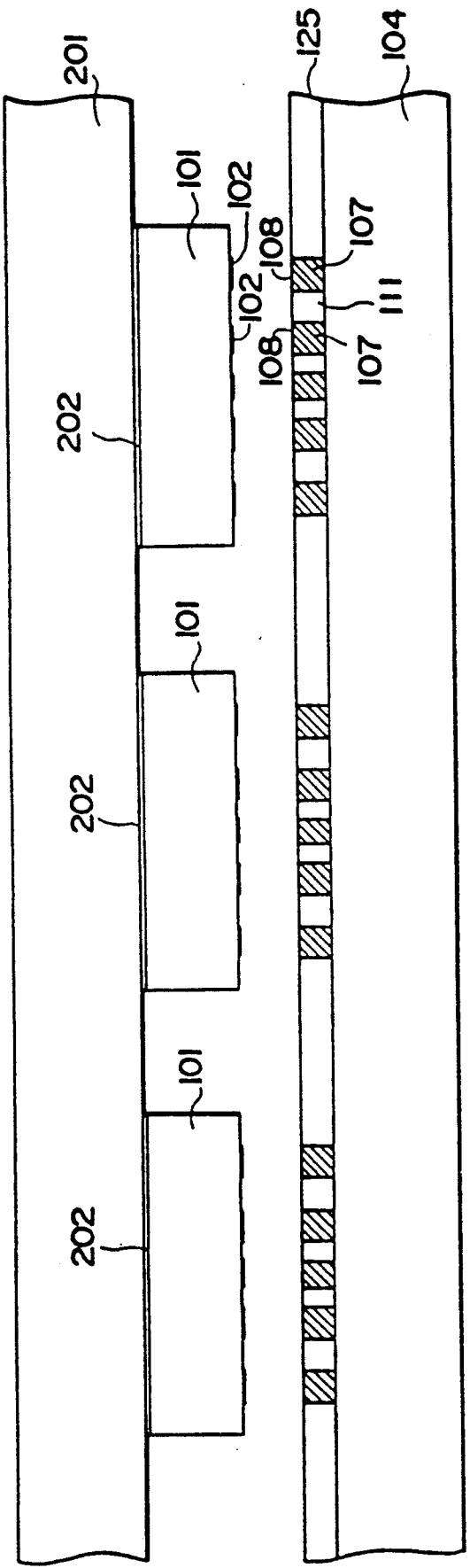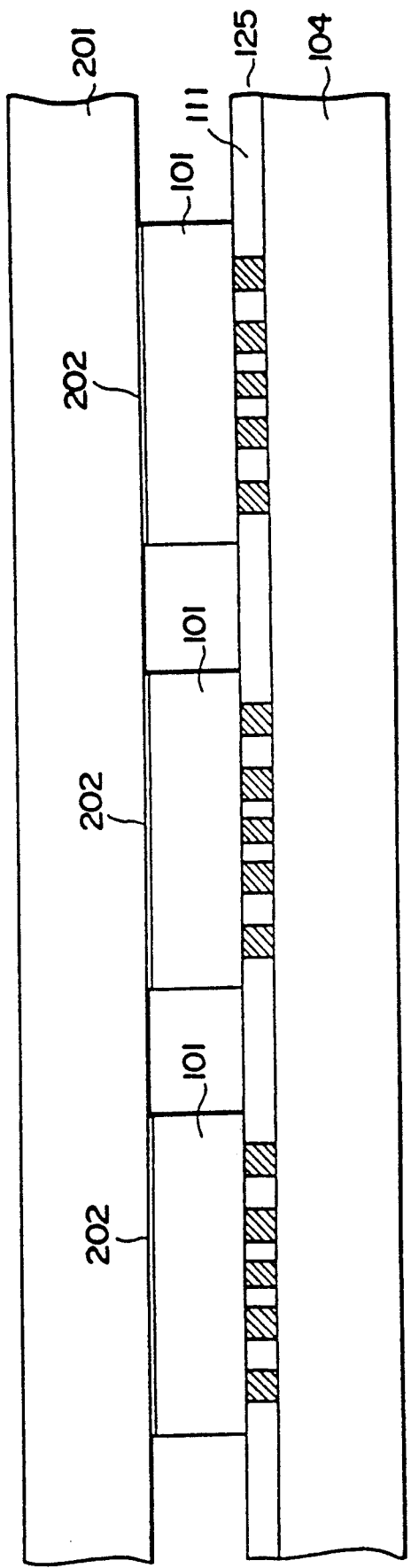

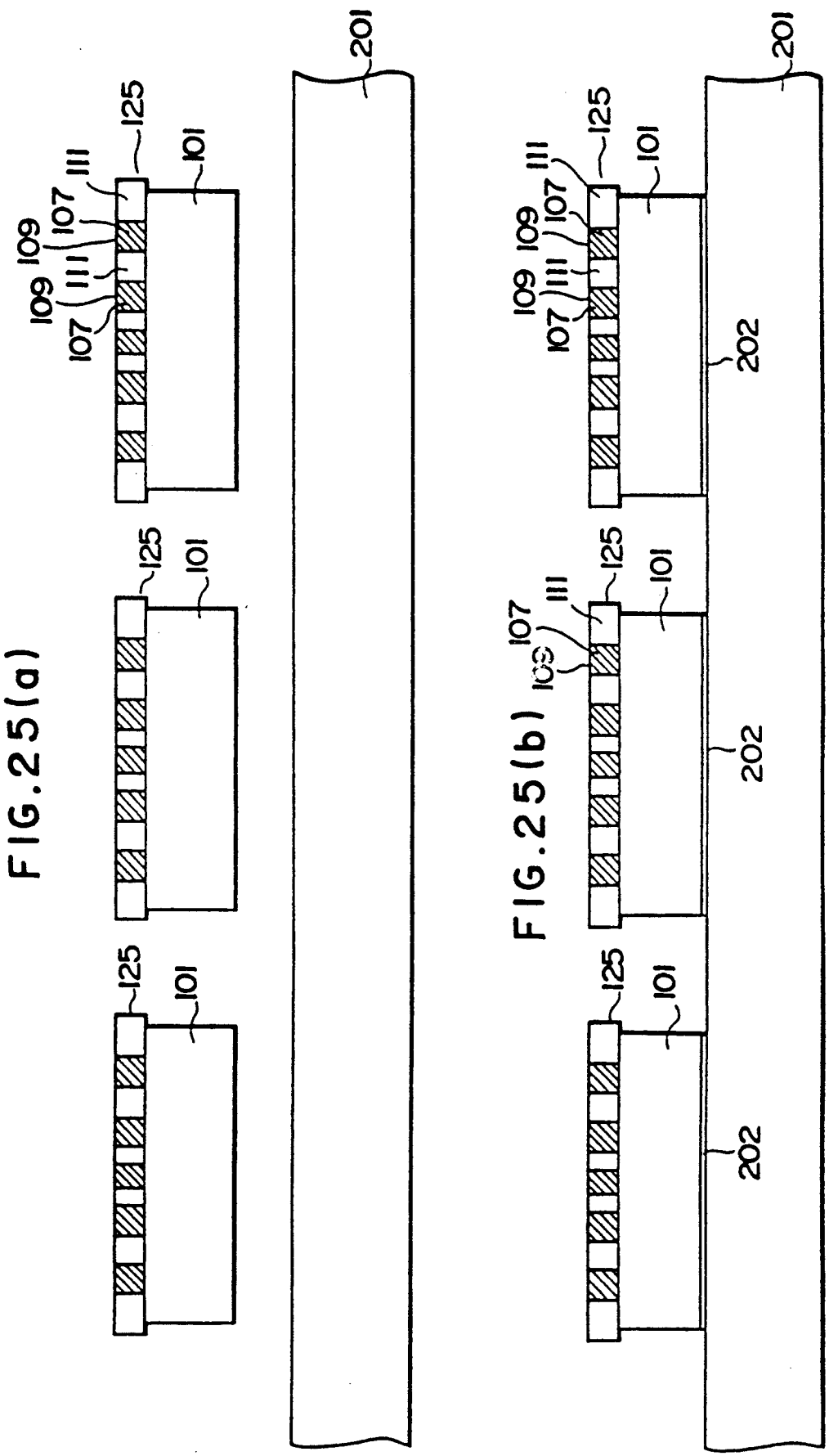

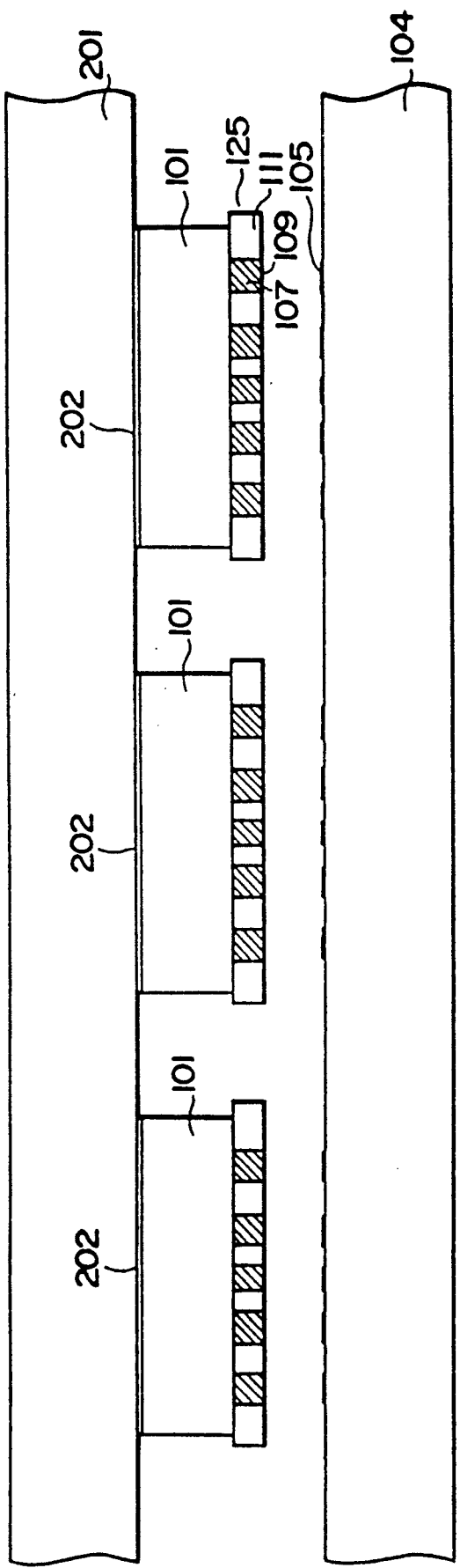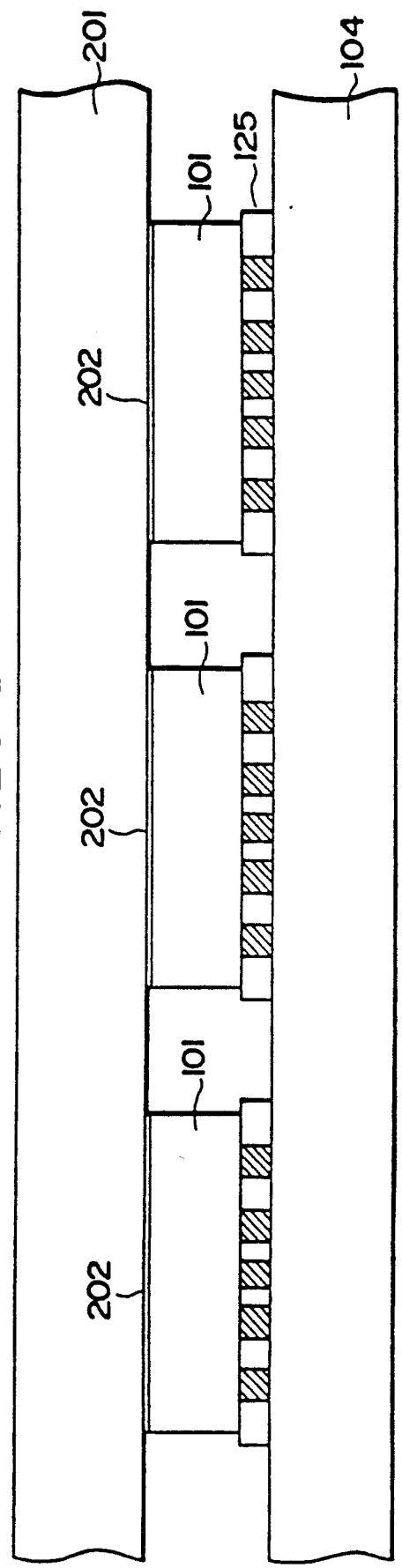

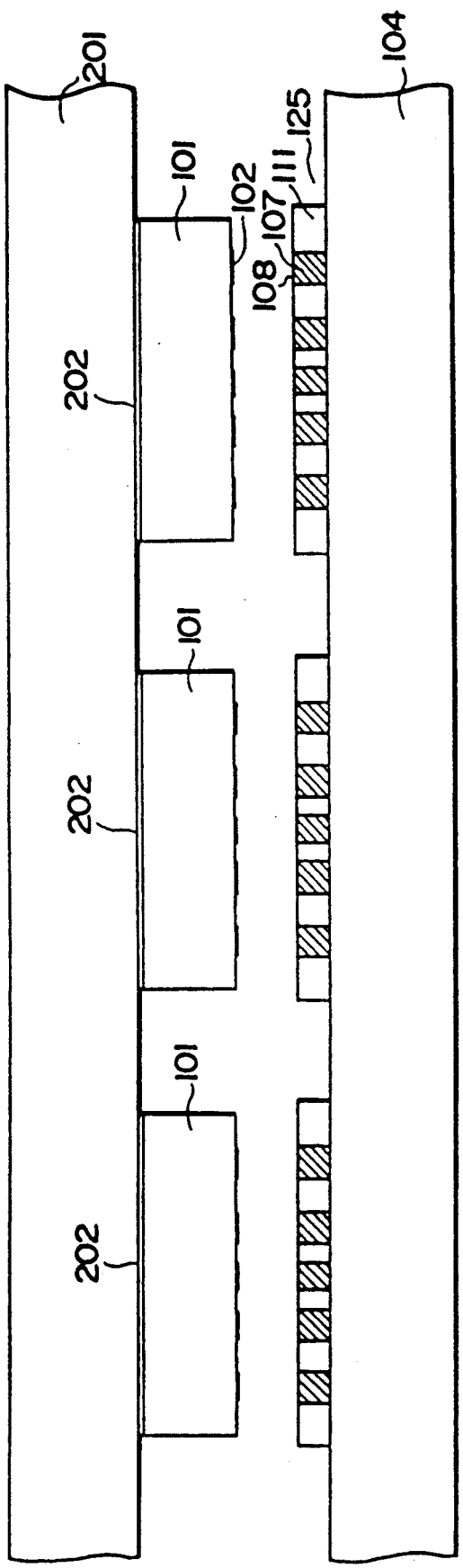
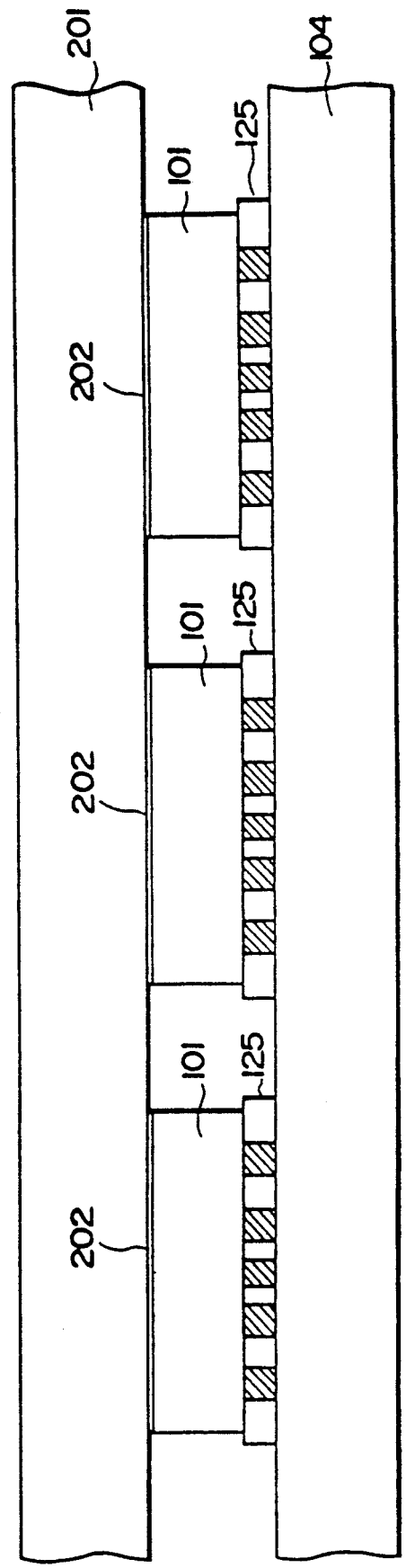

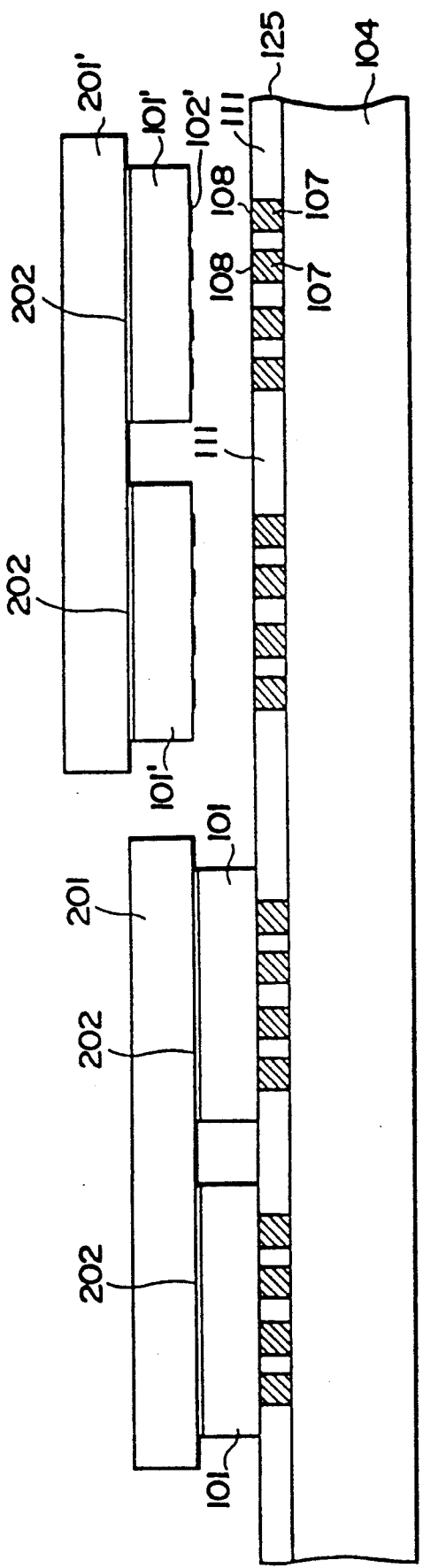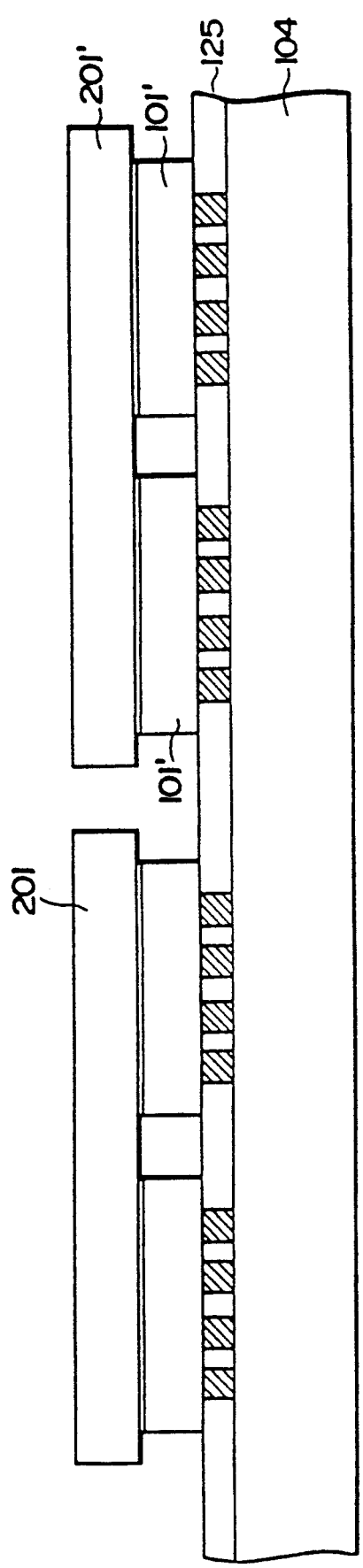

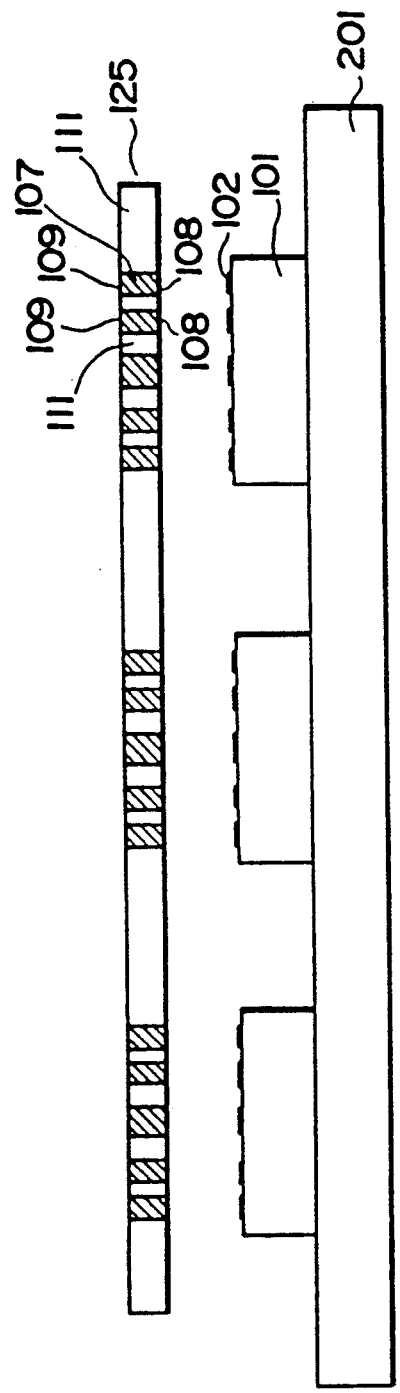
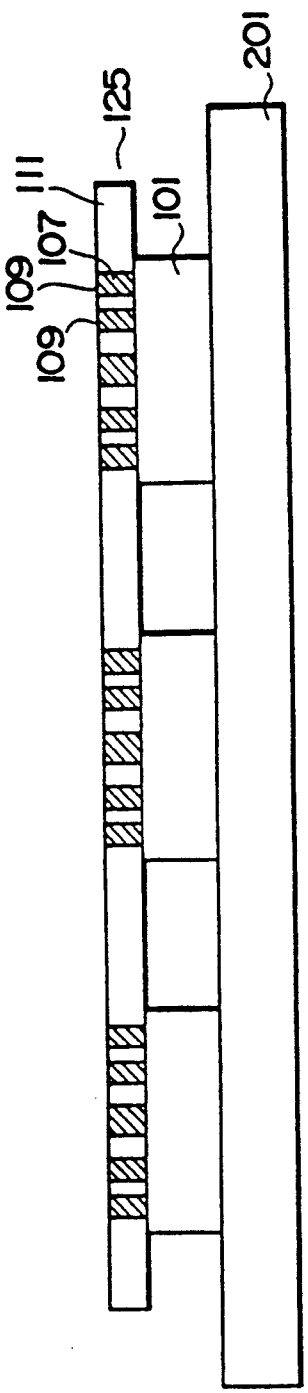
FIG.33(a)
FIG.33(b)

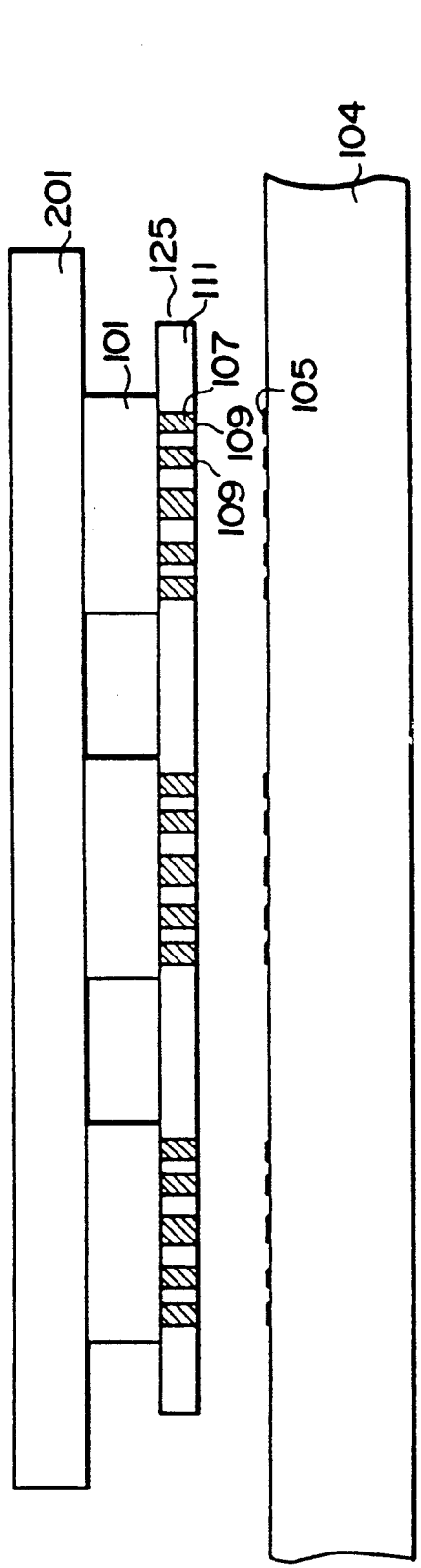
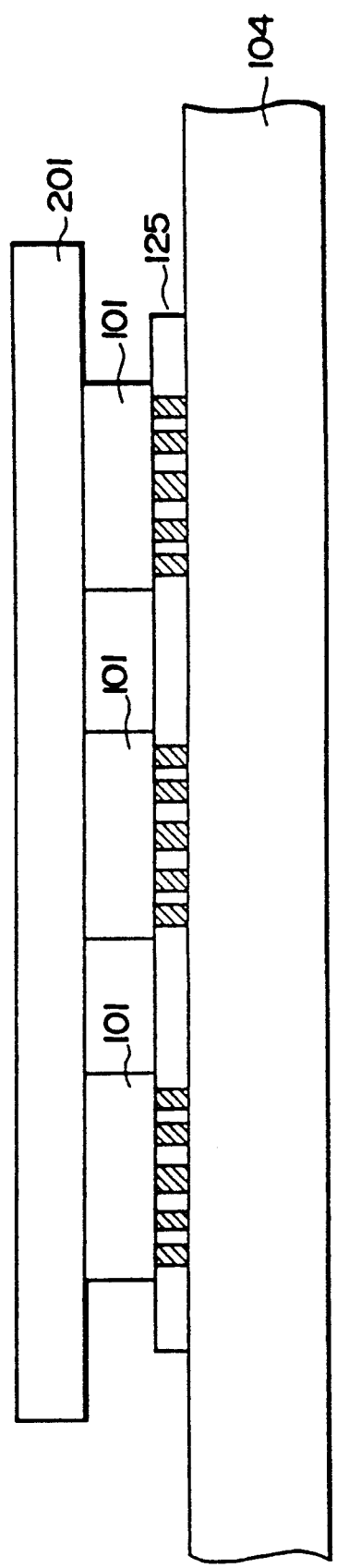

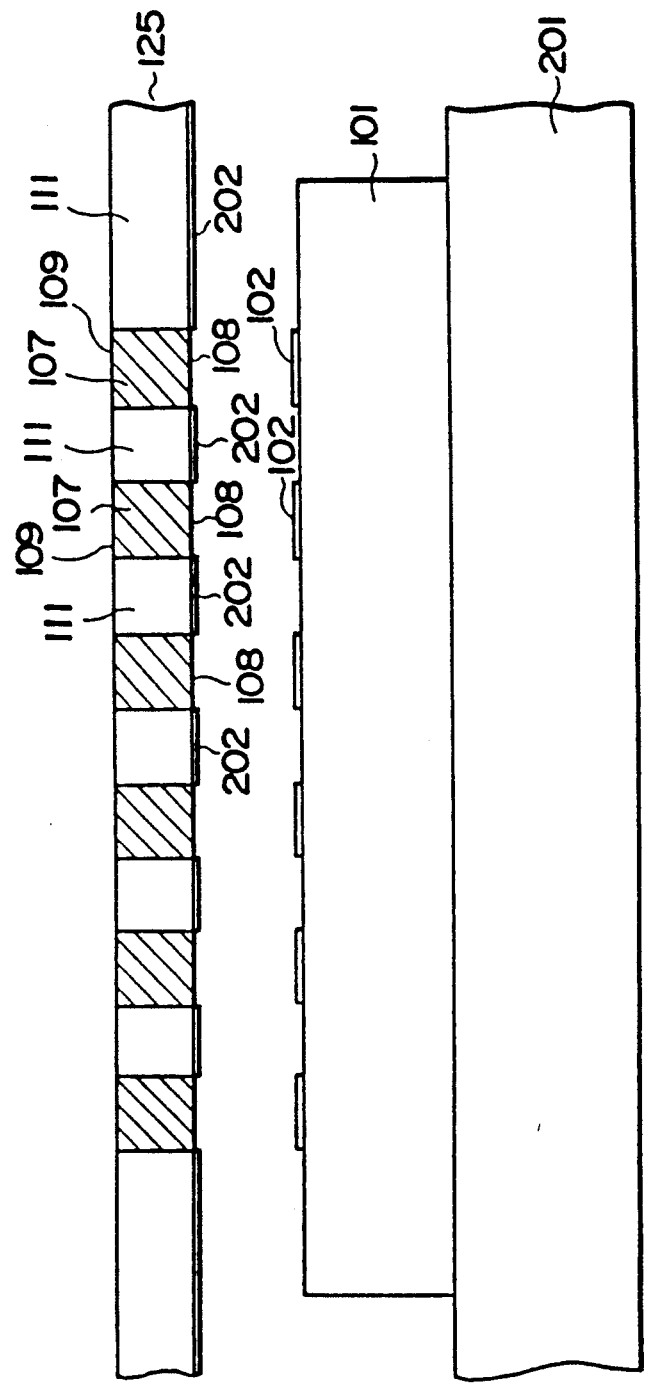

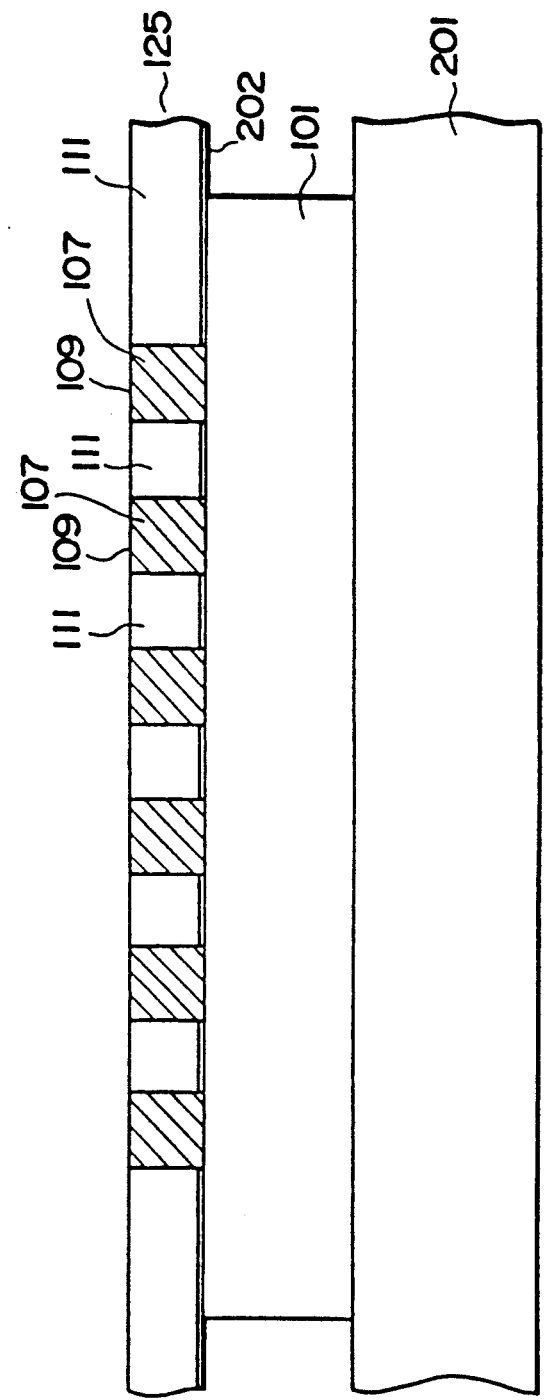

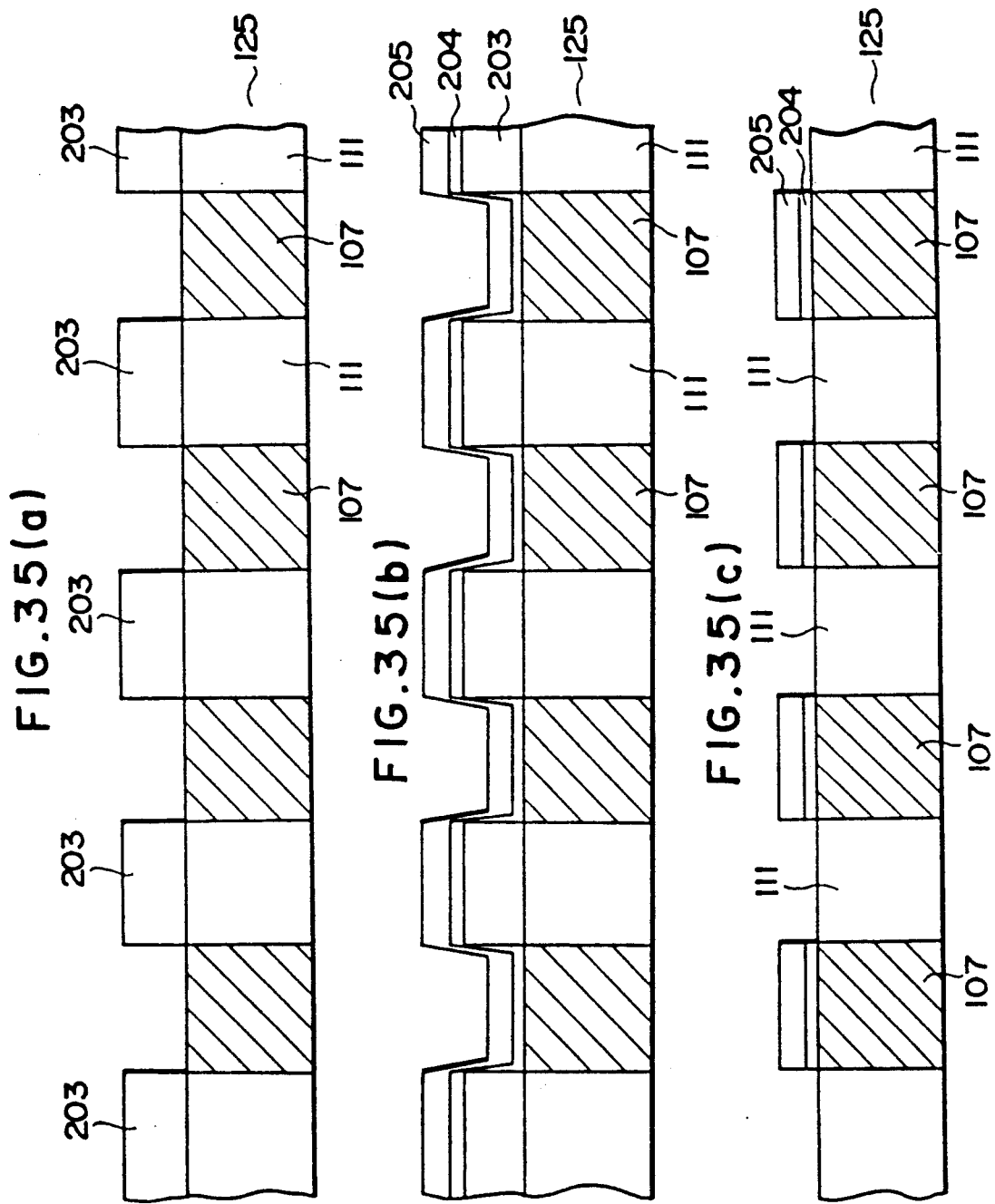

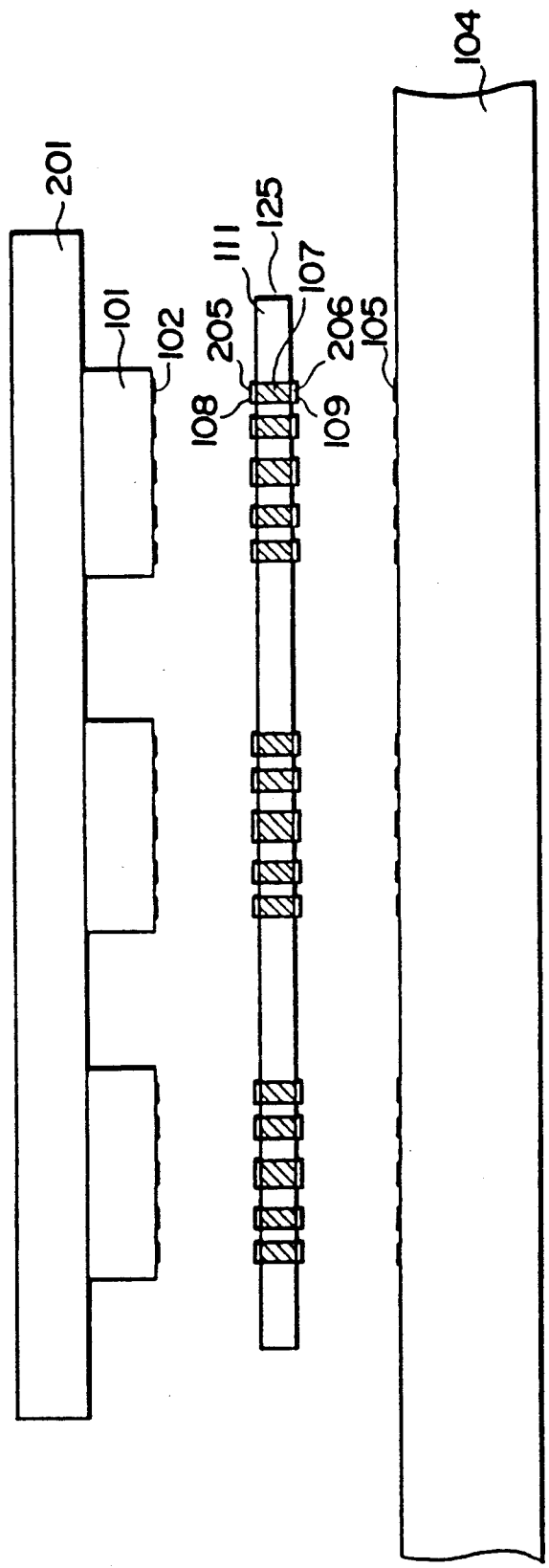
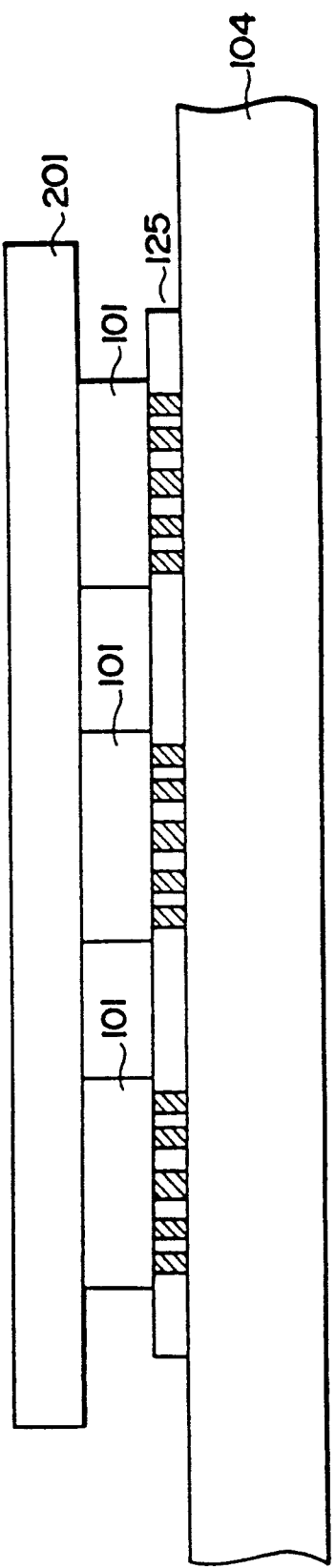
FIG.36(a)
FIG.36(b)

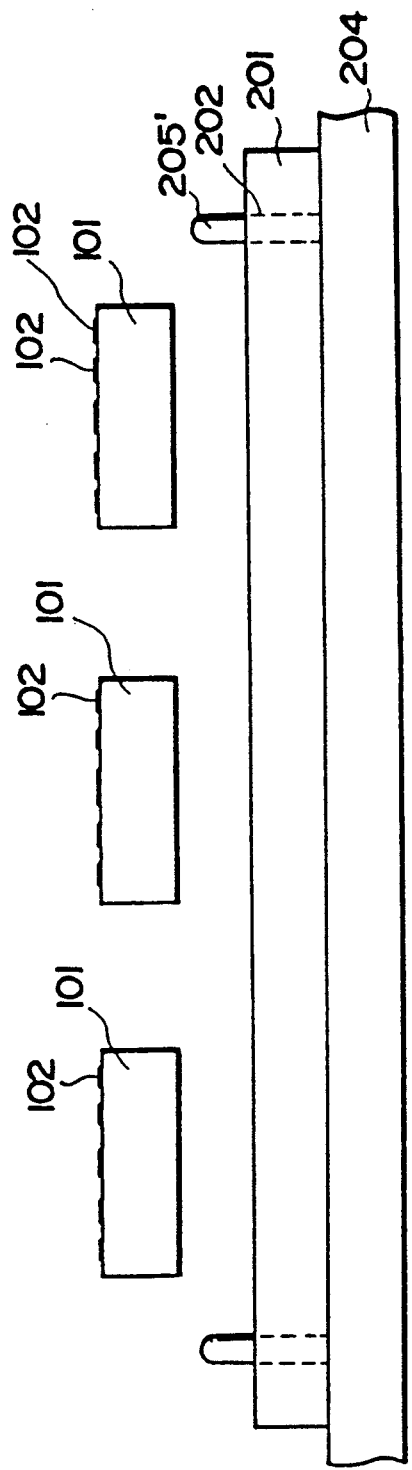
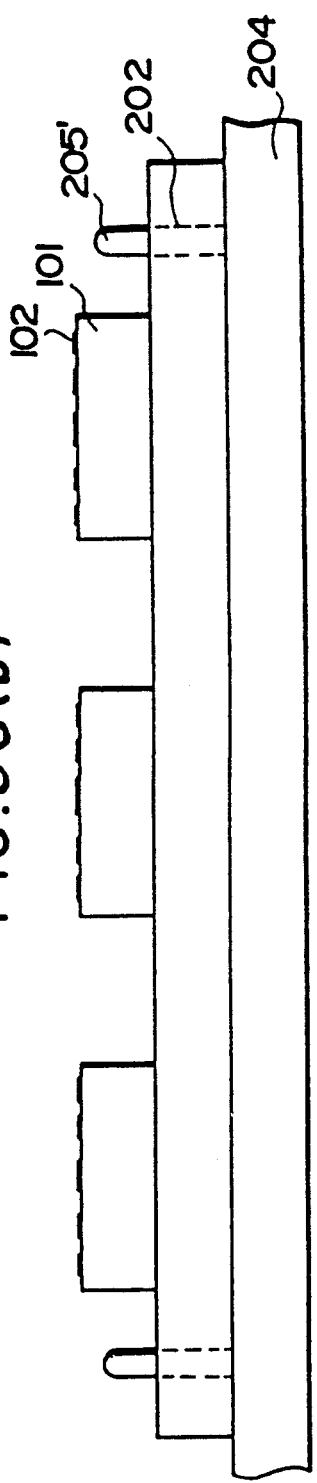

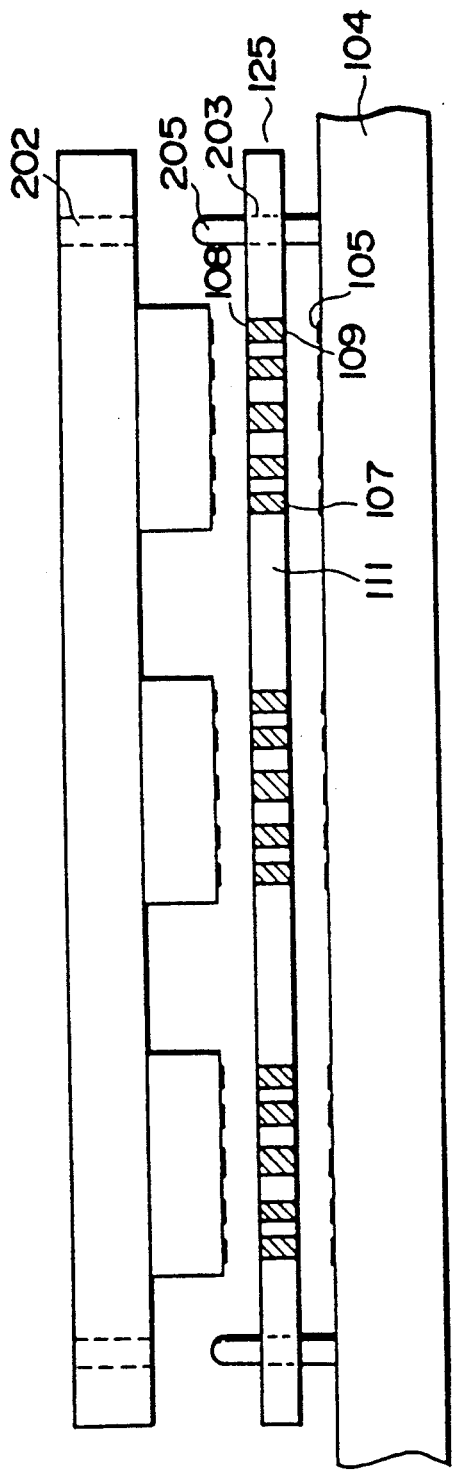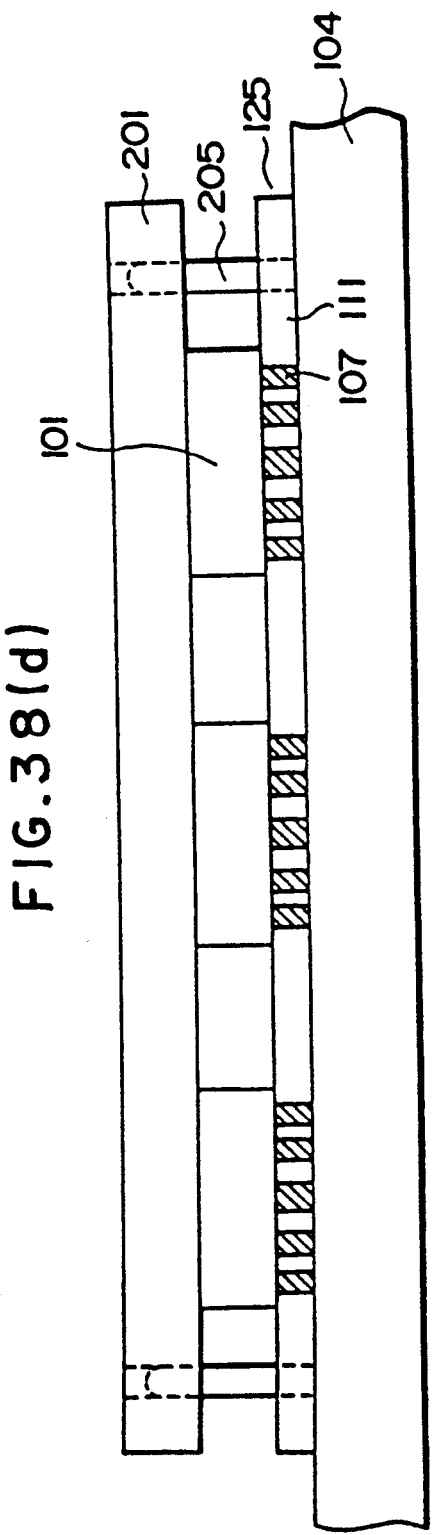

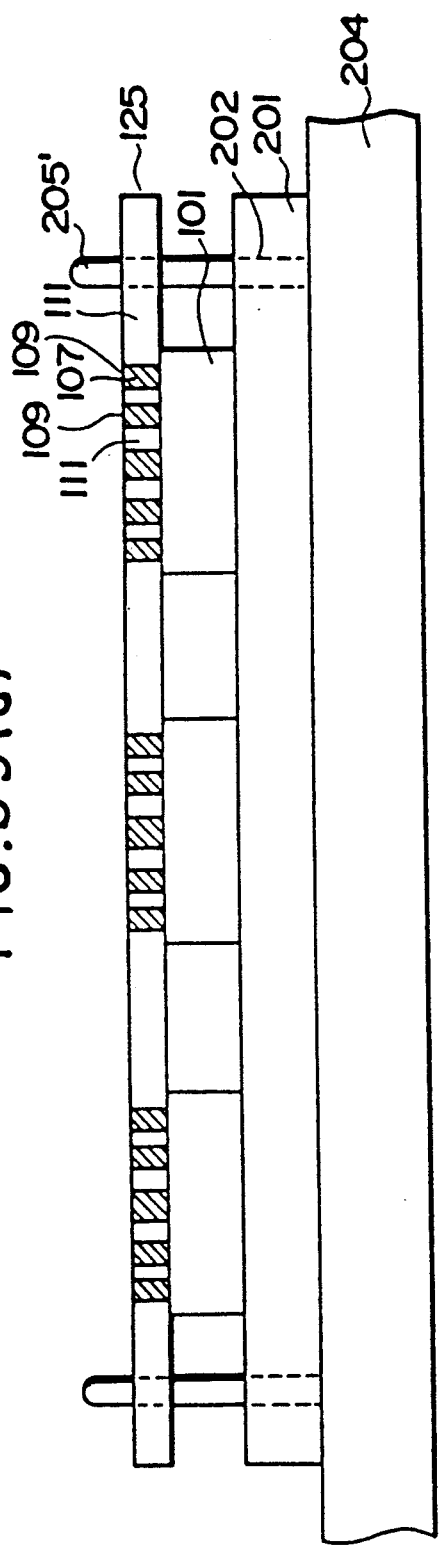
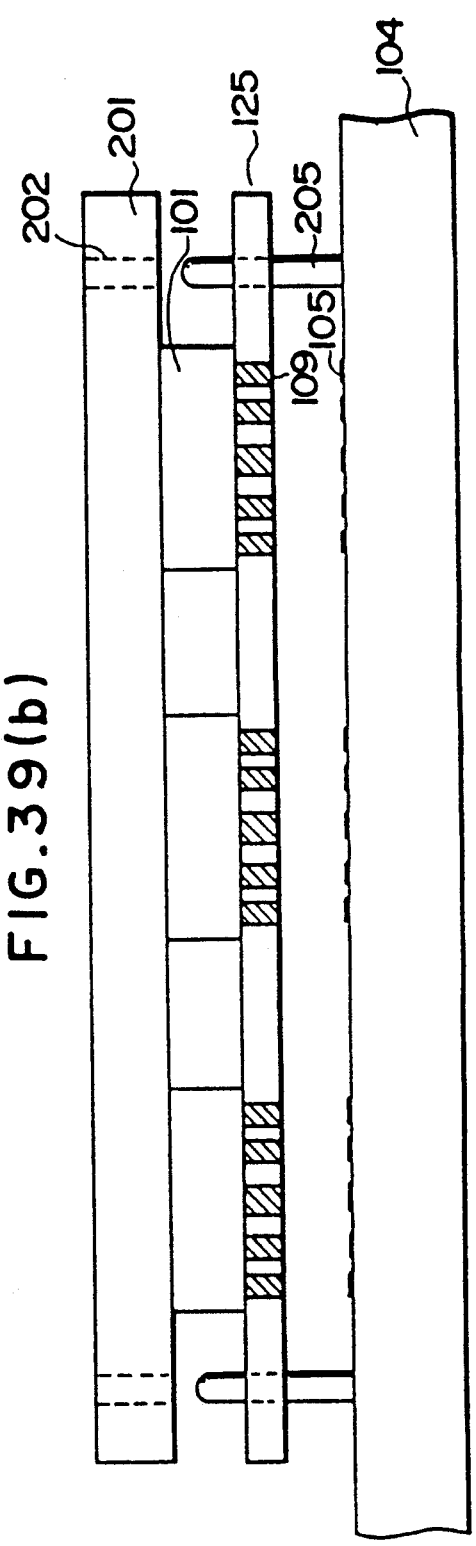

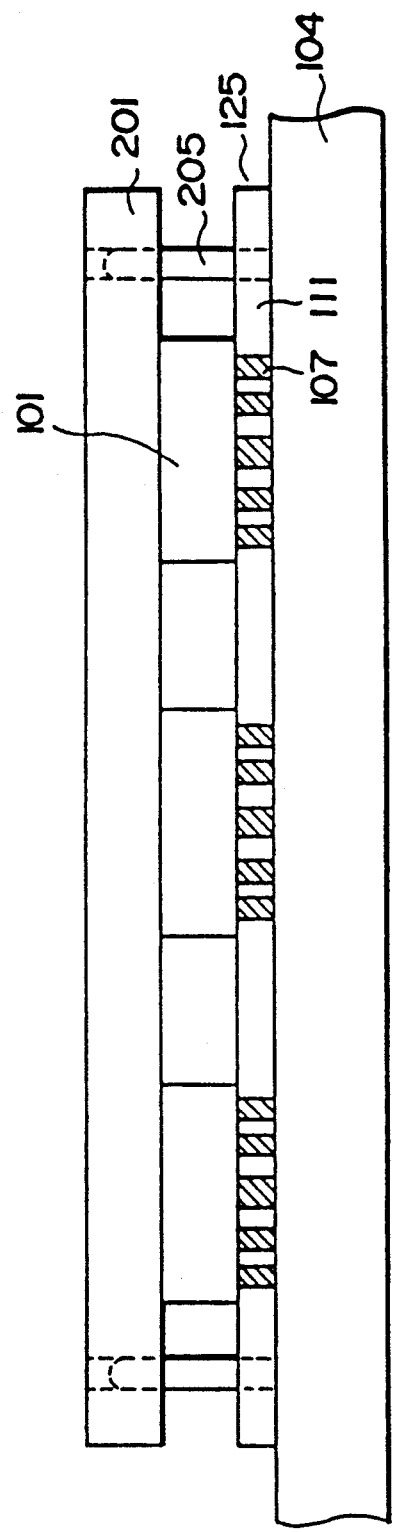

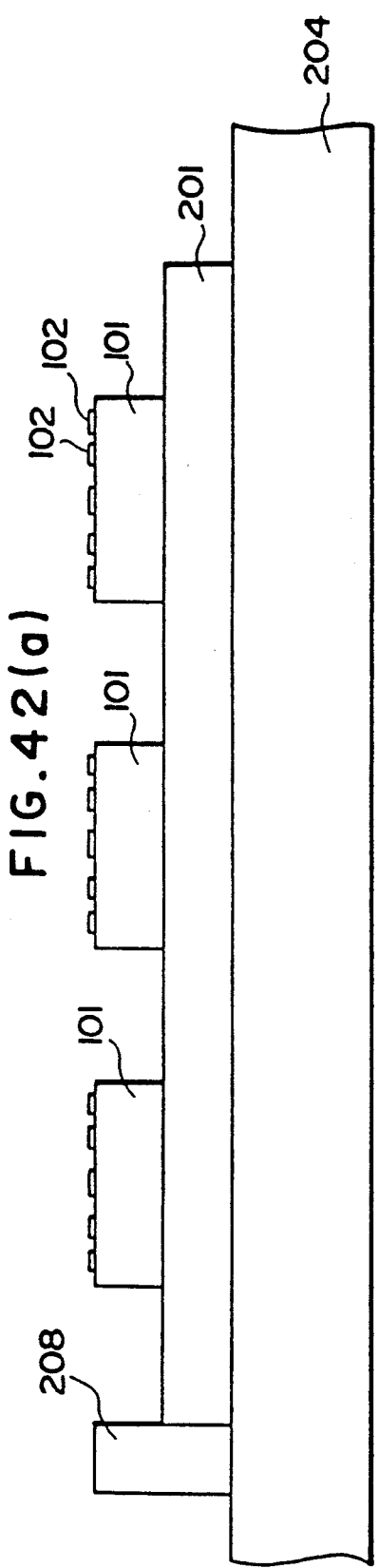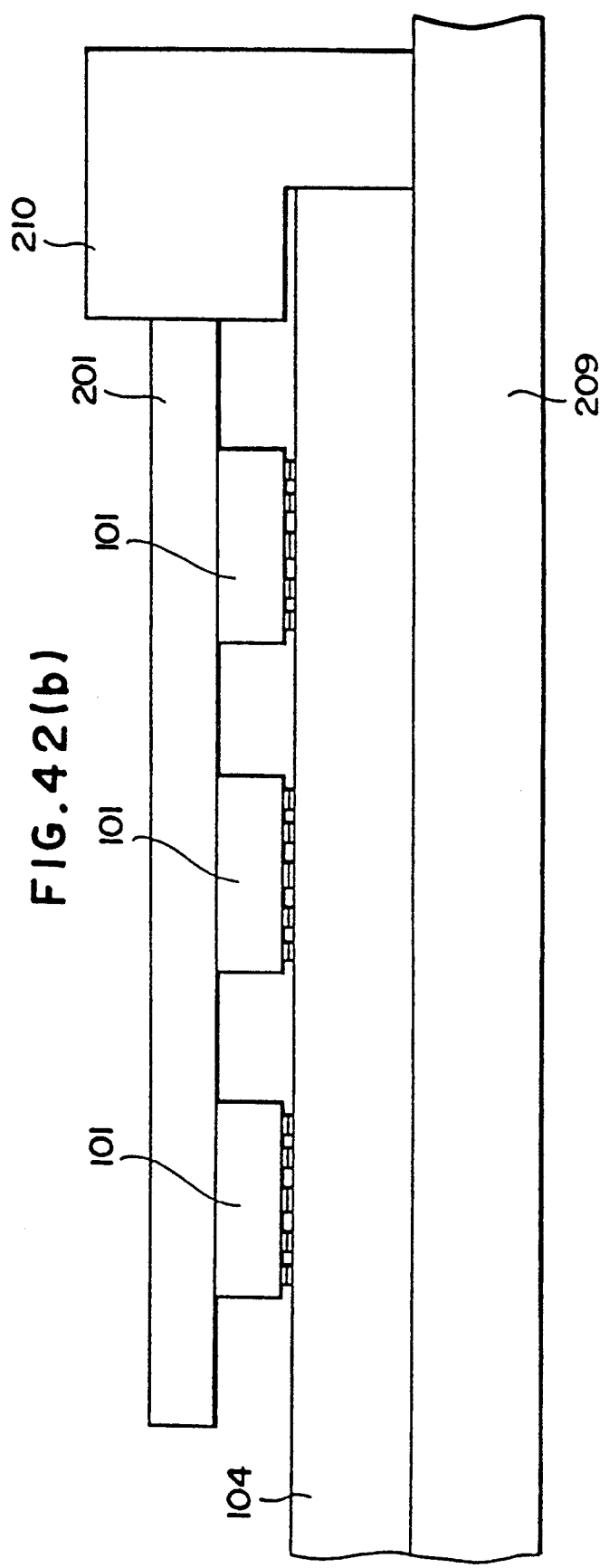

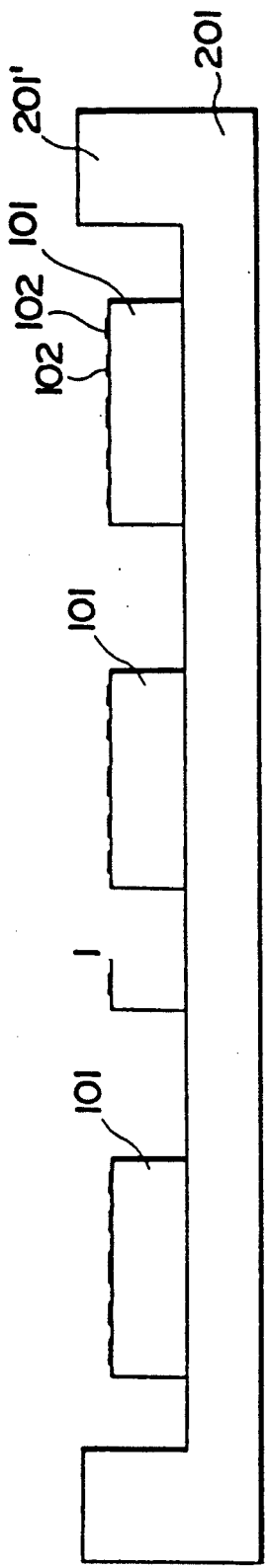
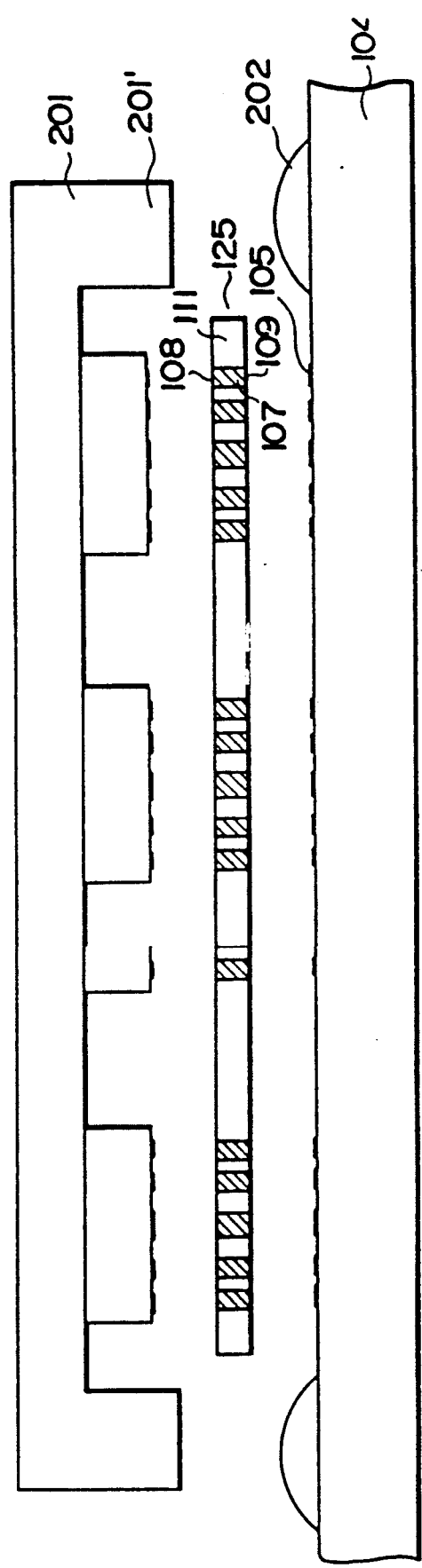
FIG. 43(a)
FIG. 43(b)

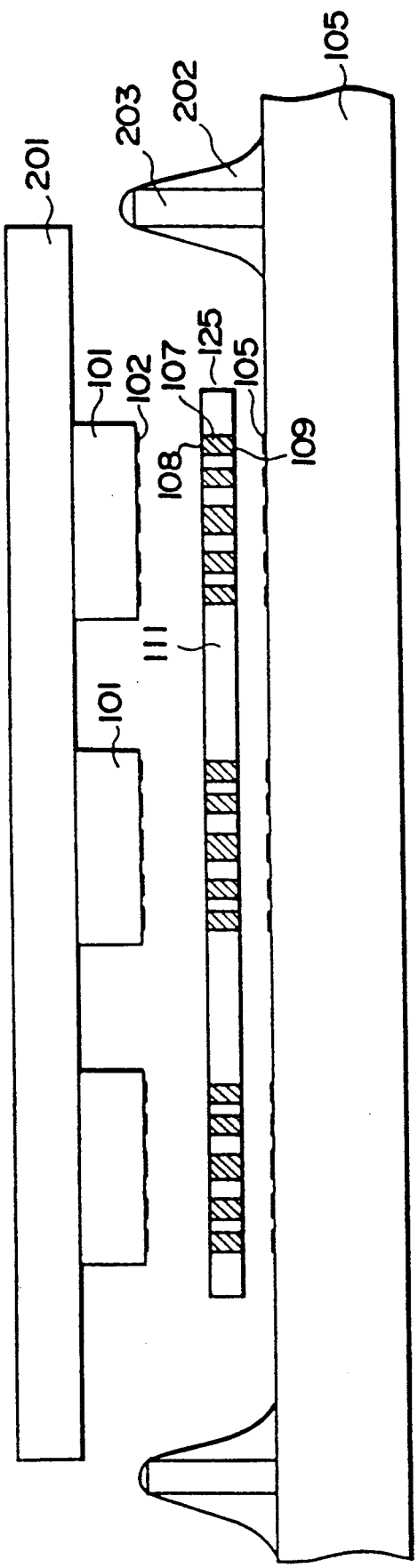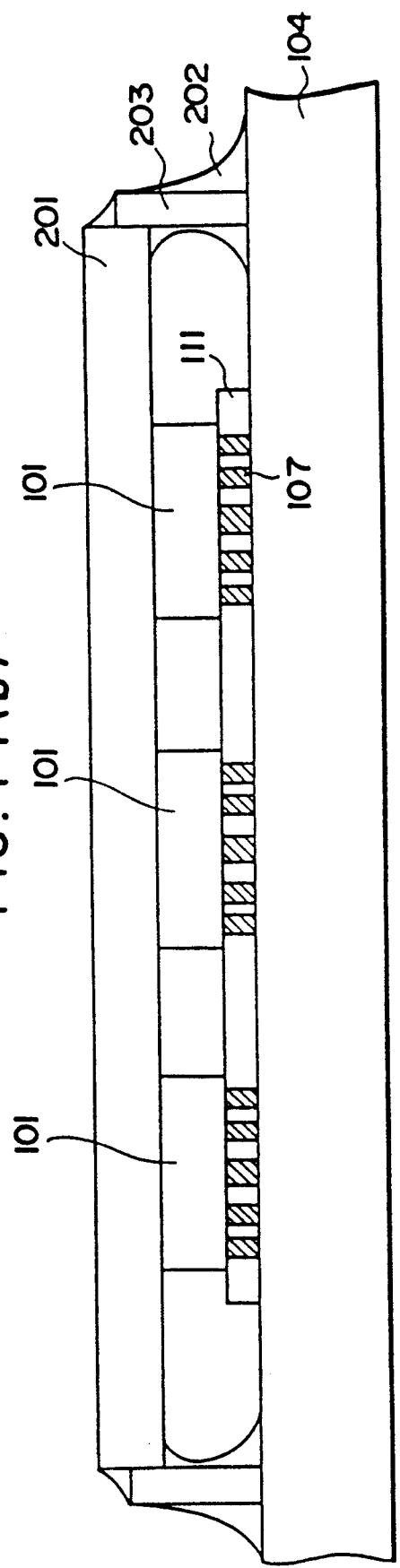
FIG.44(a)
FIG.44(b)

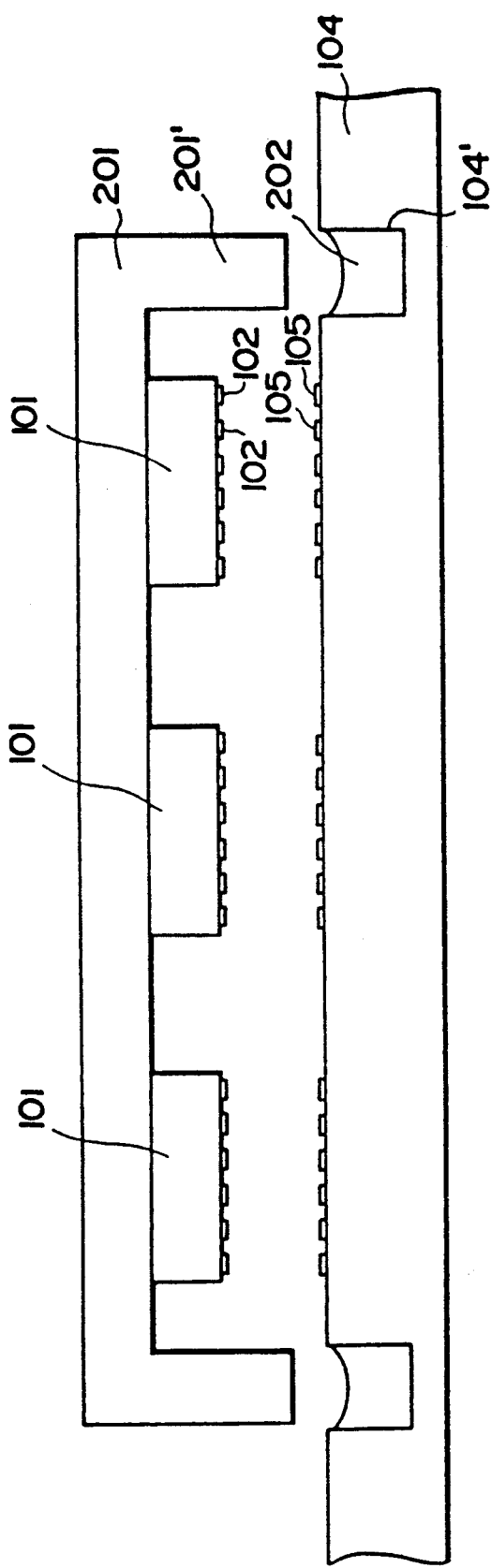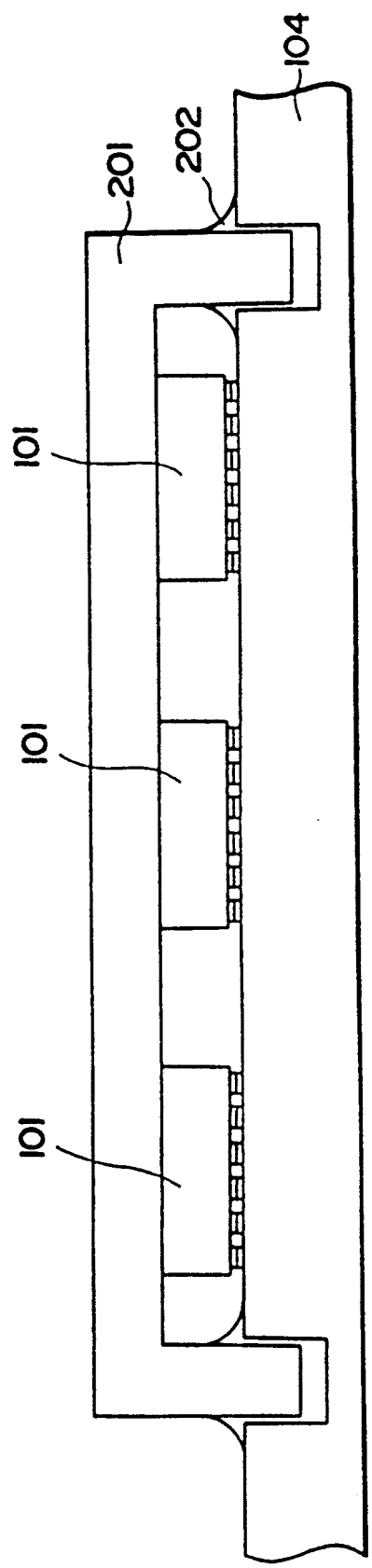
FIG. 45(a)
FIG. 45(b)

ELECTRIC CIRCUIT APPARATUS

This application is a continuation of application Ser. No. 07/803,904, filed Dec. 9, 1991, which is a continuation of application Ser. No. 07/358,641, filed May 30, 1989, both now abandoned.

BACKGROUND OF THE INVENTION

1. Field of the Invention

The present invention relates to an electric circuit apparatus formed by electrically connecting electric circuit components with an electrically connecting member.

2. Related Background Art

Hitherto, known techniques for electrically connecting electric circuit components are exemplified by:
(1) wire bonding method,
(2) TAB (Tape Automated Bonding) method (for example, an art disclosed in Japanese Patent Laid-Open No. 59-139636),
(3) CCP (Controlled Collapse Bonding) method (for example, see Japanese Patent Publication No. 42-2096 and Japanese Patent Laid-Open No. 60-57944),
(4) The art shown in FIGS. 1 and 2,
(5) The art shown in FIG. 3, and
(6) The art shown in FIG. 4.

The art shown in FIGS. 1 and 2 is characterized in that:

an insulating film 71 made of polyamide or the like is formed in the portions except for conjunction portions 5 of a first semiconductor deice 4. Metal members 70 made of Au or the like are provided for the conjunction portion 5 before flattening exposed surfaces 73 and 72 of the metallic members 70 and the insulating film 71. On the other hand, another insulating film 71' made of polyamide or the like is formed in the portions except for conjunction portions 5' of a second semiconductor device 4'. Metal members 70' made of Au or the like are formed in the conjunction portion 5' before flattening exposed surfaces 73' and 72' of the metal members 70' and the insulating film 71'.

Then, the first semiconductor device 4 and the second semiconductor device 4' are, as shown in FIG. 2, positioned and welded so that the conjunction portions 5 of the first semiconductor device 4 and the conjunction portions 5' of the second semiconductor device 4' are connected to each other with the metal members 70 and 70'.

The method according to (5) and shown in FIG. 3 is characterized in that:

an anisotropic conductive film 78 is interposed between a first circuit substrate 75 and a second circuit substrate 75', this anisotropic conductive film 78 being formed by having conductive particles 79 dispersed in an insulating material 77. The first and second circuit substrates 75 and 75' are then positioned before application of a pressure alone or a combination of a heat and pressure whereby a junction portion 76 of the first circuit substrate 75 and a junction portion 76' of a second circuit substrate 75' are connected to each other.

The method according to (6) and shown in FIG. 4 is characterized in that:

an elastic connector 83 designed such that metal wires 82 disposed in an insulating material 81 are formed of Fe or Cu and arranged in the same direction and interposed between the first circuit substrate 75 and the second circuit substrate 75'. The first circuit substrate 75 and the second circuit substrate 75' are then positioned before being pressurized whereby the conjunction portion 76 of the first circuit substrate 75 and the conjunction portion 76' of the second circuit substrate 75' are connected to each other.

However, the above-described conventional bonding method involves the following problems:

a circuit design based on the bonding method involves a certain limitation. The pitch (the distance between the central portions of the neighboring junctions) between the neighboring conductors is too large, and the overall thickness of the circuit cannot be reduced. In addition, the reliability is insufficient because of corrosion and breakage of the conductor, and the characteristics can deteriorate due to the concentration of heat in the portions between the bonding members and the electric circuit members. Furthermore, if an electric circuit part becomes defective, it cannot be solely replaced.

The art shown in FIGS. 1 and 2 has the following problems:

(a) The exposed surface 72 of the insulating film 71 and the exposed surface 73 of the metallic members 70 or the exposed surface 72' of the insulating film 71' and the exposed surface 73' of the metallic member 70' needs to be flattened. Therefore, its manufacturing cost will rise due to increase in the manufacturing process.

(b) If there were any differences in levels between the exposed surface 72 of the insulating film 71 and the exposed surface 73 of the metallic members 70 or between the exposed surface 72' of the insulating film 71' and the exposed surface 73' of the metallic member 70', the metallic members 70 and 70' cannot be properly connected to each other, reducing the reliability of the electric circuit.

The art according to (5) and shown in FIG. 3 has the following problems:

(a) When the conjunction portions 76 and 76' are connected to each other by application of a pressure after they have been positioned, the connected portions become unequal since the pressure cannot be applied equally. As a result, the resistance of the conjunction portions caused from contact also becomes unequal. This leads to the deterioration in the reliability in the connection. In addition, if a large amount of electric current is allowed to pass through the circuit, the junction portions adversely generate heat. Therefore, this art cannot be suitably used in a case where a large amount of electric current is intended to be allowed to pass.

(b) Even if a pressure is applied equally to the conjunctions portions 76 and 76', the resistance distribution becomes unequal due to the configurations of the conductive particles 79 of the anisotropic conductive film 78. It leads to the deterioration in the reliability in the connection established. In addition, this art cannot be suitably used in a case where a large amount of electric current is intended to be allowed to pass.

(c) Since the resistance between the neighboring conjunction portions can be reduced by shortening the pitch between the neighboring conjunction portions (the distance between the center portions of the neighboring conjunction portions), it is not suitably used in dense connections.

(d) Since the resistance can be varied by the unequal projection $h_1$ of the conjunction portions 76 and 76' of the circuit substrates 75 and 75', the unequal projections $h_1$ must be restricted.

(e) Furthermore, if the anisotropic conductive film were employed to connect the semiconductor devices and the circuit substrate or to connect the first semiconductor devices and the second semiconductor devices, a bump needs to be provided for each conjunctions portion of the semiconductor device, causing the overall cost to be raised.

In addition, when the art according to (6) and shown in FIG. 4 is employed to connect semiconductor devices and a circuit substrate or to connect the first semiconductor devices and the second semiconductor devices, the following problems (a) to (d) arise: (a) Since pressure needs to be applied to the conjunction portions, a pressurizing tool needs must be used. (b) Since the contact resistance between the metal wire 82 of the elastic connector 83 and the conjunction portion 76 of the first circuit substrate 75 and the conjunction portion 76' of the second circuit substrate 75' can be varied due to the pressure applied and the surface condition, the reliability of the connection is insufficient.

(c) Since the metal wire 82 of the elastic connector 83 is made of a rigid material, each surface of the elastic connector 83, the first circuit substrate 75, and the second circuit substrate 75' can be damaged if the applied pressure is too large. On the other hand, if the applied pressure is too small, the reliability of the connection is also insufficient.

(d) In addition, the projection h2 of the conjunction portions 76 and 76' of the circuit substrate 75 and 75', the projection h3 of the metal wire 82 of the elastic connector 83, and their unevenness can cause changes in the resistance and damage. Therefore, countermeasures for reducing the uneven projections must be taken.

SUMMARY OF THE INVENTION

Accordingly, an object of the present invention is to provide an electric circuit device capable of overcoming all of the above-described problems and exhibiting high density and satisfactory reliability simply with a reduced cost. The same can replace the conventional connecting method and sealing method and in addition can realize a dense multicontact connection with which the thermal characteristics or the like can be improved.

According to one aspect of Applicants' invention, an electric circuit apparatus comprises an electrically connecting member including a holding body made of an electrically insulating material and a plurality of electrically conductive members embedded in the holding body. End portions of the electrically conductive members appear outside on one side of the holding body while the other end portions of the electrically conductive members appear outside on the other side of the holding body. A plurality of electric circuit components a are connected to one end portions of the electrically conductive members, and a holding member holds the plurality of the electric circuit components a. Another electric circuit component b is connected to the other end portions of the electrically conductive members.

BRIEF DESCRIPTION OF THE DRAWINGS

FIGS. 5A and 5B are cross-sectional views which illustrate the states before and after the connection according to a first embodiment;

FIGS. 7A to 7D are cross-sectional views which illustrate a metallizing and/or alloying method (2) shown in the first embodiment;

FIGS. 8A and 8B are cross-sectional views which illustrate a metallizing and/or alloying method (3) shown in the first embodiment;

FIGS. 9C and 9D are cross-sectional views which illustrate states before and after a connection has been established by using the electric circuit holding member according to the second embodiment;

FIGS. 11A and 11B are cross-sectional views which illustrate the state before and after the connection performed according to a third embodiment;

FIGS. 13C and 13D are cross-sectional views which illustrate the states before and after the connection established according to the fourth embodiment;

FIGS. 17A and 17B are cross-sectional views which illustrate the states before and after the connection according to the sixth embodiment;

FIGS. 22A and 22B are cross-sectional views which illustrate the states before and after the connection according to a ninth embodiment;

FIGS. 23A to 23D are cross-sectional views which illustrate a metallizing and/or alloying method shown in (2) and according to the ninth embodiment;

FIGS. 24A and 24B are cross-sectional views which illustrate a metallizing and/or alloying method shown in (3) and according to the ninth embodiment;

FIGS. 25A and 25B are cross-sectional views which illustrates the states before and after connecting and/or holding the semiconductor devices according to a tenth embodiment;

FIGS. 25C and 25D are cross-sectional views which illustrate the states before and after connecting the semiconductor devices and the circuit substrate according to the tenth embodiment;

FIGS. 26A and 26B are cross-sectional views which illustrate the state before and after the connection according to the tenth embodiment;

FIGS. 27A and 27B are cross-sectional views which illustrate the state before and after the connection according to an eleventh embodiment;

FIGS. 33A to 33D are views which illustrate a sixteenth embodiment;

FIGS. 34A and 34B are cross-sectional views which illustrate a seventeenth embodiment;

FIGS. 35A to 35C are cross-sectional views which illustrate the process for manufacturing the electrically connecting member used in an eighteenth embodiment;

FIGS. 36A and 36B are cross-sectional views which illustrate the states before and after the connection according to the eighteenth embodiment;

FIGS. 38A to 38D are cross-sectional views which illustrate a twenty-seventh embodiment;

FIGS. 40A to 40C are cross-sectional views which illustrate an embodiment of the method of metallizing and/or alloying according to the twenty-seventh embodiment shown in (3);

FIGS. 42A and 42B are cross-sectional views which illustrate another example of the twenty-eighth embodiment;

FIGS. 43A to 43C are cross-sectional views which illustrate a thirty-first embodiment;

FIGS. 44A and 44B are cross-sectional views which illustrate another embodiment according to the thirty-first embodiment; and FIGS. 45A and 45B are cross-sectional views which illustrate a thirty-second embodiment.

Figure 1:
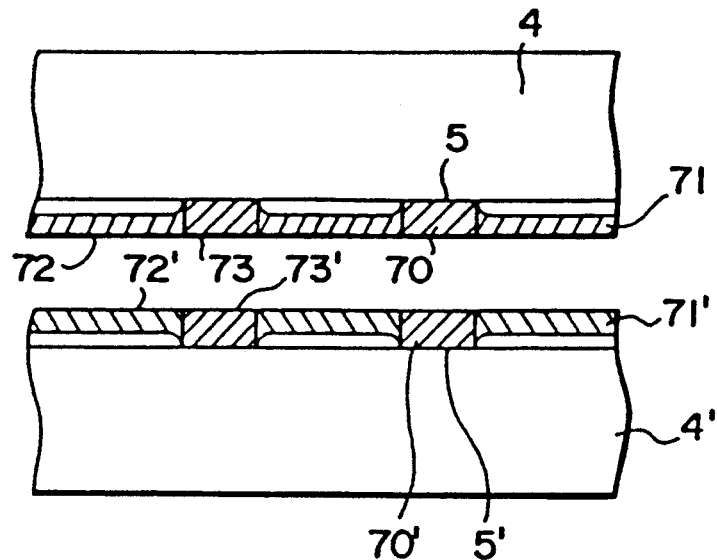
FIGS. 1 to 4 are cross-sectional views which illustrate a conventional example.
Figure 2:
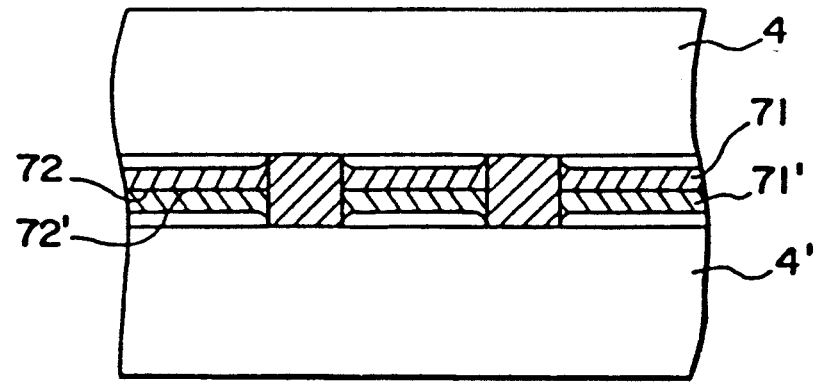
Figure 3:
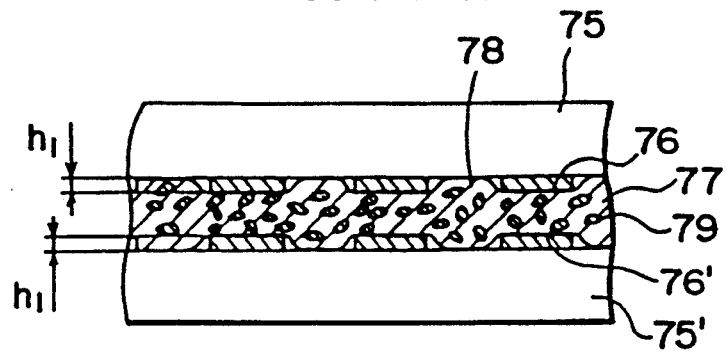
Figure 4:
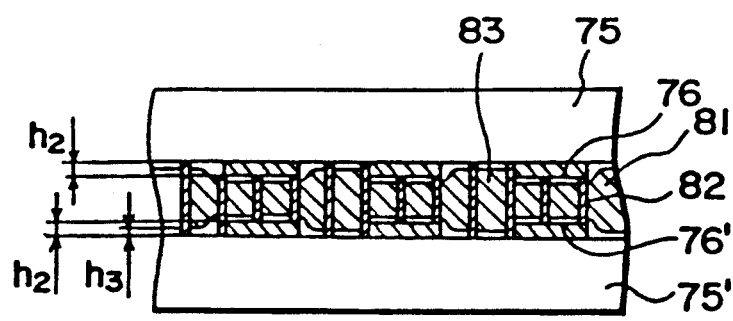

Embodiments other than those described above are described with reference to these drawings.

DESCRIPTION OF THE PREFERRED EMBODIMENT(S)

First, essential components of the present invention will be respectively described.

Electric circuit components

The electric circuit components according to the present invention are exemplified by semiconductor elements such as transistors and ICs, circuit substrates such as resin circuit substrates, ceramic substrates, metal substrate silicon substrates (also known as "circuit substrate"), and lead frames.

The electric circuit components to be held by or connected to the electric circuit components holding member may be arranged to be individually present on a surface of the electric circuit holding member or a plurality of the same may be present on a surface. The size, shape, and type of the electric circuit components to be held or connected by the electric circuit component holding member may be optionally determined. However, the more types of the electric circuit components to be held or supported by the electric circuit component holding member increases, the greater the effect obtainable from the present invention.

The electric circuit components to be connected to the electrically connecting components holding member may be arranged to be individually present on a surface of the holding member or a plurality of the same may be present on a surface.

Electric circuit components having connecting portions are the subject of the present invention. Although the number of the connecting portions may be optionally determined, the more that are present, the greater the effect obtainable from the present invention.

In addition, although the positions at which the connecting portions are disposed may be optionally determined, the more interior the connecting portions are located in the electric circuit components, the greater the effect obtainable from the present invention.

The connecting portions are made of electrically conductive material.

Electric circuit component holding member

The electric circuit component holding member may be made of any material selected from metal, alloy, organic and inorganic materials. Alternately, a material obtained by a composition of the above-described materials may be employed. The shape and size of the electric circuit holding member may be optionally determined if a connection between the electric circuit components to be held or connected and the corresponding electric circuit components can be equally and stably established.

Although the size, the number, and the types of the electric circuit components to be held by or connected to the electric circuit component holding member may be optionally determined, the more the number and types of components, the greater the effect obtainable from the present invention.

The above-described metal or alloy is exemplified by: metal or alloy such as Ag, Cu, Al, Be, Ca, Mg, Mo, Fe, Ni, Co, Mn, W, Ti, Pt, Cr, Pd, Nb, Ta, V, and Y.

The inorganic material is exemplified by: Si, Ge, GaAs, InGaAsp, InP, and a-Si semiconductors; $B_2O_3$, $Al_2O_3$, $Na_2O$, $K_2O$, CaO, ZnO, BaO, PbO, $Sb_2O_3$, As- $_2O_3$, $La_2O_3$, $ZrO_2$, $BaO$, $P_2O_5$, $TiO_2$, $MgO$, $SiC$, $BeO$, $BP$, $BN$, $h$-$BN$, $c$-$BN$, $AlN$, $B_4C$, $TaC$, $TiB_2$, $CrB_2$, $TiN$, $Si_3N_4$, $Ta_2O_5$, and $SiO_2$ ceramics, Ia, Ib, IIa, IIb diamonds, glass, synthetic quartz, carbon, boron, and the other inorganic materials.

The organic materials may employ, for example, insulation resin that is exemplified by thermosetting resin, ultraviolet curing resin, and thermoplastic resin, exemplified by polyamide resin, polyphenylene sulfide resin, polyether sulfon resin, polyether imide resin, polysulfon resin, fluororesin, polycarbonate resin, polydiphenylether resin, polybenzil imidazole resin, polyamide imide resin, polypropylene resin, polyvinyl chloride resin, polystylene resin, methacrylate metyl resin, polyphenylene oxide resin, phenol resin, melanin resin, epoxy resin, urea resin, methacrylic resin, vinylidene chloride resin, alkide resin, silicon resin, nd so on.

A circuit may be formed in the electric circuit component holding member according to the present invention. When the electric circuit component holding member is made of an insulating material or a material whose surface has been subjected to the insulating treatment, a circuit pattern and a conjunction portion may be formed on at least a side of the electric circuit component holding member. Alternately, the circuits may be connected to each other on the two sides of the holding member, or holding bodies on which a circuit pattern has been respectively drawn may be layered to form a multilayered substrate.

As the electric circuit component holding member, a layered structure may be employed that can be obtained by combining materials exhibiting individual functions. For example, a combination of a circuit substrate and a reinforcing plate or a combination of a circuit substrate and radiating fins may be employed. The number of the layers and the functions may be selected optionally.

Electrically connecting member

The electrically connecting member according to the present invention is formed such that a plurality of conductive members are embedded in a holding body made of an electrically insulating material. The conductive members are electrically insulated from each other.

An end of this conductive member appears on one side of the holding member, while another end of the same appears on the other side of the holding member.

The electrically connecting members may be formed by a single layer or a multilayer consisting of two or more layers.

Conductive member

It is preferable for the metal component to be made of gold. However, the following metal or an alloy may be optionally employed, which is exemplified by: metal or an alloy such as Ag, Be, Ca, Mg, NMo, Ni, W, Fe, Ti, In, Ta, Zn, Cu, Al, Sn, and Pb-Sn.

The metal member and the alloy member may be arranged such that one electrically connecting member may include the same metals or may include individual type metals. Each of the metal members and the alloy members of the electrically connecting member may be made of the same metals or alloys, and alternately the same may be made of individual metals or alloys. A material prepared by an organic material and/or inorganic material contained in a metal material may be employed if it displays conductivity. A material obtained by combining an inorganic material and an organic material may be employed if it displays conductivity.

The cross-sectional shape of the electrically conductive member may be forced in a circular shape, rectangular shape, or other optional shapes.

The thickness of the electrically conductive member is not specifically limited, but it is preferably to be 20 $\mu m\emptyset$ or more, and it can be 20 $\mu m\emptyset$ or less.

The portion of the electrically conductive member that appears outside of the holding body may be arranged to be flush therewith, or it may be arranged to project over the surface of the holding body. This projection portion may be forced on one side or on two sides. The projection may be formed in a bump-like shape.

The interval between the electrically conductive members may be arranged to have the same interval as between the conjunction portions of the electric circuit parts, or a shorter interval. When a shorter interval is employed, the electric circuit components and the electrically connecting members can be connected to each other without the necessity of performing any positioning of the electric circuit components and the electrically connecting components.

It is not necessary for the electrically conductive member to be arranged perpendicularly to the holding body; it may be diagonally arranged from one side of the holding member to another side of the same.

Holding body

The holding body is made of an electrically insulating material.

Any electrically insulating material may be employed. The electrically insulating material may be exemplified by an organic material and an inorganic material. Alternately, a metal or an alloy which has been subjected to a treatment in which the electrically conductive members are electrically insulated from each other may be employed. One type or a plurality of types of inorganic, metal or alloy in the form of desired shapes such as pulverulent and fiber may be dispersed and contained in the inorganic materials. In the case where the holding member is made of a metal, it needs, for example, for an electrically insulating material such as resin to be disposed between the electrically conductive material and the holding body.

For example, insulating resin such as thermosetting resin, ultraviolet curing resin and thermoplastic resin may be employed as the organic material, the insulating resin being exemplified by polyamide resin, polyphenylene sulfide resin, polyether sulfon resin, polyether imide resin, polysulfon resin, fluororesin, polycarbonate resin, polydiphenylether resin, polybenzil imidazole resin, polyamideimide resin, polypropylene resin, polyvinyl chloride resin, polystylene resin, methacrylate metyl resin, polyphenylene oxide resin, phenol resin, melanin resin, epoxy resin, urea resin, methacrylic resin, vinylidene chloride resin, alkide resin, silicon resin, and so on.

It is preferable to select resin that exhibits excellent thermal conductivity from the above-described materials since heat which has been inevitably generated by the semiconductor device can be discharged through the resin. In addition, deterioration in reliability of the apparatus due to thermal expansion and thermal contraction can be further prevented by arranging the structure such that resin that displays the same or substantially the same thermal expansion coefficient as that of the circuit substrate is selected and at least one hole or a plurality of air bubbles are arranged to be disposed in the organic material.

The inorganic material and the metal material to be employed is exemplified $SiO_2$, $B_2O_3$, $Al_2O_3$, $Na_2O$, $K_2O$, CaO, ZnO, BaO, PbO, $Sb_2O_3$, $As_2O_3$, $La_2O_3$, $ZrO_2$, BaO, $P_2O_5$, $TiO_2$, MgO, SiC, BeO, BP, BN, AlN, $B_4C$, TaC, $TiB_2$, $CrB_2$, TiN, $Si_3N_4$, $Ta_2O_5$, ceramics, and metal or an alloy such as Ag, Cu, Au, Al, Be, Ca, Mg, Mo, Fe, Ni, Si, Co, Mn, and W.

Connection: connection established by metallizing and/or alloying

The end portion of the electrically connecting member can be connected to the electric circuit component by the following three methods wherein one or more electric circuit components may be connected to one electrically connecting member and at least one of the thus-connected electric circuit component needs to be connected in either of the following methods.

(1) A structure arranged such that the connection between each of the end portions of a plurality of electrically conductive members which appear on one side of the holding body and a plurality of conjunction portions of the other electric circuit component and the connection between the other end portions of a plurality of electrically conductive members which appear on the other side of the holding body and a plurality of conjunction portions of the other electric circuit components are established by a method other than the following metallizing and/or alloying method to be described in (2) and (3).

(2) A structure arranged such that each of the end portions of the plurality of electrically conductive members which appear on the one side of the holding boy and at least one of the plurality of conjunction portions of the other electric circuit components are connected to each other via a conjunction layer formed by being metallized or alloyed, while the other end portions of a plurality of electrically conductive members which appear on the other side of the holding body and a plurality of conjunction portions of the other electric circuit components are connected to each other by a method other than the above-described metallizing and/or alloying method.

(3) A structure arranged such that each of the end portions of the plurality of electrically conductive members which appear on the one side of the holding body and at least one of the plurality of conjunction portions of the other electric circuit component are connected to each other via a conjunction layer formed by being metallized or alloyed, while the other end portions of a plurality of electrically conductive members which appear on the other side of the holding body and a plurality of conjunction portions of the other electric circuit components are connected to each other via a conjunction layer formed by metallizing and/or alloying.

The conjunctions layers will be described.

In a case where the electrically conductive member and the conjunction portion which are to be connected to each other are made of the same pure metal, the conjunction layer to be formed due to metallization becomes a crystalline structure of the same type that forms the electrically conductive member or the conjunction portion. In order to perform the metallization, a method may, for example, be employed which is arranged such that the end portions of the electrically conductive member and the corresponding conjunction portion which have been brought into contact with each other are heated up to a proper temperature. As a result of this heat, atoms can diffuse in the vicinity of the contact portion, causing the diffused portion to be brought to a metallized state and forming the conjunction layer.

In a case where the electrically conductive material and the conjunction portion to be connected to each other are made different pure metals, the thus-formed conjunction layer is made of an alloy. In order to perform this alloying, a method may, for example, be employed which is arranged such that the end portion of the electrically conductive member and the corresponding conjunction portions which have been brought into contact with each other are heated up to a proper temperature. As a result of this heat, atoms can diffuse in the vicinity of the contact portion, causing a layer made of a solid solution or a metallic compound to be formed in the vicinity of the contact portion, this layer being able to serve as the conjunction layer.

In the case where Au is employed as the metal forming the electrically connecting member and Al is employed in the conjunction portion of the electric circuit components, it is preferable for the heating temperature to be approximately 200° to 350° C.

In the case where either one of the electrically conductive member or the conjunction member is made of a pure metal while the other one is made of an alloy, or in the case where both of them are made of the same or different alloys, the conjunction layer is made of an alloy.

In any of the following cases, the above-described metallization or alloying is performed, and the conjunction portion is treated similarly: 1) where the plurality of electrically conductive members of an electrically connecting member are made of the same metal or alloy, 2) where the same are respectively made of different metals or alloys, 3) where one electrically conductive member is made of the same metal or alloy and 4) where one electrically conductive member is made of a different metal or alloy.

The electrically conductive member or the conjunction portion needs to be made of metal or alloy in the contact portion therebetween, and the other portions may be made of a material in which glass or resin is mixed with metal.

It is preferable for improving the strength of the connected portion to reduce the surface roughness of the portions to be connected to each other (preferably be 0.3 μm or less). Furthermore, a plating layer made of metal or alloy that can be readily brought to an alloy may be formed on the surfaces to be connected to each other.

Alternative connection methods from the above-described metallizing or alloying may be used, such as for example, pressing the electric circuit component and the electrically conductive member together.

Holding

The following methods (1) to (5) may be employed to hold at least one side (not the side on which at least one electrically connecting member is present) of The electric circuit component 201 holding member and a side of the electric circuit component and to hold the electrically connecting member and the electric circuit component or to hold another electric circuit component, where at least one portion of the side is held by at least one of the following methods:

(1) A holding method in which the setting reaction of organic material is utilized. When resin is used as the organic material, the type can be optionally selected. For example, any material selected from a group consisting of thermosetting resin and ultraviolet curing resin may be employed.

(2) A holding method in which an adhesive is used. The type of the adhesive is optionally selected. For example, any material selected from a group consisting of acrylic adhesive and epoxy adhesive may be employed.

(3) A holding method in which the above-described metallization and/or alloying is employed.

(4) A holding method in which the portions of the electric circuit holding member and the electric circuit component are made of the same material, the surfaces of these portions are cleaned and stacked against each other in vacuum so that they are held by a force (Van der Waals forces) between the component atoms of the contact portion.

(5) A method other than (1) to (4) which provides enough strength to prevent movement of the holding portion even if an outer force is applied to the electric circuit holding member or the electric circuit component can be used. For example, methods such as mechanical press fitting or the like can be employed.

Attachment and detachment

The following methods can be employed to arrange either of the electric circuit components or the other electric circuit component to be attachable or detachable.

(1) A method in which at least a portion of either side of the electrically connecting member and at least a portion of the side connected to either the electric connecting members of the electric circuit component or the other electric circuit component are stacked against each other, and the electrically conductive member which appears on both sides of the electrically connecting member and the other conjunction portion of the electric circuit component or the other electric circuit component are connected to each by a pressurizing force. When the pressure applied is suspended, the electric circuit component which is not adhered to the electrically connecting member is separated from the electrically connecting member, while the same can be again connected by pressure applied after positioning.

(2) At least one of the electrically conductive members which appear on either side of the electrically conductive members which appear on either side of the electrically connecting member and at least one of the conjunction portions of the electric circuit components or the other electric circuit component are connected to each other by metallizing and/or alloying, and the other portion is, similarly to (1), connected by a pressurization force performed after positioning. When the pressure applied is suspended, the electric circuit component which is not connected by metallizing and/or alloying is separated from the electrically connecting member, while the same can be connected again by pressure after positioning.

(3) The other method in which either of the electric circuit members or the other electric circuit components hold the electrically connecting member, and the other one is connected, similarly as in (1) or (2), by pressurization. When the pressure applied is suspended, the electric circuit component which does not hold the electrically connecting member is separated from the electrically connecting member, while the same can be again connected by a pressure applied after positioning.

(4) A method for connecting the electric circuit components and the other electric circuit components to each other in which the portion forming an end of the electrically conductive member on one side thereof and the other ends of the electrically conductive member employ individual electrically connecting members made of materials having individual melting points. According to this, the electric circuit components are simultaneously connected to each other by metallizing and/or alloying by a heat exceeding the melting point of the electrically conductive member which forms an end of the electrically connecting member after the electric circuit holding member, the electric connecting member, and the other electric circuit components have been simultaneously positioned. Alternately, a method may be employed in which either in the holding body or the electrically connecting member, or either the electrically connecting member or the electric circuit components are previously positioned as to be connected to each other by metallizing and/or alloying, and they are connected to each other by heating them at a temperature exceeding the melting point of the one end of the electrically conductive member, while the other end has a higher melting point which and is heated after it has been positioned. In the latter case, one end of the electrically conductive member is made of a material having a higher melting point than the other end.

There is a method arranged such that when the thus-manufactured electric circuit apparatus is again heat up to a temperature exceeding the lower melting point but not the higher melting point, only the electric circuit component connected to the electrically conductive member of the lower melting point is separated from the electrically connecting member. Then, by heating the apparatus to a temperature exceeding the lower melting point but no the higher melting point after performing the positioning again, the connection is again established by metallizing and/or alloying. If the positional relationship of the conjunction portions does not change, the electric circuit component which has been previously connected may be connected, or alternately, a different electric circuit component may be connected.

Mechanical portion or functioning portion which serves as a reference for clarifying the positional relationship As mechanical portions or function portions which serve as references for positioning the electric circuit component holding member and the other electric circuit components and which are disposed in these electric circuit component holding member and the electric circuit components, for example, positioning holes, positioning pins, surfaces serving as references, and positioning marks can be employed. Their shape and size may be determined optionally if the mechanical portions or the functioning portions can serve as references for holding or connecting the electric circuit component to the electric circuit component holding member and if the same can serve as a reference for positioning the electric circuit component holding member holding or connecting the electric circuit component and the other electric circuit components, that is, the junction portions of the electric circuit component held by or connected to the electric circuit component holding member and the conjunction portions of the other electric circuit components.

In addition, mechanical portions or functioning portions which serve as positioning references to be provided for the electric circuit component holding member, the other electric circuit components and electrically conductive member may be disposed in the central portion or the peripheral portion. However, the longer the interval between the reference portions, the more positional accuracy can be adjusted and improved.

Sealing method

As a method to seal the electric circuit component by the electric circuit component holding member is exemplified by the following methods (1) to (4). At least a portion of those components needs to be sealed by at least one of the following methods (1) to (4).

(1) After the electric circuit component holding member and the other electric circuit component have been positioned, the electric circuit component holding member and the other electric circuit component are sealed by resin. For example, thermosetting resin is thicker than the interval between the electric circuit component holding member and the other electric circuit component when connected to each other. The resin is applied to the peripheral portion in which the electric circuit component holding member of the other electric circuit component, and the electric circuit component holding member is positioned and connected before sealing the electric circuit component by heating the resin, so it hardens. In the case of ultraviolet curing resin, ultraviolet ray are applied to harden this resin after performing the positioning.

(2) The portion between the electric circuit component holding member and the other electric circuit component is sealed by glass having a relatively low melting point.

(3) Sealing of the electric circuit component is achieved by a mechanical fitting of the electric circuit component holding member and the other electric circuit component.

(4) Methods other than (1) to (3) in which the electric circuit component is sealed by the electric circuit component holding member and the other electric circuit component.

Since the electric circuit components are arranged to be attached to or detached from the electrically connecting member, the electric circuit components can be replaced at the time of a failure, enabling an electric circuit apparatus to be easily and readily maintained.

As a result of the uniform positional relationship between the conjunction portions, the electric circuit component to be held by or connected to the electric circuit component holding member can be readily connected to the other electric circuit component, and an individual electric circuit apparatus can be given a variety of functions whenever the electric circuit component holding member which holds the electric circuit component or which is connected to the electric circuit component is replaced.

Since the above-described replacement can be performed, even an electric circuit component of the electric circuit apparatus which is defective can be employed again in the manufacturing process of the electric circuit apparatus. As a result, manufacturing yield can be improved, and thereby the manufacturing cost can be reduced.

According to the present invention, since the electric circuit components and the other electric circuit component are connected to each other by using the above-described electric circuit component holding member and the electrically connecting member, the conjunction portion of the electric circuit components can be disposed in the periphery portion and as well the other portions of the components. As a result, the number of conjunction portions can be increased and cause a dense structure to be achieved.

In addition, since the quantity of metal material to be used for the electrically connecting member can be reduced, the overall cost can be reduced even if expensive gold is used as the metallic portion.

According to the present invention, since the electric circuit components are connected to each other by the electrically connecting member after the electric circuit component holding members have been held by or connected to the electric circuit component holding member a plurality of and a variety of electric circuit components can be sued. In addition, since the connection of the thus-employed electric circuit components is achieved collectively, a variety of electric circuit apparatuses can be manufactured in one manufacturing process.

By classifying the electric circuit components to be held by the holding member on the basis of their functions, the electric circuit components can be arranged on the basis of the function groups of the holding members holding or connecting the electric circuit components. Therefore, various electric circuit apparatuses can be manufactured from the same manufacturing process.

In addition, since the electric circuit components are held by the electric circuit holding member, the electric circuit components do not need to be held by jogs and/or tools during and after completion of the manufacturing process. As a result, control of manufacturing of the electric circuit apparatuses and the same after the manufacturing can be readily performed.

According to the present invention, since the electric circuit components and the other electric circuit component are connected to each other with the electrically connecting member after the electric circuit components have been held by the electric circuit component holding member, it is not necessary to perform complicated positioning of a surface down mount for each of the electric circuit components, and positioning of the conjunction portions of a plurality of electric circuit components can be easily performed. As a result, manufacturing yield can be significantly improved.

According to the present invention, since the electric circuit components are collectively positioned and connected to each other with the electrically connecting member after the electric circuit components have been held by the electric circuit component holding member, a variety of electric circuit components can be employed, and the connection of the thus-employed electric circuit components can be simultaneously performed. As a result, a variety of electric circuit apparatuses can be manufactured from the same manufacturing process.

According to the present invention, the electric circuit components can also be connected to a plurality of sides of the electrically connecting member. As a result, a three dimensionally electric circuit apparatus can be obtained.

When a material exhibiting excellent thermal conductivity is employed as the electric circuit component holding member, and/or when a material exhibiting excellent thermal conduct is employed as the insulating material of the electrically conductive member, heat generated from the electric circuit component can be quickly discharged to the outside. As a result, an electric circuit apparatus exhibiting excellent heat discharging characteristics can be obtained.

When the insulating body of the electrically conductive member is made of a material with a thermal expansion coefficient approximate to that of the electric circuit component, or when the electric circuit component holding member is made of a material with a thermal expansion coefficient approximate to that of the electric circuit component, the generation of thermal stress and strain can be prevented. As a result, defects which deteriorate the reliability of the electric circuit apparatus such as cracking of the electric circuit components or changes in the characteristics of the electric circuit components due to the application of heat can be prevented. As a result, a reliable electric circuit apparatus can be obtained.

When a plurality of electric circuit components are connected to each other by a conjunction layer formed by metallizing and/or alloying via the electrically connection member, the electric circuit components are strongly and assuredly connected to each other. This produces an electric circuit apparatus having a reduced and equal resistance at the conjunction portion and superior mechanical strength and which exhibits an extremely reduced defective ratio.

In addition, when a plurality of electric circuit components are, with the electrically connecting member, connected to each other by a conjunction layer formed by metallizing and/or alloying, the resistance at the conjunction portion between the electric circuit components can be further reduced with respect to the case where only one electric circuit component is connected by metallizing and/or alloying.

On the other hand, connection of the electric circuit components are achieved by a method other than metallizing and/or alloying, and deterioration due to heat from the electric circuit components caused from metallizing and/or alloying can be prevented.

If the electric circuit components are intended to be detachable a connection of the electric circuit components according to a method other than the metallizing and/or alloying can be used.

According to the present invention, the mechanical portions or functioning portions provided for the electric circuit component holding member, the other electric circuit components, and the electrically connecting member are capable of serving as references for the positional relationship. As a result, the positioning of the electric circuit component holding member and the other electric circuit components can be accurately achieved. That is, the conjunction portion between the electric circuit components held or connected by the electric circuit component holding member and the conjunction portion of the other electric circuit components can be further accurately positioned. As a result, a precise connection can be maintained. In addition, the connection can be performed at a high speed. When a mechanically-fitting type is used as the mechanical portion which serves as the reference for the positional relationship, connection can be simply performed without any positioning. In addition, the connection is established after the positioning has been achieved accurately, the strength distribution of the connected portions can be significantly uniformed. As a result, reliability can be improved.

As a result of the arrangement performed such that the electric circuit component holding member serves as a cap for sealing the electric circuit component, heat generated from the electric circuit component can be quickly discharged outside. Therefore, an electric circuit apparatus exhibiting an excellent heat discharge performance can be obtained. In addition, as a result of the fact that the electric circuit components are sealed from the outside, water invasion into the apparatus can be protected. Consequently, the circuit portion of the conjunction portions and the electric circuit components can be protected from any corrosion, causing its reliability to be improved.

Since the functioning portions of the conjunction portions and the electric circuit components are sealed in a hollow state, any generation of thermal stress or strain due to the difference in the thermal expansion coefficient can be prevented even if the size of the apparatus is enlarged. As a result, defects which deteriorate the reliability of the electric circuit apparatus such as cracking of the electric circuit components or change in the characteristics of the electric circuit components due to the application of heat can be prevented. As a result, a reliable electric circuit apparatus can be obtained.

First embodiment

A first embodiment of the present invention will be described with reference to FIGS. 5(a) and 5(b) and FIGS. 6(a) to 6(c).

Referring to FIG. 5(a) which is a cross-sectional view, a state is illustrated where a connection is not established between an electric circuit component holding member 201 holding a plurality of semiconductor devices 101 which serves as the electric circuit components; an electrically connecting member 25; and a circuit substrate 104 which serves as the other electric circuit component. The number of semiconductor devices 101 needs to be one or more.

The electrically connecting member 125 is so arranged that metal components 107 which serve as electrically conductive members are embedded in a holding body 111 which is made of an organic material. An end of the metal member 107 appears on one side of the holding body 111, while another end of this metal member 107 appears on another side of the holding body.

The electric circuit component holding member 201 comprises a glass substrate which holds, by adhesion, the sides of the semiconductor devices 101 on which no conjunction portions 102 are present, with one or more conjunction portions 102 being disposed on the other side.

The semiconductor device 101 includes conjunction portions 102, that are connected, by allowing to the end portions of the metal members 107 which appear on the one side of the holding boy 111.

The circuit substrate 104 includes conjunction portions 105 that are connected to the other end portions of the metal members 107 which appear on the other side of the holding body 111.

FIG. 5(b) is a cross-sectional view which illustrates a state where the above-described components are integrated as this connection.

Now, this embodiment will be described in detail.

The electrically connecting member 125 will be described by an example of manufacturing the same.

Figure 6A:
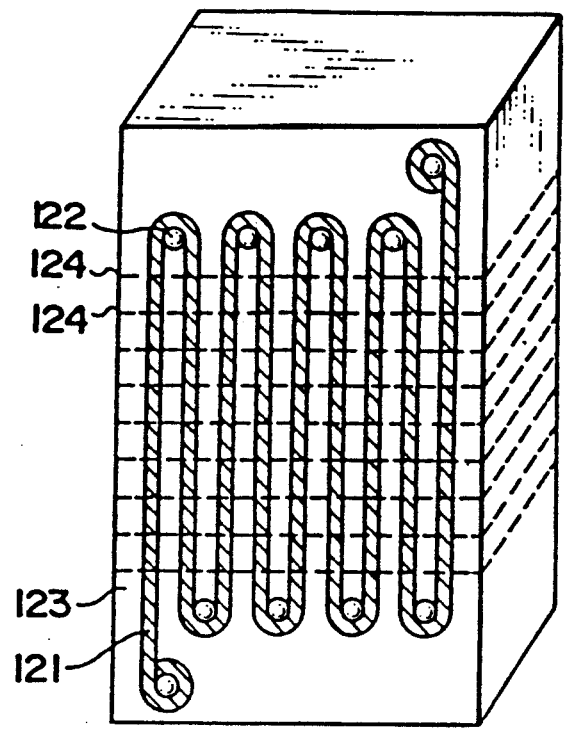
FIGS. 6A to 6C are a cross-sectional view and perspective views which illustrate a method of manufacturing an electrically connecting member for use in the first embodiment.
Figure 6B:
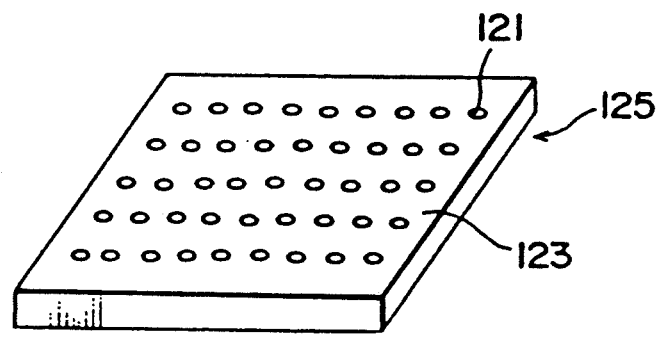
Figure 6C:
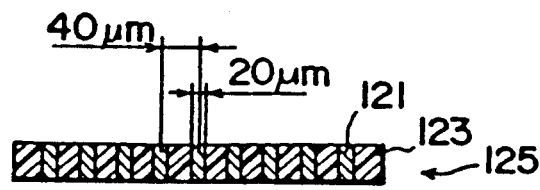
Figure 7A:
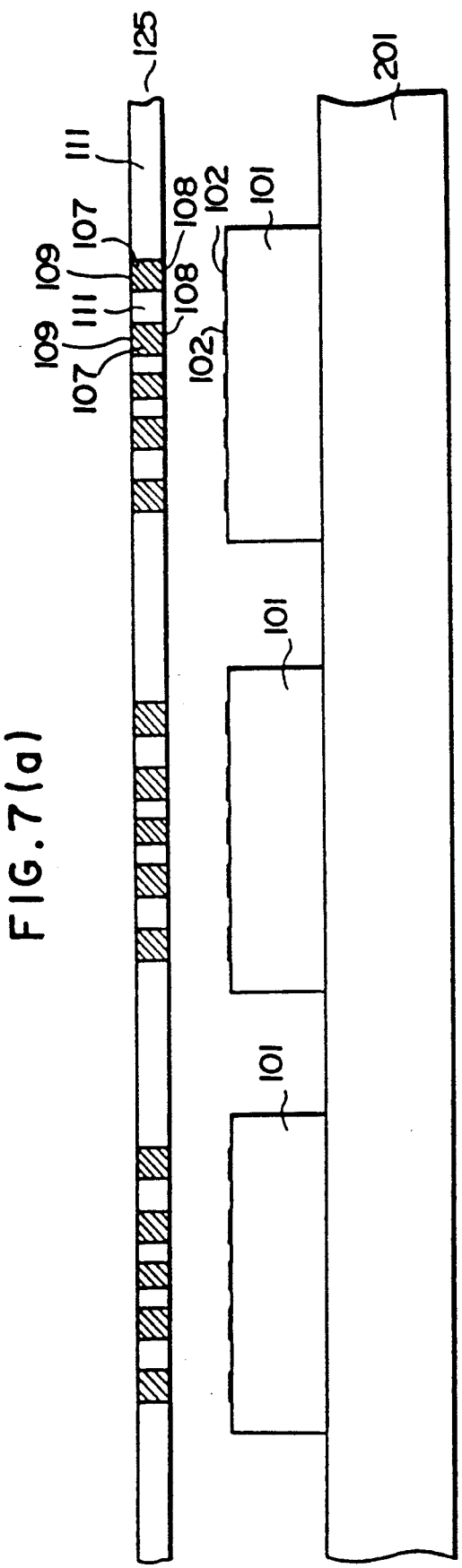
Figure 7B:
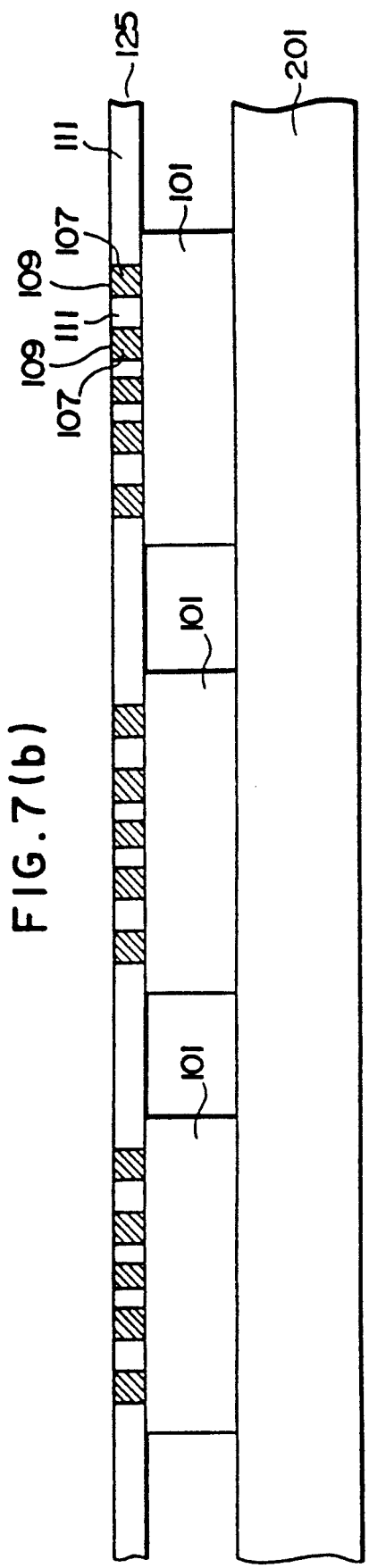

FIGS. 6(a) and 6(c) are views which illustrate a manufacturing example.

First, as shown in FIG. 6(a), a 20 μmø metal wire 121 made of metal such as gold or the like or an alloy is wound around a rod 122 at a pitch of 40 μm. The thus-wound metal wire 121 is embedded in resin 123 such a polyamide or the like. This resin 123 is then hardened after the metal wire 121 has been embedded. The hardened resin 123 becomes an insulating body. Then, this insulating body in which the metal wire 121 has been embedded therein is cut into slices so that the electrically connecting member 125 is manufactured. The thus-manufactured electrically connecting member 125 is shown in FIGS. 6(b) and 6(c).

In the thus-manufactured electrically connecting member 125, the metal wire 121 forms the metal member 107 and the resin 123 forms the holding body (insulating body) 111.

In this electrically connecting member 125, the metal wires 121 which serve as the metal members are electrically insulated from each other by the resin 123. End portions of the metal wire 121 appear on the side confronting the semiconductor 101, while the other end circuit substrate 104. These portions which appear outside become the conjunction portions 108 and 109 of the corresponding semiconductor device 101 and the circuit substrate 104.

As shown in FIG. 5(a), the glass substrate 201, the semiconductor devices 101, the electrically connecting member 125, and the circuit substrate 104 are prepared. The semiconductor device 101 and the circuit substrate 104 according to the present invention include a multiplicity of conjunction portions 102 and 105.

The semiconductors 101 are positioned and held by the glass substrate 201 by using an adhesive such that the positional relationship between the conjunction portions 102 of the semiconductor devices 101 and the conjunction portions 105 of the circuit substrate 104 become the same after the connection has been established. After all of the semiconductors 101 to be connected to the glass substrate 201 are held by the glass substrate 201, the glass substrate 201 is turned, or the circuit substrate 104 is turned so as to match the conjunction portion 102 of the semiconductor 101 with the conjunction portion 105 of the circuit substrate 104 and to insert the electrically connecting member 125 therebetween (see FIG. 5a).

First, positioning is so performed that the conjunction portions 105 of the circuit substrate 104 confront the conjunction portions 109 of the electrically connecting member 125. Then, the glass substrate 201 and the circuit substrate 104 are positioned. Since the conjunction portions 102 of the semiconductor devices 101 held by the glass substrate 201 are positioned and then to correspond to the positions of the conjunction portions 105 of the circuit substrate 104, the positions of the conjunction portions 102 of the semiconductor devices 101 correspond to the positions of the conjunction portions 108 of the electrically conductive member 125.

As a result, a connection can be established such that Al of the conjunction portions 102 of the semiconductor devices 101 and Au of the conjunction portions 108 of the electrically connecting member 125, and Au of the conjunction portions 105 of the circuit substrate 104 and Au of the conjunction portions 109 of the electrically connecting member 125 are connected to each other by metallizing and/or alloying (see FIG. 5(b)).

Any of the following three ways can be employed to connect the semiconductor devices 101, the electrically connecting member 125 and the circuit substrate 104 by metallizing and/or alloying.

(1) After positioning the glass substrate 201, electrically connecting member 125, and the circuit substrate 104, a connection between the conjunction portions 102 of the semiconductor devices 101 and the conjunction portions 108 of the electrically connecting member 125 and a connection between the conjunction portions 105 of the circuit substrate 104 and the conjunction portions 109 of the electrically connecting member 125 are each established by metallizing and/or alloying.

(2) The glass substrate 201 and the electrically connecting member 125 are positioned, and the conjunction portions 102 of the semiconductor device 101 and the conjunction portions 108 of the electrically connecting member 125 are connected to each other by alloying. Then the circuit substrate 104 is positioned to connect the conjunction portions 109 of the electrically connecting member 125 to the conjunction portions 105 of the circuit substrate 104 by metallizing and/or alloying (see FIG. 7(a) to 7(d)).

(3) The circuit substrate 104 and the electrically connecting member 125 are positioned, and the conjunction portions 105 of the circuit substrate 104 and the conjunction portions 109 of the electrically connecting member 125 are connected to each other by metallizing and/or alloying. Then, the glass substrate 201 is positioned to connect the conjunction portions 108 of the electrically connecting member 125 and the conjunction portions 102 of the semiconductor device 101 by metallizing and/or alloying (see FIGS. 8(a) to 8(b)).

All of the thus-manufactured electric circuit apparatus displayed excellent reliability in the connection established in the conjunction portions thereof as a result of the examination.

In addition, the same displayed excellent characteristics.

Second embodiment

FIGS. 9(a) to 9(d) are views which illustrate a second embodiment.

The conjunction portions 102 of the semiconductor devices 101 and the conjunction portions 108 of the electrically connecting member 125 are positioned, and then they are connected to each other by metallizing and/or alloying.

As the electrically connecting member 125, the size is arranged to correspond to the size of the semiconductor devices 101.

Figure 9A:
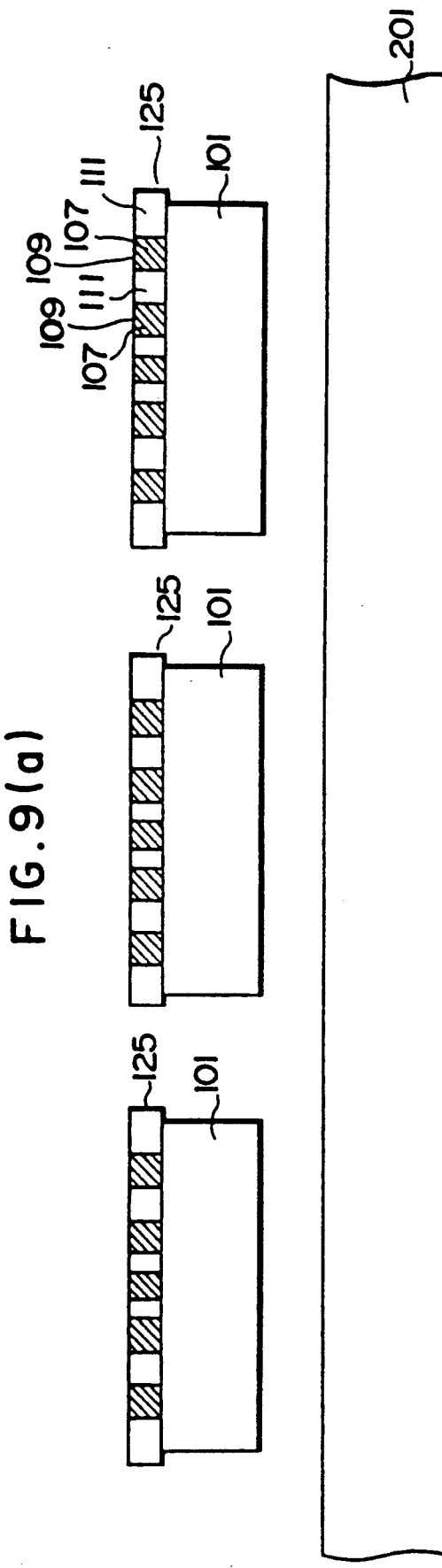
FIGS. 9A and 9B are cross-sectional views which illustrate the states before and after each of the semiconductor devices according to a second embodiment and the electrically connecting member which had been connected to each other have been held by an electric circuit holding member.
Figure 9B:
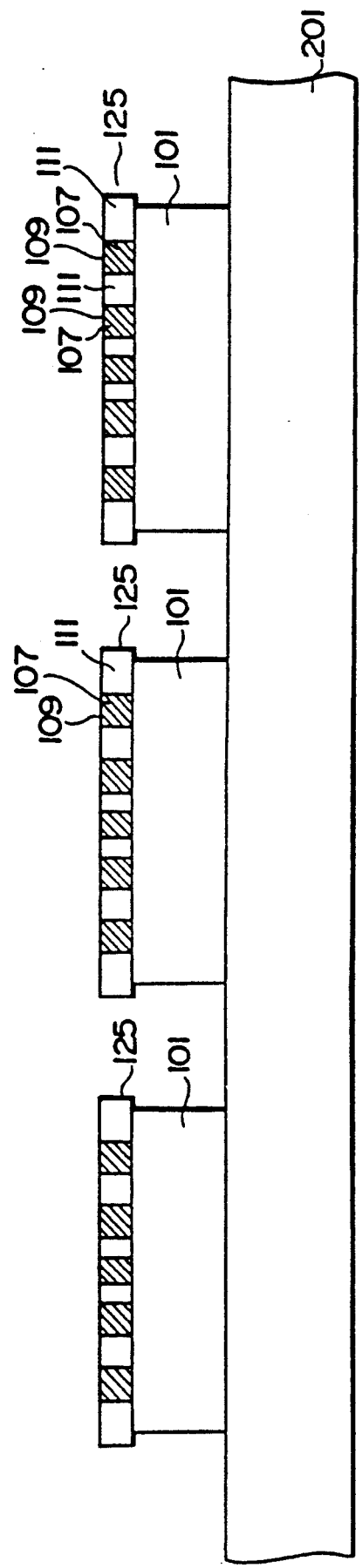

The semiconductor devices 101 connected to the electrically connecting member 125 are then positioned to correspond to the positions of the conjunction portions 105 of the circuit substrate 104, and then the semiconductor devices 101 are held by the glass substrate 201 with an adhesive (see FIG. 9(b)).

Next, the glass substrate 201 is turned to make the conjunction portions 109 of the electrically connecting member 125 confront the conjunction portions 105 of the circuit substrate 104, and the glass substrate 201 and the circuit substrate 104 are positioned (see FIG. 9(c)). As a result, the conjunction portions 109 of the electrically connecting member 125 and the conjunction portions 105 of the circuit substrate 104 are necessarily positioned so that connection can be established by metallizing and/or alloying (see FIG. 9(d)).

Figure 19A:
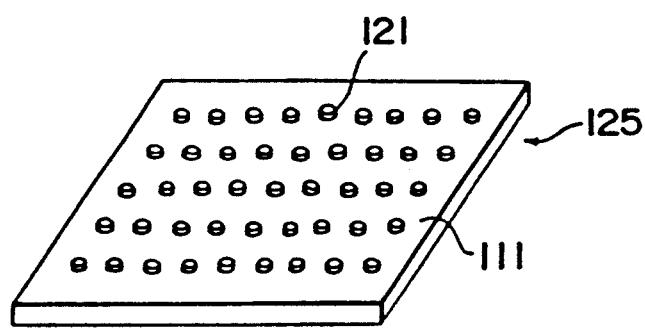
FIGS. 19A and 20A are perspective views of the seventh embodiment.

As shown in FIG. 19(a) and 10(d), the electrically connecting members 125 of the size which corresponds to the size of the semiconductor devices 101 to be connected to the circuit substrate 104 are connected to the circuit substrate 104 are connected to the circuit substrate 104 by metallizing and/or alloying after positioning of the conjunction portions 109 of the electrically connecting member 125 and the conjunction portions 105 of the circuit substrate 104 has been performed. Then, the glass substrate 201 and the circuit substrate 104 are positioned, the conjunction portions of the semiconductor device 101 held by the glass substrate 201 and the conjunction portions 108 of the electrically connecting member 125 are connected to each other by metallizing and/or alloying (see FIG. 10(b)).

According to this embodiment, the conjunction portions displayed excellent reliability.

Third embodiment

FIGS. 11(a) and 11(b) are views which illustrate a third embodiment.

Reference numeral 202 represents an electric circuit component holding member comprising a ceramic substrate in which recessed portions in which the semiconductor devices 101 are held therein are formed. After positioning the semiconductor devices 101 within the recessed portions of the ceramic substrate 202 such that the positions of the conjunction portions 102 of the semiconductor devices 101 correspond to the positions of the conjunction portions of the circuit substrate 104, the peripheral portions are held by resin 203. Then, the ceramic substrate 202 is turned to make the conjunction portions 102 of the semiconductor devices 101 confront the conjunction portions 105 of the circuit substrate 104, and the electrically connecting member 125 is inserted therebetween (see FIG. 11(a)).

Then, the conjunction portions of the circuit substrate 104 and the conjunction portions 1-9 of the electrically connecting member 125 are positioned, and then the ceramic substrate 202 and the circuit substrate 104 are positioned to establish the connection between the conjunction portions 102 of the semiconductor devices 101 and the conjunction portions 108 of the electrically connecting member 125, and connection between the conjunction portions 105 of the circuit substrate 104 and the conjunction portions 109 of the electrically connecting member 125 by metallizing and/or alloying (see FIG. 11(b)).

Figure 12:
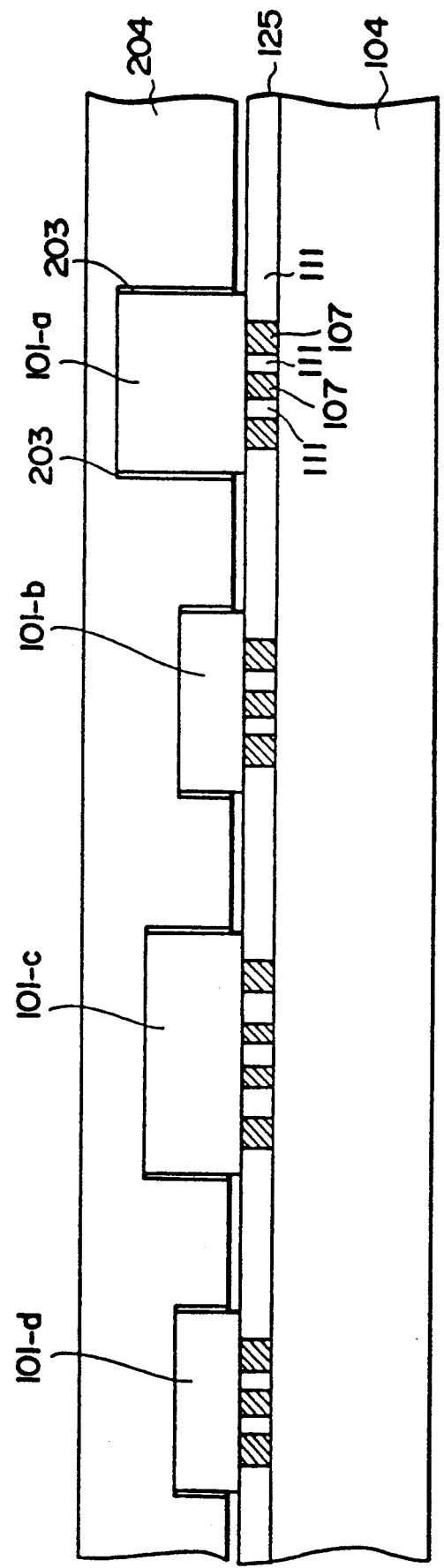
FIG. 12 is a cross-sectional view which illustrates the state where the connection according to the third embodiment has been established.

The recessed portions in the ceramic substrate 202 can hold any type of semiconductor devices by designing the recessed portion in the form which correspond to the shape of the semiconductor devices 101-a to 101-d (FIG. 12) to be held.

As described above, by arranging the shape of the electric circuit component holding member to correspond to the shape of the electric circuit component to be held, dense mounting can be freely performed and the design can be enhanced.

Since the semiconductor devices serving as the electric circuit components are held on the sides other than the sides in which the same are held, an excellent heat discharging characteristic can be obtained.

According to this embodiment, all of the conjunction portions exhibit excellent reliability.

Fourth embodiment

Figure 13A:
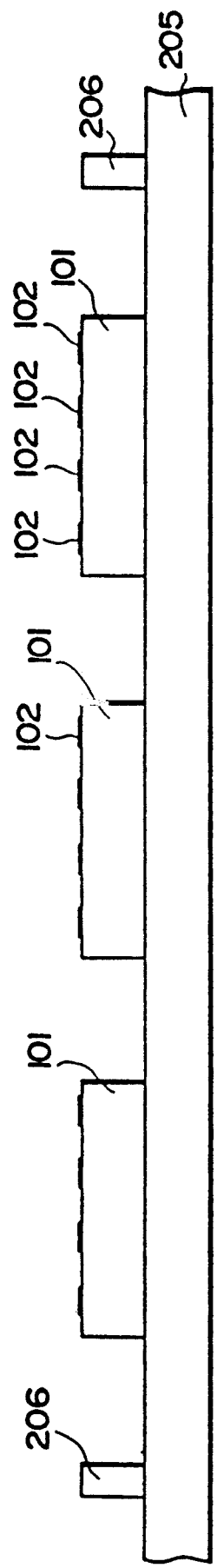
FIG. 13A is a cross-sectional view which illustrates the state where the semiconductor device is temporarily secured to an abutting plate according to a fourth embodiment.
Figure 13B:
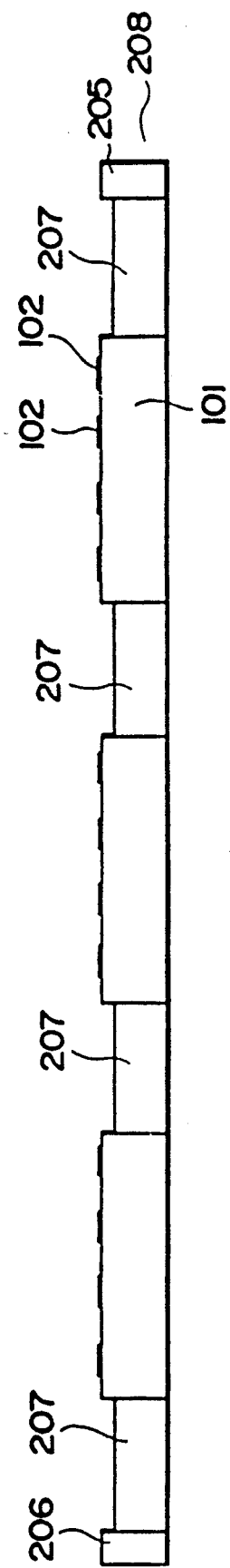
FIG. 13B is a cross-sectional view which illustrates the state where the semiconductor device is held by a resin according to the fourth embodiment.

FIGS. 13(a) to 13(b) are views which illustrate a fourth embodiment.

Reference numeral 205 represents a glass substrate for temporally fastening the semiconductor device 101 and a frame 206. The frame 206 is temporally fastened on the glass substrate 205 by an adhesive. Then, the semiconductor devices 101 are positioned to make the conjunction portions 102 thereof correspond to the conjunction portions of the circuit substrate 104, and then, the semiconductor devices 101 are temporally fastened to the glass substrate 104 by an adhesive (see FIG. 13(a)).

Then, resin is injected in a portion surrounded by the frame 2 to hold the semiconductor devices 101. After the resin has been hardened, the glass substrate 205 is removed (see FIG. 13(b)).

The thus-manufactured electric circuit component holding member is turned to make the conjunction portions 102 of the semiconductor devices 101 and the conjunction portions 105 of the circuit substrate 104 confront each other, and the electrically connecting member 125 is inserted therebetween (see FIG. 13(c)). Then the conjunction portions 109 of the electrically connecting member 125 and the conjunction portions 105 of the circuit substrate 104 are positioned to establish a connection between the conjunction portions 102 of the semiconductor device 101 and the conjunction portions 108 of the electrically connecting member 125 and a connection between the conjunction portions 105 of the circuit substrate 104 and the conjunction portions 109 of the electrically connecting member 125 by metallizing and/or alloying (see FIG. 13(d)).

According to this embodiment, since the semiconductor devices serving as the electric circuit components are held from the lateral direction, the thickness of the devices can be reduced.

Also in this embodiment, the conjunction portions exhibit excellent reliability.

Fifth embodiment

Figure 14A:
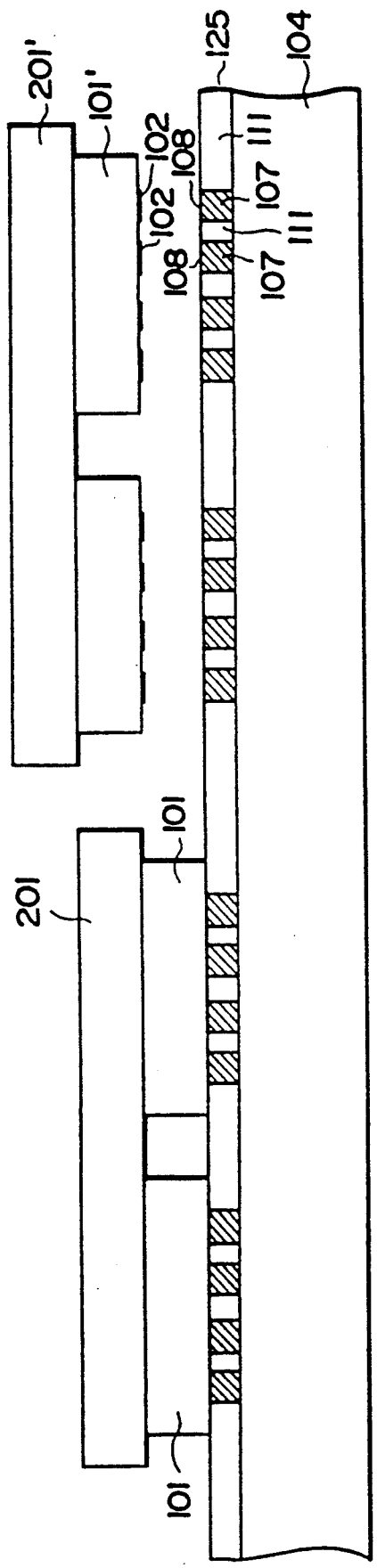
FIGS. 14A and 14B are cross-sectional views which illustrate the states before and after the second connection according to a fifth embodiment.
Figure 14B:
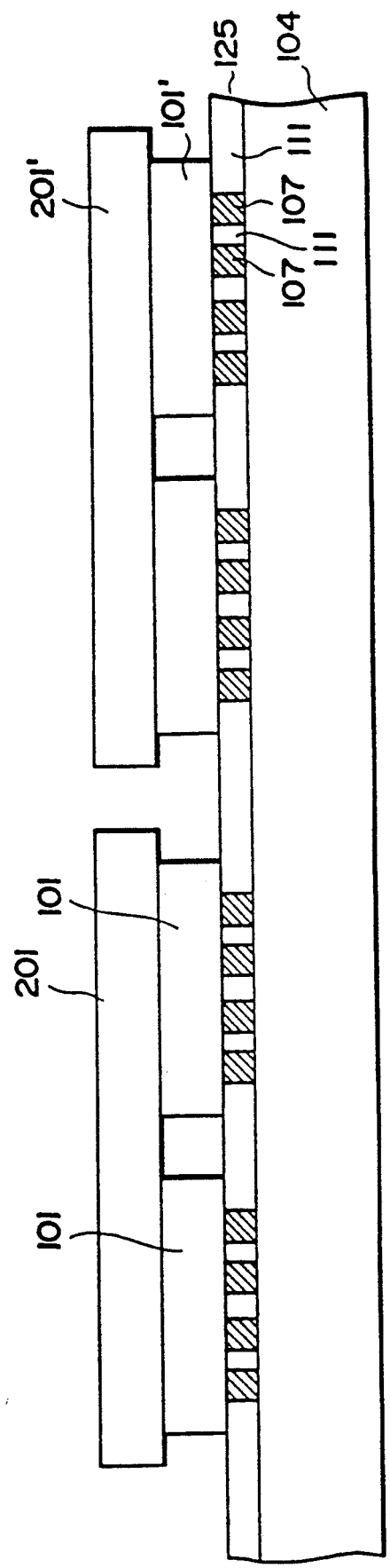

FIGS. 14(a) and 14(b) are views which illustrate a fifth embodiment.

The semiconductor devices 101 held by the glass substrate 201 with the electrically connecting members 125 are connected to the circuit substrate 104, and similarly semiconductor devices 101' held by a glass substrate 201' are connected to this circuit substrate 104.

According to this embodiment, by classifying, on the basis of functions, the semiconductor devices 101 and 101' serve as the electric circuit components to be held by the glass substrate 201 and 201', which are the electric circuit component holding members, the electric circuits can be classified into units. As a result, a variety of types can be manufactured from the same manufacturing process.

Figure 15A:
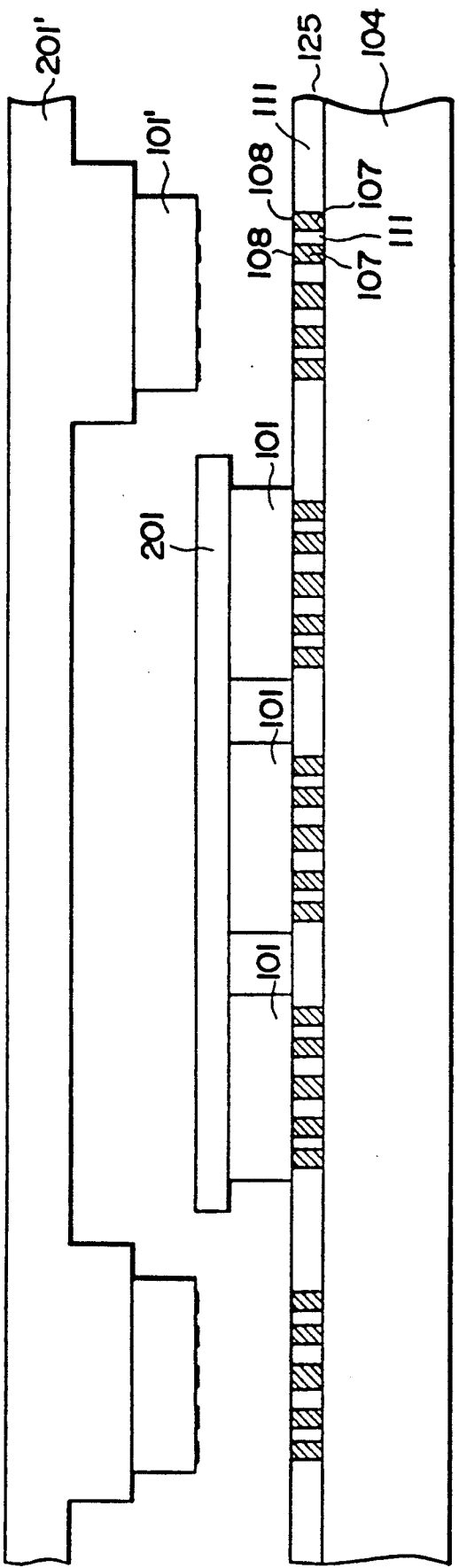
FIGS. 15A and 15B are cross-sectional views which illustrate the states before and after the second connection according to the fifth embodiment.
Figure 15B:
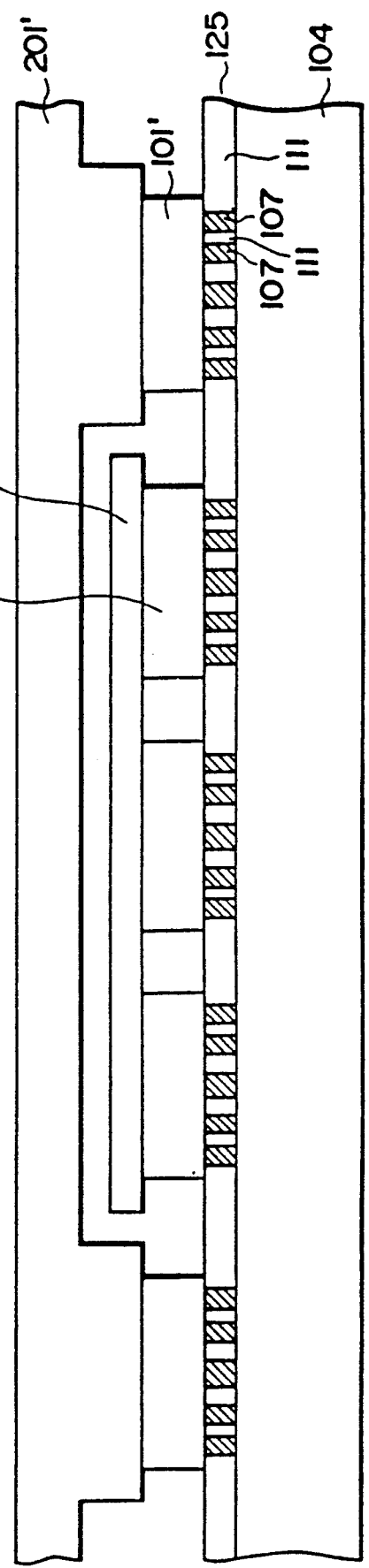

In addition, as shown in FIGS. 15(a) and 15(b), a structure may be employed such that a relief is formed in the electric circuit component holding member 201' to be connected to the same circuit substrate.

Figure 16A:
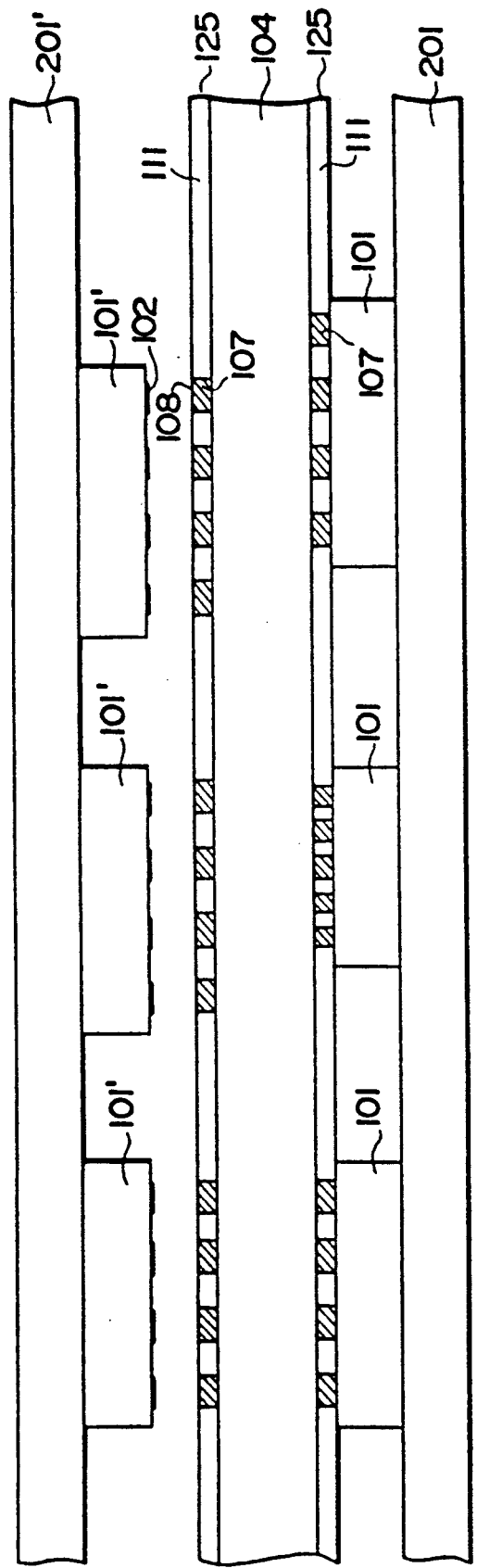
FIGS. 16A and 16B are cross-sectional views which illustrate the states before and after the second connection according to the fifth embodiment.
Figure 16B:
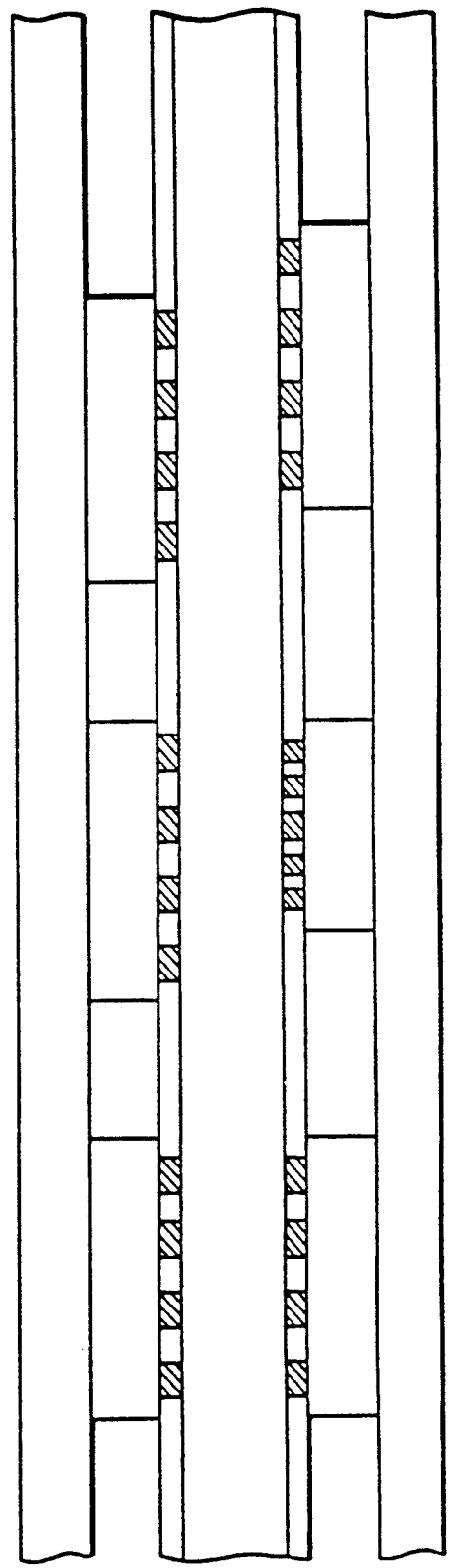

Furthermore, a structure may be employed as shown in FIGS. 16(a) and 16(b), such that the electric circuit component holding members 201 and 201' are disposed on both sides of the circuit 104 to connect the semiconductor devices 101 and 101'.

Also in this embodiment, the conjunction portions exhibit excellent reliability.

Sixth embodiment

FIGS. 17(a) and 17(b) are views which illustrate a sixth embodiment.

The conjunction portions of semiconductor devices 208, which are separate from the semiconductors 101 and 101' held by the glass substrate 201, are connected with the conjunction portions of the electrically connecting member 125 by metallizing and/or alloying. The semiconductor devices 208 are connected to the circuit substrate 104 by metallizing and/or alloying.

Then, positioning is performed so that the positions of the conjunction portions of the semiconductor devices 101 and 101' and the positions of the conjunction portions 108 of the electrically connecting member 125 (connected to the semiconductor device 208 connected to the circuit substrate 104) correspond to each other, and the semiconductor devices 101 and 101' are held by the glass substrate 201 by an adhesive. Then, the glass substrate 201 is turned to position the conjunction portions 102 of the semiconductor devices 101 and 101' with the conjunction portions 108 of the electrically connecting member 125. Then the glass substrate 201 and the circuit substrate 104 are positioned and connected to each other by metallizing and/or alloying.

According to this embodiment, the other semiconductor devices can be readily connected to the semiconductor device and the conjunction portions exhibit excellent reliability.

Seventh embodiment

Figure 18A:
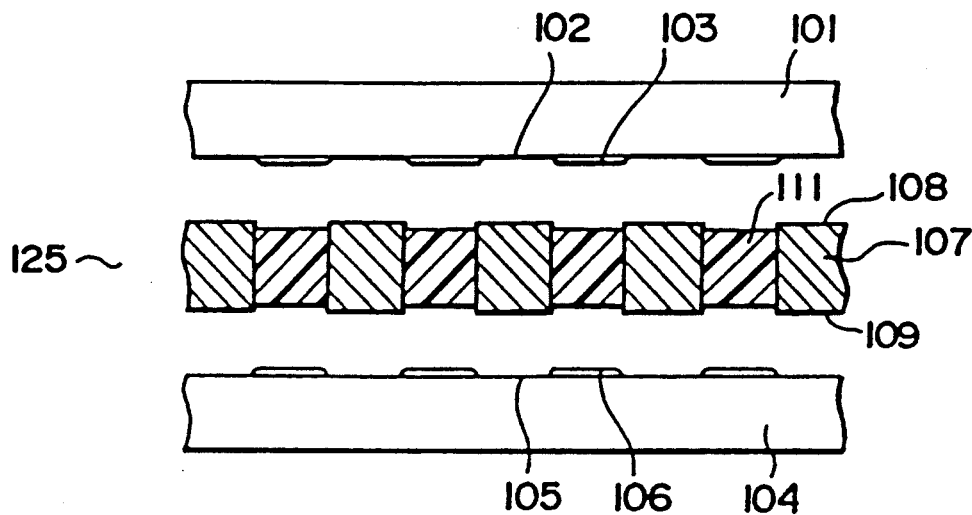
FIGS. 18A and 18B are cross-sectional views which illustrate the states before and after the connection according to a seventh embodiment.
Figure 18B:
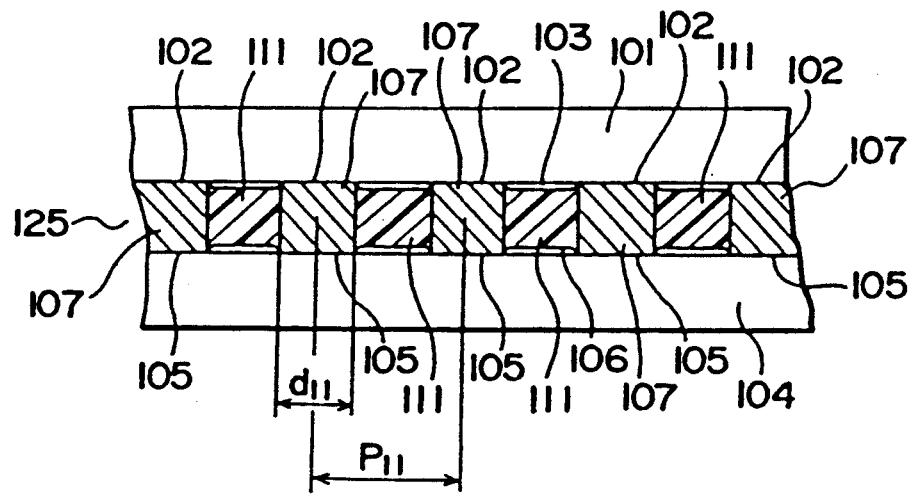

FIGS. 18(a) and 18(b) are views which illustrate a seventh embodiment.

According to the seventh embodiment, the semiconductor devices 101 and the circuit substrate 104 are employed as the electric circuit component and the other electric circuit components, in which the portions other than the conjunction portions are covered with insulating films 103 and 106.

Figure 19B:
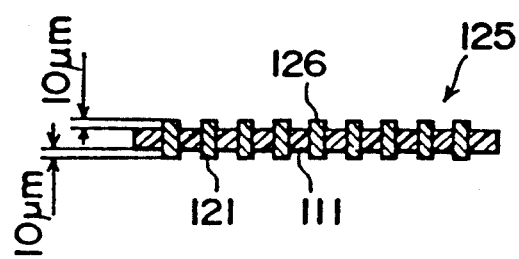
FIGS. 19B and 20B are cross-sectional views of the seventh embodiment.

The electrically connecting member shown in FIGS. 19(a) and 19(b) can be used. FIGS. 19(a) is a perspective view, while FIG. 19(b) is a cross-sectional view. As shown in FIGS. 19(a) and 19(b), the electrically connecting member 125 is so arranged that the portion of the metal members 107 which appear outside project over the surface of the holding body (resin insulating body) 111. This electrically connecting member 125 may be manufactured by, for example, the following method.

First, by the method according to the first embodiment, the electrically connecting member shown in FIGS. 6(b) and 6(c) is prepared. The two sides of this electrically connecting member are subjected to an etching process to make the metal wire 121 projected from the surface of the polyamide resin by substantially 10 μm. Although the length of projection of the metal wire 121 is arranged to be 10 μm according to this embodiment, it may be optionally determined. In addition, a method of making the metal wire 121 project is not limited to this etching. Other chemical or mechanical methods can be employed.

The other factors are the same as those of the first embodiment.

Figure 20A:
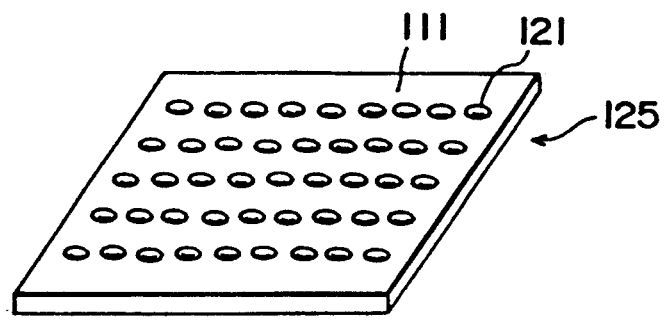
Figure 20B:
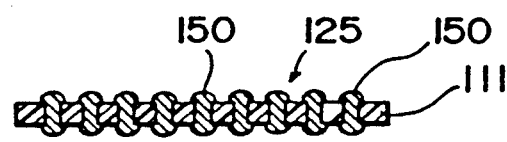

Bumps 150 as shown in FIGS. 20(a) and 20(b) may be formed by fitting the electrically connecting member 125 within a mold having recessed portions at the positions corresponding to the metal wire 121 to deform the projections 126 of the metal wire 121. In this case, the metal wires 121 cannot be readily separated from the insulating body 111.

According to this embodiment, the metal wires 121 form the metal members 107 and the resin 123 forms the insulating body 111.

The bumps may be formed by melting the projections by heat or other methods.

According to this embodiment, the conjunction portions also exhibit excellent reliability.

Eighth embodiment

Figure 21A:
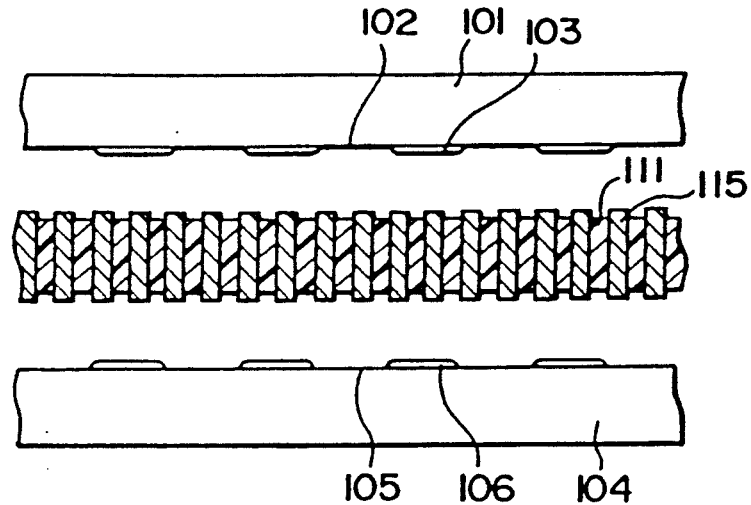
FIG. 21A is a view which illustrates the eighth embodiment in the state before the connection.
Figure 21B:
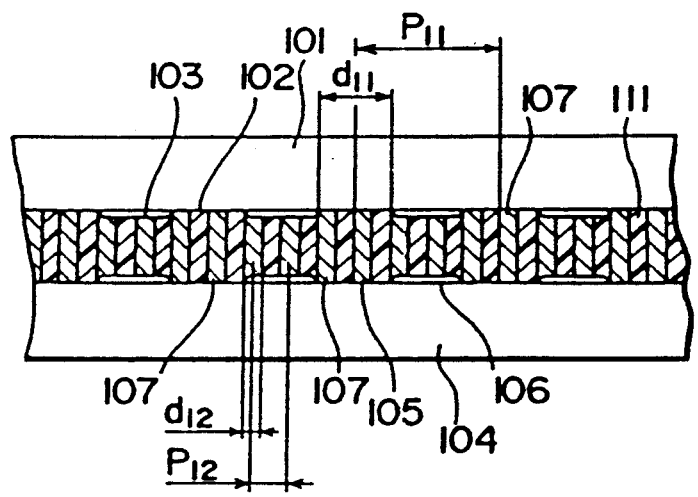
FIG. 21B is a view which illustrates the eighth embodiment in the state after the connection.
Figure 23A:
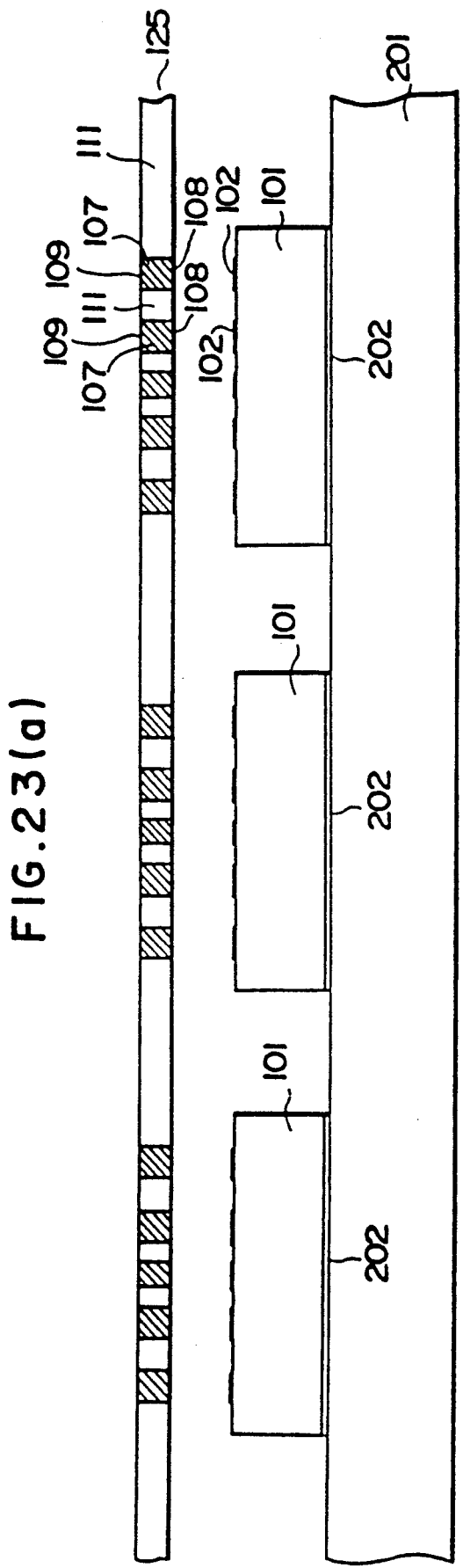
Figure 23B:
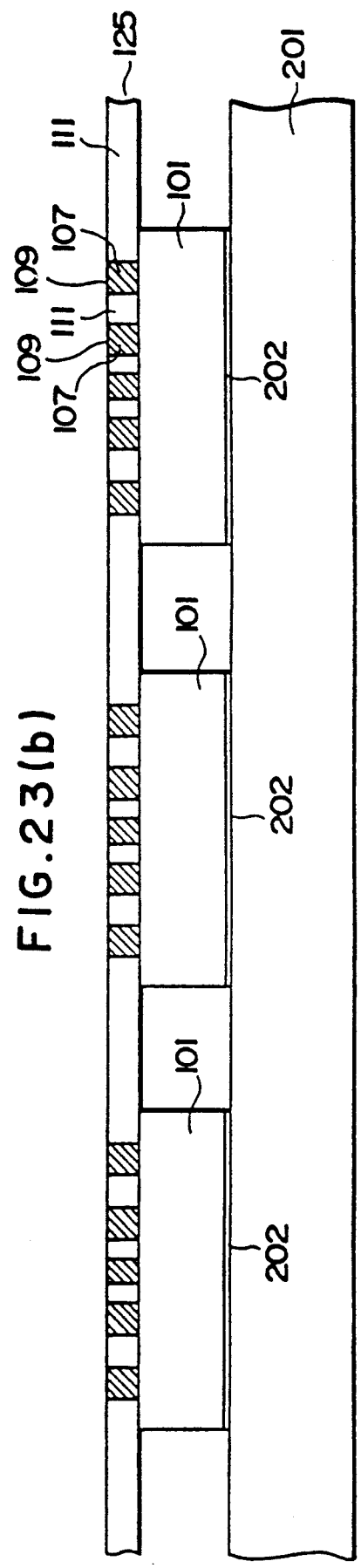

FIGS. 21(a) and 21(b) are views which illustrate an eighth embodiment.

According to this embodiment, the electrically connecting member 125 is individually designed from that according to the seventh embodiment. The electrically connecting member 125 according to this embodiment is designed such that the pitch between the metal members is narrower with respect to that shown in the seventh embodiment. That is, according to this embodiment, the pitch between the metal members 107 is arranged to be narrower than the interval between the conjunction portions of the semiconductor devices.

That is, according to the seventh embodiment, since the conjunction portions for the electrically connecting member 125 is disposed at the positions at which the semiconductor devices 101 and the circuit substrate 104 is connected to each other, the electrically connecting member 125 needs to be positioned. According to this embodiment, although positioning between the semiconductor devices 101 and the circuit substrate 104 is still needed, positioning with respect to the electrically connecting member 125 is unnecessary. As a result, if the dimensions d11 and P11 for connecting the semiconductor devices 101 and the circuit substrate 104 and the dimensions d 12 and P12 for connecting the electrically connecting member are determined properly, they can be connected to each other without the need for positioning.

The other factors are the same as those for the first embodiment.

According to this embodiment, the conjunction portions also exhibit excellent reliability.

Ninth embodiment

A ninth embodiment according to the present invention will be described with reference to FIGS. 22(a) and 22(b).

The difference from the first embodiment lies in that a circuit substrate having a surface on which a circuit is formed is employed as the electric circuit component holding member 201 and the surfaces of the semiconductor devices 101 on which or more conjunction portions 102 are present are held by metallizing and/or alloying or by using an adhesive.

As shown in FIG. 22(a), the circuit substrate 201, the semiconductor devices 101, electrically connecting member 125 and the circuit substrate 104 are prepared. According to this embodiment, the semiconductor devices 101 and the circuit substrate 104 include a multiplicity of conjunction portions 102 and 105.

The metal portions of the conjunction portions 102 of the semiconductor devices 101 appear outside the positions corresponding to the conjunction portions 105 of the circuit substrate 104 and the conjunction portions 108 and 109 of the electrically connecting member 125.

First, the semiconductor devices 101 are positioned with the circuit substrate 201 to make the conjunction portions 102 of the semiconductor devices 101 correspond to the conjunction portions 105 of the circuit substrate 104. Then, the semiconductor devices 101 and the circuit substrate 201 are connected to each other by metallizing and/or alloying so that the semiconductor devices 101 are held by the circuit substrate 201. The semiconductor devices 101 connected to the circuit substrate 201 may be electrically insulated within the circuit substrate. Then, the circuit substrate 201 is turned to make the conjunction portions 102 of the semiconductor devices 101 and the conjunction portions 105 of the circuit substrate 104 confront each other, and the electrically connecting member 125 is inserted therebetween (see FIG. 22(a)).

A positioning is performed so that the conjunction portions 105 of the circuit substrate 104 correspond to the conjunction portions 109 of the electrically connecting member 125. Then, the circuit substrate 201 and the circuit substrate 201 and the circuit substrate 104 are positioned. As a result, since the conjunction portions 102 of the semiconductor devices 101 held by the circuit substrate 201 are positioned to correspond to the conjunction portions 105 of the circuit substrate 104, the positions of the same necessarily correspond to the positions of the conjunction portions 108 of the electrically conductive member 125.

Therefore, the connection can be established such that a connection between A1 of the conjunction portions 102 of the semiconductor devices 101 and Au of the conjunction portions 108 of the electrically connecting member 125, and a connection between Au of the conjunction portions 105 of the circuit substrate 104 and Au of the conjunction portions 109 of the electrically connecting member 125 are established by metallizing and/or alloying (see FIG. 22(b)).

Any method can be selected from the following three methods in order to connect the semiconductor devices 101, the electrically connecting member 125 and the circuit substrate 104 by metallizing and/or alloying.

(1) After positioning the circuit substrate 201, the electrically connecting member 125, and the circuit substrate 104, a connection between the conjunction portions 102 of the semiconductor devices 101 and the conjunction portions 108 of the electrically connecting member 125 and a connection between the conjunction portions 105 of the circuit substrate 104 and the conjunction portions 109 of the electrically connecting member 125 are simultaneously established by metallizing and/or alloying.

(2) The circuit substrate 201 and the electrically connecting member 125 are positioned, and the conjunction portions 102 of the semiconductor devices 101 and the conjunction portions 108 of the electrically connecting member 125 are connected to each other by alloying. Then, the circuit substrate 201 and the circuit substrate 104 are positioned to establish a connection between the conjunction portions 109 of the electrically connecting member 125 and the conjunction portions 105 of the circuit substrate 104 is established by metallizing and/or alloying (see FIG. 23(a) to 23(d)).

(3) The circuit substrate 104 and the electrically connecting member 125 are positioned, and the conjunction portions 105 of the circuit substrate 104 and the conjunction portions 109 of the electrically connecting member 125 is connected to each other by metallizing and/or alloying. Then, the circuit substrate 201 and the circuit substrate 104 are positioned to connect the conjunction portions 108 of the electrically connecting member 125 and the conjunction portions 102 of the semiconductor device 101 by metallizing and/or alloying (see FIG. 24(a) to 24(b)).

The thus-manufactured electric circuit apparatus exhibits excellent reliability in the connections of the conjunction portions.

Tenth embodiment

FIGS. 25(a) to 25(d) are views which illustrate a tenth embodiment.

The difference from the second embodiment lies in that a circuit substrate is employed as the electric circuit component holding member 201 and the semiconductor devices 101 are connected to the circuit substrate 201 by metallizing and/or alloying after positioning to make the conjunction portions 109 of the semiconductor devices 101 and the conjunction portions 105 of the circuit substrate 104 correspond to each other (see FIG. 25(b).

According to this embodiment, the conjunction portions exhibit excellent reliability. As shown in FIGS. 26(a) and 26(b), the sequential order of connection can be changed.

Eleventh embodiment

FIGS. 27(a) and 27(b) illustrate an eleventh embodiment.

The semiconductor devices 101 connected to the circuit substrate 201 with the electrically connecting member by a method according to the ninth embodiment are connected to the circuit substrate 104. In addition, the semiconductor devices 101' connected to the circuit substrate 201' by a method according to the ninth embodiment are connected to this circuit substrate 104.

Figure 28A:
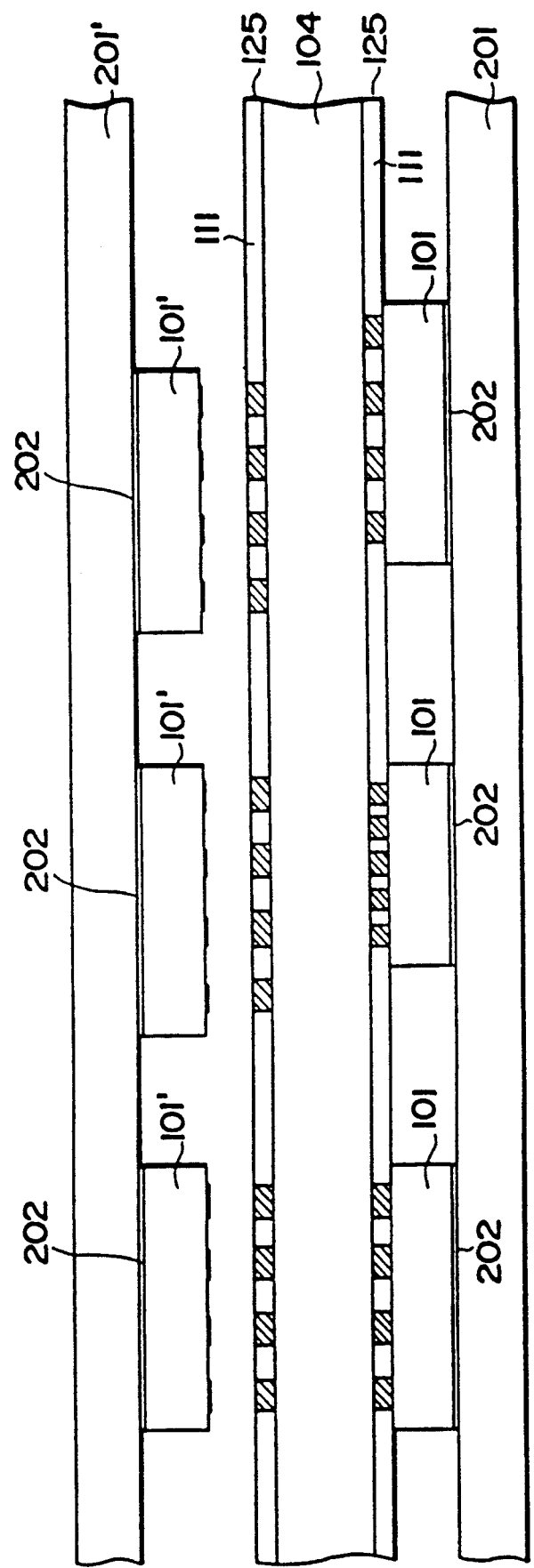
FIGS. 28A and 28B are cross-sectional views which illustrate the states before and after the connection according to the eleventh embodiment.
Figure 28B:
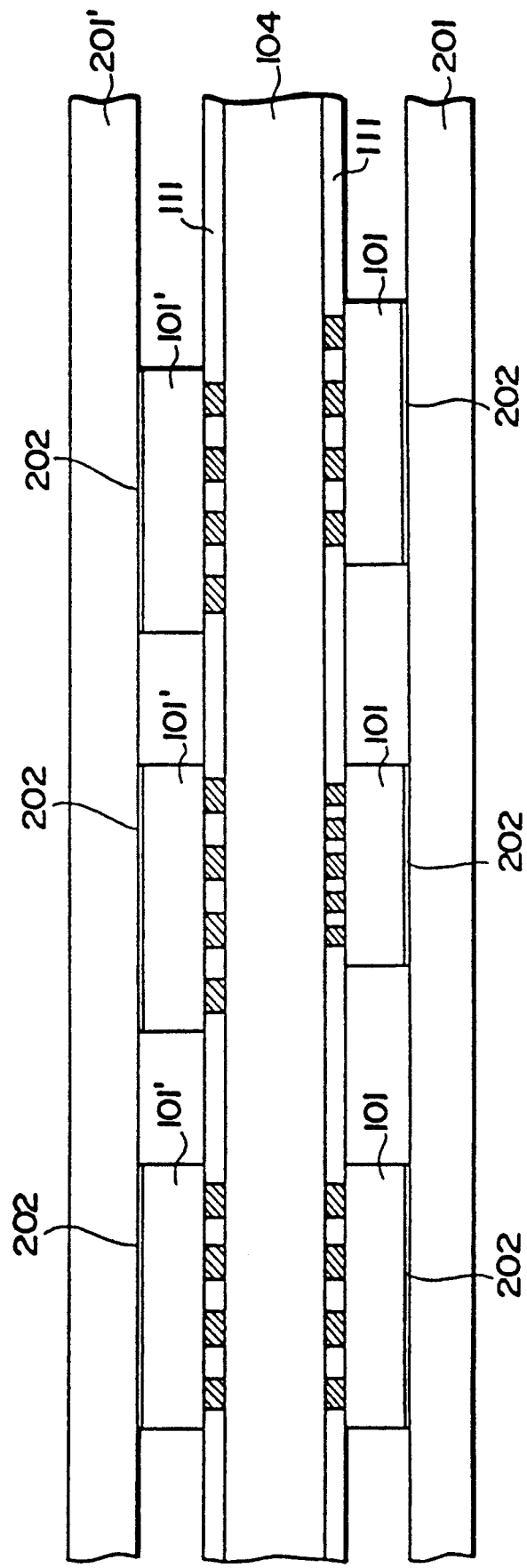

As shown in FIGS. 28(a) and 28(b), the semiconductor devices 101 and 101' serving as the electric circuit components are connected to both two sides of the circuit substrate 104 with electrically connecting members 125.

According to this embodiment, by classifying the semiconductor devices serving as the electric circuit components to be connected or held by the circuit substrate serving as the electric circuit holding member on which the circuit is formed, electric circuits can be classified into each unit so that dense mounting of different types of circuits can be performed in the same manufacturing process.

Also in this embodiment, the conjunction portions exhibit excellent reliability.

Twelfth embodiment

Figure 29A:
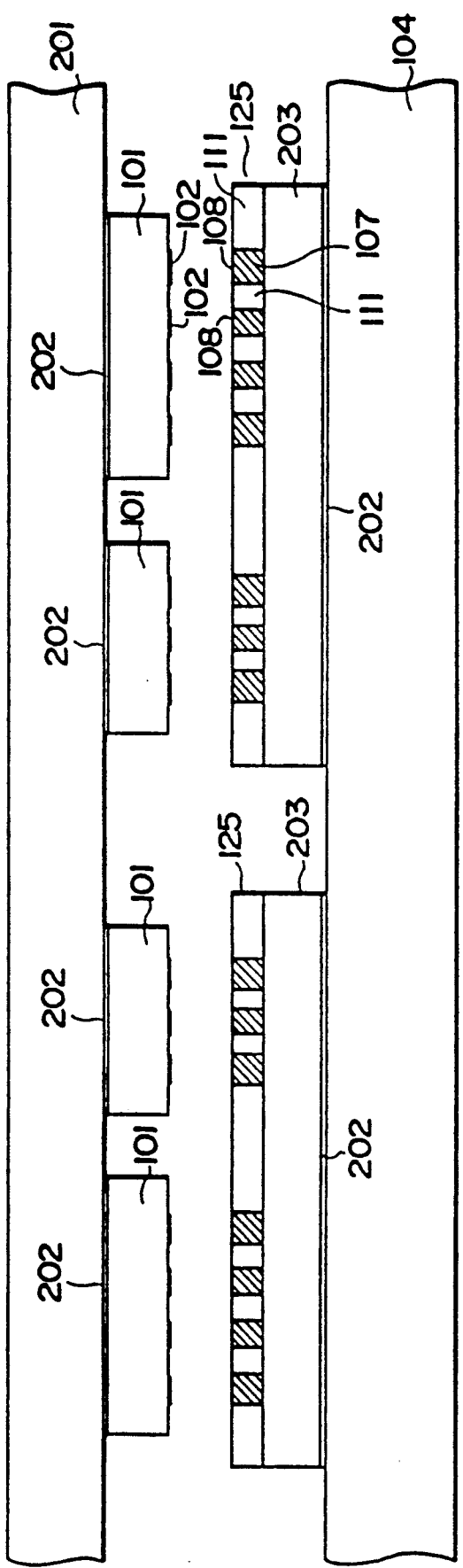
FIGS. 29A and 29B are cross-sectional views which illustrate the states before and after the connection according to a twelfth embodiment.
Figure 29B:
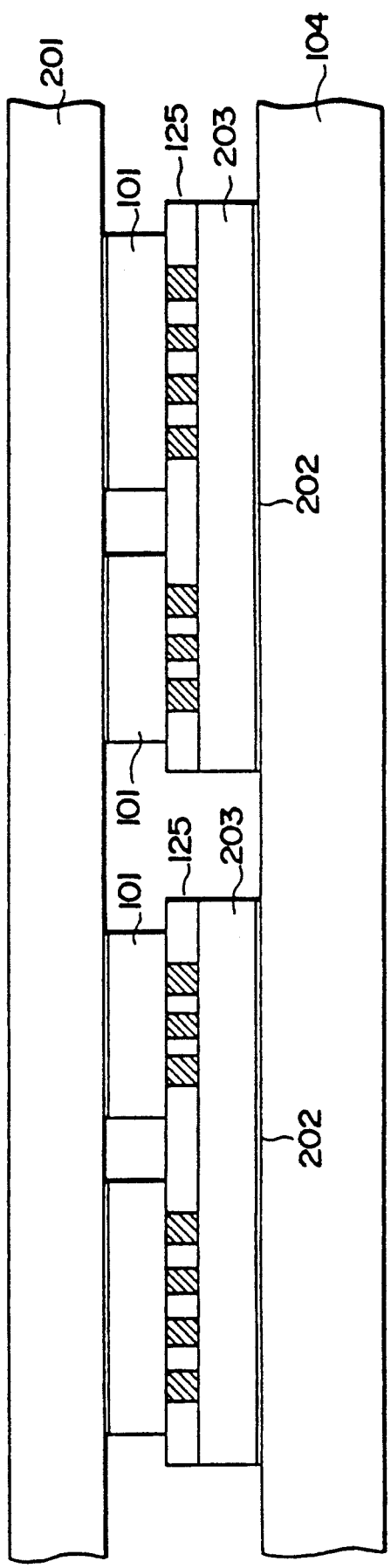

FIGS. 29(a) and 29(b) are views which illustrate a twelfth embodiment.

The conjunction portions of the semiconductor device 203 which is individually provided from the semiconductor devices 101 to be held by the circuit substrate 201 and the conjunction portions of the electrically connecting member 125 are positioned to be connected to each other by metallizing and/or alloying. Then, the semiconductor devices 203 are connected to the circuit substrate 104 by metallizing and/or alloying. Next, the semiconductor devices 101 are positioned to make the conjunction portions 102 of the semiconductor devices 101 and the conjunction portions 108 of the electrically connecting member 125 correspond to each other so as to be connected to the circuit substrate 201 by metallizing and/or alloying. Then, the circuit substrate 201 is turned to dispose the conjunction portions 102 of the semiconductor devices 101 to confront the conjunction portions 108 of the electrically connecting member 125 so that the circuit substrate 201 and the circuit substrate 104 are correctly positioned. Then, the conjunction portions 102 of the semiconductor devices 101 and the conjunction portions 108 of the electrically connecting member 125 are connected to each other by metallizing and/or alloying.

According to this embodiment, the other semiconductor devices can be readily connected to the semiconductor device. As a result, even semiconductor devices of a type which cannot be arranged to be a monolithic type can be connected simply with a shortest length required for connection. The conjunction portions also exhibit excellent reliability.

Thirteenth embodiment

According to this embodiment, the components are electrically connected similarly to the ninth embodiment except for the difference in that the electrically connecting member according to the seventh embodiment is used.

Also according to this embodiment, the conjunction portions exhibit excellent reliability.

Fourteenth embodiment

Figure 30A:
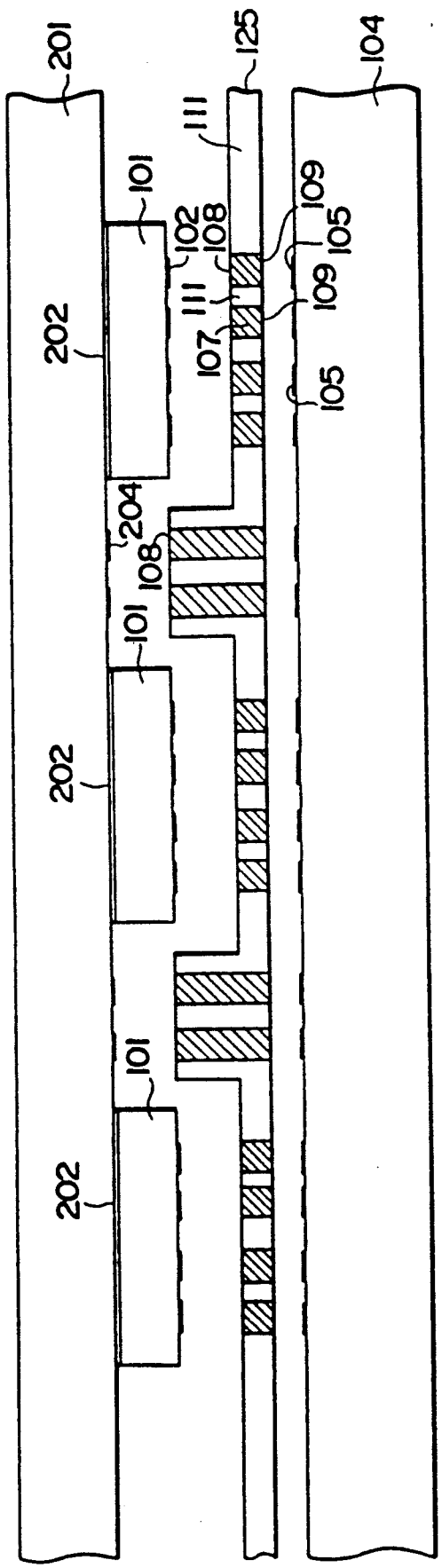
FIGS. 30A and 30B are cross-sectional views which illustrate the states before and after the connection according to a fourteenth embodiment.
Figure 30B:
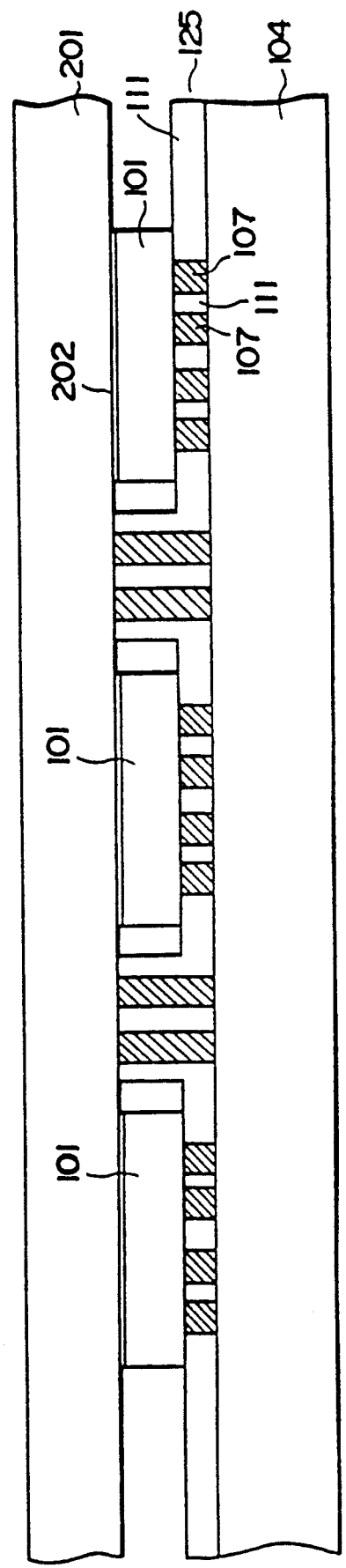

A fourteenth embodiment is shown in FIGS. 30(a) and 30(b).

According to this embodiment, the electrically connecting member 125 has an uneven surface in order to establish a connection between the circuit substrate 201 and not to prevent contact with the semiconductor device 101. When this electrically connecting member 125 is manufactured, the polyamide resin 111 in the portion in which the recessed portion is formed is subjected to etching, and then, the projecting metal wire portion is subjected to etching.

The unevenness may be formed by layering an electrically conductive member, from which the portion corresponding to the recessed portion is cut off, on one sheet of the electrically conductive member. Other chemical or mechanical methods may be employed.

The other factors according to this embodiment are the same as those for the ninth embodiment.

Figure 31:
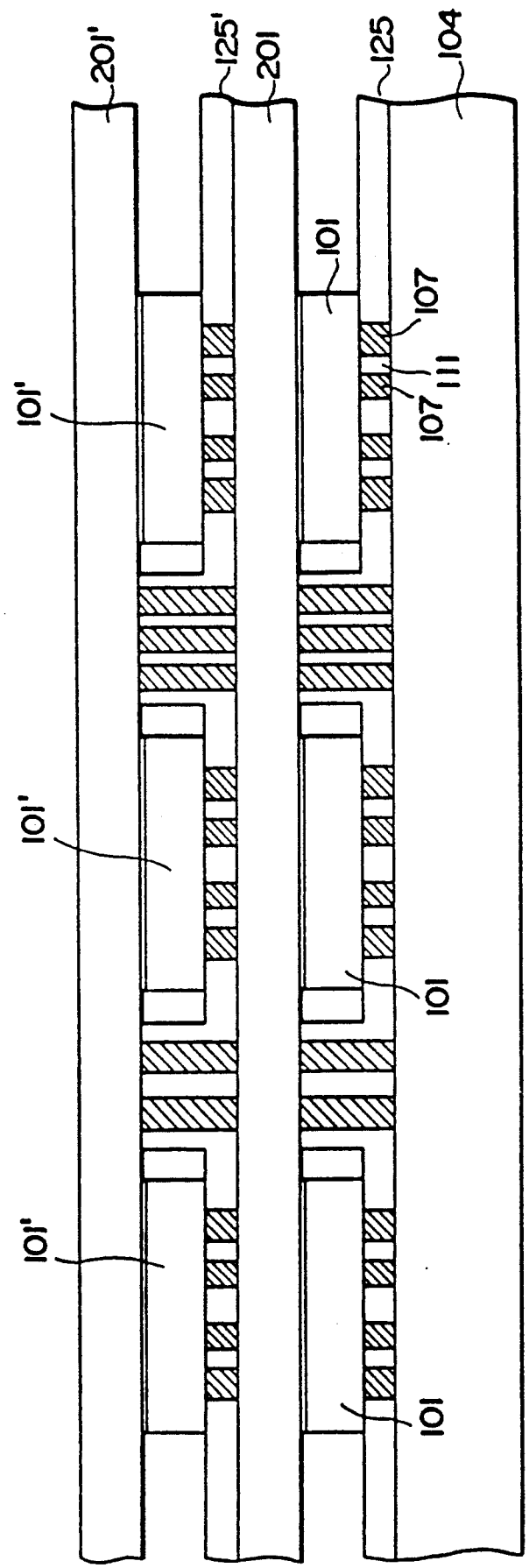
FIG. 31 is a cross-sectional view which illustrates an example in which two layered connection is realized according to the fourteenth embodiment.
Figure 32:
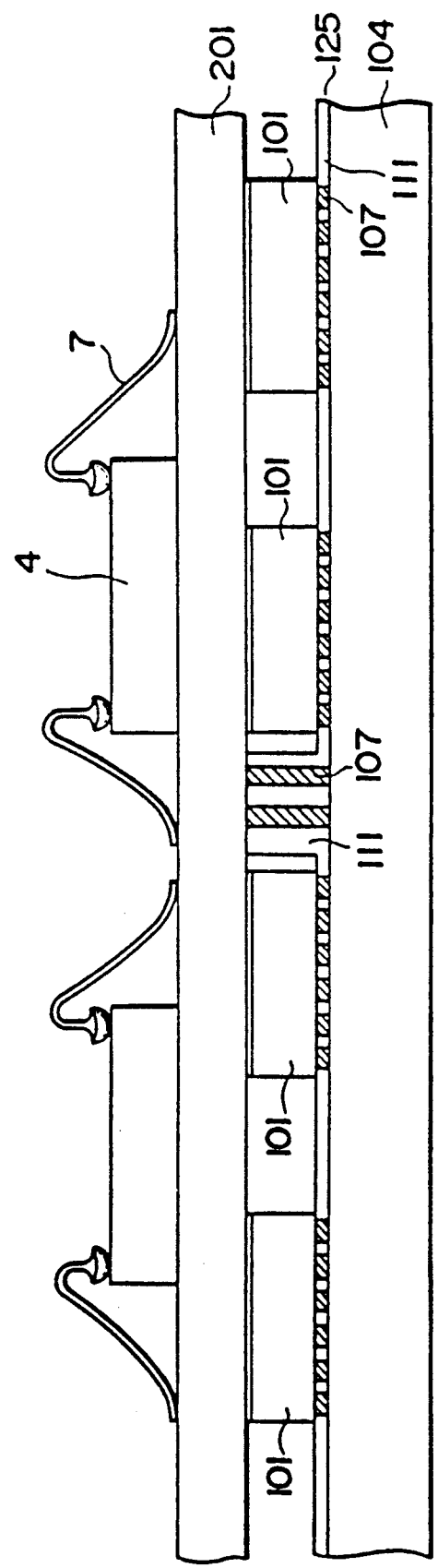
FIG. 32 is a cross-sectional view which illustrates an example in conventional connection technology is used together according to the fourteenth embodiment.

According to this embodiment, if the circuit substrate 201 serving as the electric circuit component holding member on which the circuit is formed comprises, as shown in FIG. 31, a double-sided or a multilayered double-sided substrate, the semiconductor device 101' and the circuit substrate 201' can be connected to each other with the electrically connecting member 125' by a similar method.

The number of layers may be determined to be one or a plurality of layers.

In addition, a structure may be employed which is designed such that a semiconductor device 4 is formed by the conventional method on the circuit substrate 201 and the connection is established by an Au-wire 7.

The available conventional method is exemplified by a flip chip method, a TAB method, and soldering.

According to this embodiment, 3-D dense mounting can be performed, and the conjunction portions exhibit excellent reliability.

Fifteenth embodiment

According to this embodiment, the electrical connection between the subject members is established similarly to the ninth embodiment except for the difference in that the electrically connecting member described in the eighth embodiment.

Also according to this embodiment, the conjunction portions exhibit excellent reliability.

Sixteenth embodiment

A sixteenth embodiment will be described with reference to FIGS. 33(a) to 33(d) and 34(a) to 34(c).

Referring to FIG. 33(a) which is a cross-sectional view, a state in which no connection is established between the electric circuit component holding member 201 holding a plurality of the semiconductor devices 101 serving as the electric circuit components and the electrically connecting member 125. The number of the semiconductor devices 101 is not limited to one.

The metal members 107 made of an electrically conductive material are embedded in the holding body 111 made of an organic material. End portions 108 of the metal members 107 appear outside on one side of the holding body 111. Other end portions 109 of the metal members 107 appear outside on the other side of the holding body 111.

Reference numeral 101 represent semiconductor devices, 102 represents conjunction portions of the semiconductor devices, 201 represents a glass substrate serving as the electric circuit holding member. The glass substrate 201 holds a side of the semiconductor devices 101 having no conjunction portions 102.

FIG. 33(b) a view which illustrates a state where the semiconductor devices 101 are connected to end portions 108 of the metal members 107 which appear on one side of the holding body 111 by metallizing and/or alloying.

Referring to FIG. 33(c), reference numeral 104 represents a circuit substrate serving as the other electric circuit component and having conjunction portions 105 therein. The circuit substrate 104 is connected to the other end portions 109 of the metal member 107 which appear on the other sides of the holding body 111 in the conjunction 105 by alloying.

FIG. 33(d) is a view which illustrates a state in which the whole body is integrated by means of the above-described connection.

This embodiment will be in detail described.

As shown in FIG. 33(a), the semiconductor devices 101 are positioned against the glass substrate 201 to establish the designed positional relationship between the conjunction portions 102 of the semiconductor devices 101 and the conjunction portions 105 of the circuit substrate 104 to be held by this glass substrate 201. Then, as shown in FIG. 33(b), the conjunction portions 108 of the electrically connecting member 125 and the conjunction portions of the semiconductor devices 101 are positioned to be connected to each other by metallizing and/or alloying. As shown in FIG. 33(c), the glass substrate 201 is turned to make the conjunction portions 102 of the semiconductor devices 101 confront the conjunction portions 105 of the circuit substrate 104. Finally, as shown in FIG. 33(c), the glass substrate 201 and the circuit substrate 104 are positioned, and then the conjunction portions 109 of the electrically connecting member 125 and the conjunction portions 105 of the circuit substrate 104 are connected to each other by pressurization.

When the thus-applied pressure is released, the conjunction portions 109 of the electrically connecting member 125 and the conjunction portions 105 of the circuit substrate 104 are again brought to the pre-connection state. If a pressure is again applied after positioning, the connection can be established. Therefore, if a failure occurs in the semiconductor devices 101 or the circuit substrate 104, the defective part is replaced by a new one while the pressure is released, and the connection is again established by a pressure applied after the positioning has been performed so that a well-conditioned electric circuit apparatus can be obtained.

According to this embodiment, the conjunction portions 102 of the semiconductor devices 101 and the conjunction portions 108 of the electrically connecting member 125 are connected to each other by metallizing and/or alloying. However, it is apparent that a similar effect can be obtained from a structure arranged such that the conjunction portions 105 of the circuit substrate 104 and the conjunction portions 109 of the electrically connection member 125 are connected to each other by metallizing and/or alloying, and the connection between the conjunction portions 102 of the semiconductor devices 101 and the conjunction portions 108 of the electrically connecting member 125 is established by applying a pressure.

Seventeenth embodiment

FIGS. 34(a) and 34(b) are views which illustrate a seventeenth embodiment. According to this embodiment, the portions other than the conjunction portions on one side in which the metal members 107 of the electrically connecting member 125 appear are applied with an adhesive.

After positioning the semiconductor devices 101 to the circuit substrate 201 serving as the electric circuit component holding member such that the designed positional relationship between the conjunction portions 102 of the semiconductor devices 101 and the conjunction portions 105 of the circuit substrate 104 is established, they are connected to each other, and/or the semiconductor devices 101 are stacked against each other after the positioning has been performed such that the side applied with the adhesive 202 and the side on which the conjunction portions 102 of the semiconductor devices 101 are present confront each other.

The other portions are the same as those of the sixteenth embodiment.

According to this embodiment, any defective component can be readily replaced similarly to the sixteenth embodiment.

Eighteenth embodiment

FIGS. 35(a) to 35(c) and FIGS. 36(a) and 36(b) are views which illustrate an eighteenth embodiment. According to this embodiment, an electrically connecting member is employed which is designed such that the metal members which appear on one side of the electrically connecting member 125 and the metal members which appear on the other side are made of material which have different melting points.

An example of manufacturing this electrically connecting member will be described.

An electrically connecting member 125 shown in FIGS. 6(b) and 6(c) is prepared by the method according to the first embodiment. Resists 203 are, as shown in FIG. 35(a), formed by a photo-litho method in the portions in which no metal members 107 appears in one side of this electrically connecting member 125. Then, a diffused barrier layer 204 (see FIG. 35(b)), and the resists 203 are removed by a lift-on method (see FIG. 35(c)). Then, the barrier layer 204 and a Pb-Ag-Sn (36.1-1.4-62.5 wt %) layer 206 (omitted from the illustration in FIGS. 35(a) to 35(c) are formed on the other side of the electrically connecting member. The thus-manufactured electrically connecting member 125 is arranged, at the two ends of the metal members 107 thereof, such that the au-Sn (20%) layer displays a melting point of 280° C. while the Pb-Ag-Sn (36.1-1.4-62.5 wt %) layer displays a melting point of 180° C., in which the difference in the melting point becomes substantially 100° C.

The above-described electrically connecting member 125 is, as shown in FIG. 36(a), heated up to 300° C. or higher and compressed after positioning the glass substrate 201 holding the semiconductor devices 101, the electrically connecting member 125 and the circuit substrate 104. As a result, a connection between the conjunction portions 102 of the semiconductor devices 101, and the conjunction portions 108 of the electrically connecting member 125 and a connection between the conjunction portions 105 of the circuit substrate 104 and the conjunction portions 109 of the electrically connecting member 125 are established by simultaneously metallizing and/or alloying.

In the thus-manufactured electric circuit apparatus, when the same is heated at a temperature higher than the lower melting point but lower than the higher melting point, one of the conjunction portions is melted, causing one of the components to be removed. On the other hand, when heating the same at a temperature higher than the lower melting point but lower than the higher melting point after simultaneous positioning, the components can be again connected to each other.

According to this embodiment, since the composition ratio can be changed due to the thermal diffusion of metal atoms whenever heating is conducted, the number of attachments and detachments is of course limited. However, since the two conjunction portions can be connected to each other by metallizing and/or alloying, the resistance at the conjunction portions can be significantly reduced. As a result, a stable connection can be always obtained.

According to this embodiment, although the Au-Su layer 205 is formed on the end portions 108 of the metal member 107 while the Pb-Ag-Sn layer 206 is formed on the other end portions 109, it can be conducted in a reversed manner. In addition, an alloy layer other than that described above can be employed as the layers 205 and 206 if proper melting points and a proper difference in temperatures can be obtained.

Nineteenth embodiment

An electrical connecting between components is established similarly to the sixteenth embodiment except for the difference in that the electrically connecting member according to the seventh embodiment is employed.

According to this embodiment, defective components can be readily replaced and the conjunction portions exhibited excellent reliability. In addition, excellent characteristics are displayed.

Twentieth embodiment

According to this embodiment, an electrical connection between components is established similarly to the sixteenth embodiment except for the difference in that the electrically connecting member according to the eighth embodiment is employed.

Also according to this embodiment, defective components can be readily replaced and the conjunction portions exhibit excellent reliability.

Twenty-first embodiment

According to this embodiment, an electrical connecting between components is established similarly to the sixteenth embodiment except for the difference that a circuit substrate on which a circuit is formed on the surface thereof is employed alternately to the glass substrate as the electric circuit component holding member.

Now, description will be made with reference back to FIGS. 33(a) to 33(d). As shown in FIG. 33(a), the semiconductor devices 101 are positioned to the circuit substrate 201 such that the designed positional relationship between the conjunction portions 102 of the semiconductor devices 101 confront the conjunction portions 105 of the circuit substrate 104 is established to be connected to the circuit substrate 201 and/or to be held by the same. Then, as shown in FIG. 33(b), after positioning the conjunction portions 108 of the electrically connecting member 125 and the conjunction portions of the semiconductor devices 101, they are connected to each other by metallizing and/or alloying. Then, the circuit substrate 201 is turned to make the conjunction portions 102 of the semiconductor devices 101 confront the conjunction portions 105 of the circuit substrate 104. Then, the above-described components are arranged as shown in FIG. 33(c). Finally, the circuit substrate 201 and the circuit substrate 104 are positioned as shown in FIG. 33(d), and then the conjunction portions 109 of the electrically connecting member 125 and the conjunction portions 105 of the circuit substrate 104 are connected to each other by a pressure applied after the positioning.

When the thus-applied pressure is released, the conjunction portions 105 of the electrically connecting member 125 and the conjunction portions 109 of the circuit substrate 104 are, as shown in FIG. 33(c), brought to the state before establishment of the connection. When a pressure is again applied to the same after the positioning, the connection is again established. Therefore, if a failure is occurs in the semiconductor devices 101 or the circuit substrate 104, the defective part can be replaced by a new one by releasing the pressure. Then the connection is again established by applying a pressure so that a well-conditioned electric circuit apparatus can be obtained.

Although the conjunction portions 102 of the semiconductor devices 101 and the conjunction portions 108 of the electrically connecting member 125 are connected to each other by metallizing and/or alloying, it is apparent that a similar effect can be obtained from a structure arranged such that the conjunction portions 105 of the circuit substrate 104, and the conjunction portions 109 of the electrically connecting member 125 are connected to each other by metallizing and/or alloying and the conjunction portions 102 of the semiconductor devices 101 and the conjunction portions 108 of the electrically connecting member 125 are connected by applying a pressure.

Twenty-second embodiment

According to this embodiment, an electrical connection between components is established similarly to the seventeenth embodiment except for the difference in that a circuit substrate on which a circuit is formed on its surface is employed as an alternative to the glass substrate as the electric circuit component holding member. Also according to this embodiment, defective components can be readily replaced.

In the thus-manufactured electric circuit apparatus, when the same is heated at a temperature higher than the lower melting point but lower than the higher melting point, one of the conjunction portions is melted, causing one of the components to be removed. On the other hand, when heating the same at a temperature higher than the lower melting point but lower than the higher melting point after the simultaneous positioning, the components can be again connected to each other.

According to this embodiment, since the composition ratio can be changed due to the thermal diffusion of metal atoms whenever heating is conducted, the number of attachments and detachments is of course limited. However, since the two conjunction portions can be connected to each other by metallizing and/or alloying, the resistance at the conjunction portions can be significantly reduced. As a result, a stable connection can be always obtained.

Twenty-fourth embodiment

According to this embodiment, an electrical connection between components is established similarly to the twenty-first embodiment except for the difference that the electrically connecting member according to the seventh embodiment is employed.

Also according to this embodiment, defective components can be readily replaced and the conjunction portions exhibit excellent reliability. In addition, excellent reliability can be obtained in the various characteristics thereof.

Twenty fifth embodiment

According to this embodiment, an electrical connection between components is established similarly to the twenty-first embodiment except for the difference that the electrically connecting member according to the eighth embodiment is employed.

Also according to this embodiment, defective components can be readily replaced and the conjunction portions exhibit excellent reliability.

Twenty-sixth embodiment

Figure 37:
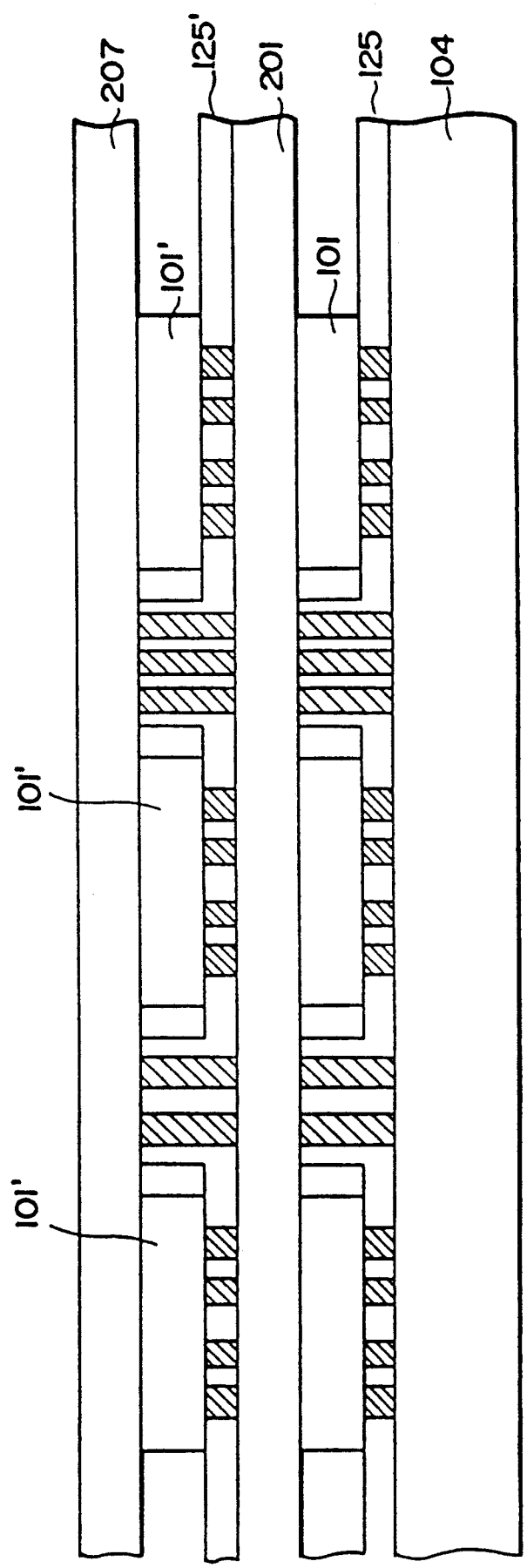
FIG. 37 is a cross-sectional view which illustrates the state after the connection according to a twenty-sixth embodiment.

FIG. 37 is a view which illustrates a twenty sixth embodiment.

According to this embodiment, the electrically connecting member 125 is formed to have steps, in which the conjunction portions of the corresponding circuit substrates 201 and 104 are connected to each other by the electrically conductive member 107 embedded in the holding body 111, and the semiconductor devices 101 connected to and/or held by the circuit substrate 207 serving as the electrically connecting member and the holding member are connected to the circuit substrate 201 so that a multilayered structure is formed.

The other portions are the same as those of the twenty-first embodiment.

Also according to this embodiment, defective components can be readily replaced and the conjunction portions exhibit excellent reliability.

Twenty-seventh embodiment

A twenty-seventh embodiment will be described with reference to FIGS. 38(a) to 38(d).

A cross-sectional view, FIG. 38(a), illustrates a state before the plurality of the semiconductor devices 101 serving as the electric circuit components are connected to and/or held by the electric circuit component holding member 201. Reference numeral 204 represents a positioning jig having a positioning pin 205'. The number of semiconductor devices 101 may be optionally determined.

FIG. 38(b) is a view which illustrates a state after the semiconductor devices 101 have been connected to and/or held by the electric circuit component holding member 201. FIG. 38(c) is a view which illustrates a state where the semiconductor devices 101 connected to and/or held by the electric circuit component holding member 201 and the circuit substrate 104 serving as the other electric circuit component confront each other with the electrically connecting member 125 therebetween.

In the electrically connecting member 125, the metal members 107 serving as the electrically conductive members are embedded in the holding body 111 made of an organic material, end portions 108 of the metal members 107 appear on the other side of the holding body 111, and the other end portions 109 of the metal members 107 appear on the other side of the holding body 111, which includes positioning holes 203.

The electric circuit component holding member 201 comprises a glass plate and holds, by an adhesion force, at least one side of each of the semiconductor devices 101 that does not have any conjunction portions 102 thereon and includes positioning holes 202 formed therein.

The semiconductor devices include conjunction portions 102 which are connected to one end portions 108 of the metal members 107, which appear on one side of the holding body 111, by alloying.

The circuit substrate 104 includes conjunction portions 105 which are connected to the other end portions 109 of the metal members 107 which appear on the other side of the holding body 11, by allowing, and includes positioning pins 205 formed therein.

FIG. 38(d) is a cross-sectional view which illustrates a state in which the above-described components are integrated by the connection.

The positioning holes 202 and 203 and the positioning pins 205 are the mechanical portions or the functioning portions which serve as a reference for the positional relationship.

This embodiment will be further described in detail.

As shown in FIG. 38(a), after the positioning pins 205' of the positioning jig 204 have been inserted into the positioning holes 202 formed in the glass substrate 201, the semiconductor devices 101 are, by using the positioning pins 205' as the references, positioned to establish a designed positional relationship between the conjunction portions 102 of the semiconductor devices 101 and the conjunction portions 105 of the circuit substrate 104 to be held by the glass substrate 201 by an adhesive.

Then, as shown in FIG. 38(a), after the positioning pins 205 provided in the positioning jig 204 have been inserted into the positioning holes 202 formed in the glass substrate 201, the semiconductor devices 101 are positioned to establish a designed positional relationship between the conjunction portions 102 and the conjunction portions of the circuit substrate 104 to be held with an adhesive (see FIG. 38(a) and 38(b)).

The thus-manufactured electric circuit component holding member 201 is removed from the holding position determining jig 204, and then the electrically connecting member 125 and the circuit substrate 104 are prepared.

Each of the semiconductor devices 101 and the circuit substrate 104 according to this embodiment includes a plurality conjunction portions 102 and 104.

The conjunction portions 102 of the semiconductor devices 101 are arranged such that the metal appears at the positions which correspond to the conjunction portions 105 of the circuit substrate 104 and the conjunction portions 108 and 109 of the electrically connecting member 125.

As shown in FIG. 38(c), the positioning pins 205 provided in the circuit substrate 104 are inserted into the positioning holes 203 formed in the electrically connecting member 125, and then these positioning pins 205 are inserted into the positioning holes 202 formed in the electric circuit component holding member 201 so that the positioning is completed. Then, as shown in FIG. 38(d), a connection between Al of the conjunction portions 102 of the semiconductor devices 101 and Au of the conjunction portions 108 of the electrically connecting member 125 and a connection between Au of the conjunction portions of the circuit substrate 104 and Au of the conjunction portions of the electrically connecting member 125 are established by metallizing and/or allying.

Any of the following three methods can be employed to connect the semiconductor devices 101, the electrically connecting member 125, and the circuit substrate 104 by metallizing and/or alloying.

(1) A method in which, after the glass substrate 201, the electrically connecting member 125 and the circuit substrate 104 have been positioned, a connection between the conjunction portions 102 of the semiconductor devices 101 and the conjunction portions 108 of the electrically connecting member 125 and a connection between the conjunction portions 105 of the circuit substrate 104 and the conjunction portions 109 of the electrically connecting member 125 are established by metallizing and/or alloying.

Figure 39C:
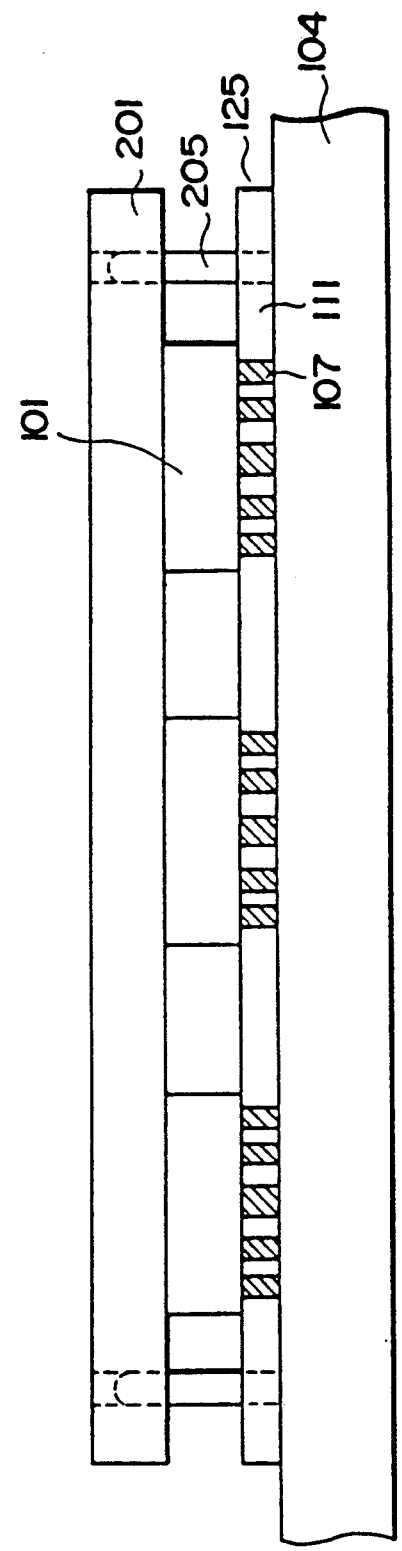
FIGS. 39A to are cross-sectional views which illustrate an embodiment of the method of metallizing and-/or alloying according to the twenty-seventh embodiment shown in (2)

(2) A method in which the glass substrate 201 and the electrically connecting member 125 are positioned, and then the conjunction portions 102 of the semiconductor devices 101 and the conjunction portions 108 of the electrically connecting member are connected to each other by alloying. Then, the circuit substrate 104 is positioned to establish a connection between the conjunction portions 109 of the electrically connecting member 125 and the conjunction portions 105 of the circuit substrate 104 by metallizing and/or alloying (see FIG. 39(a) to 39(c).

Figure 40A:
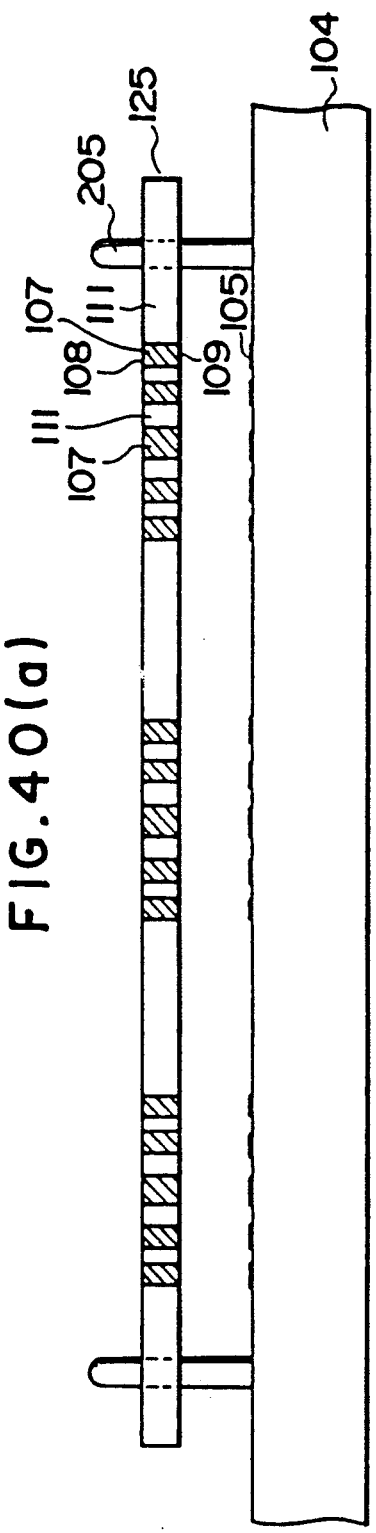
Figure 40B:
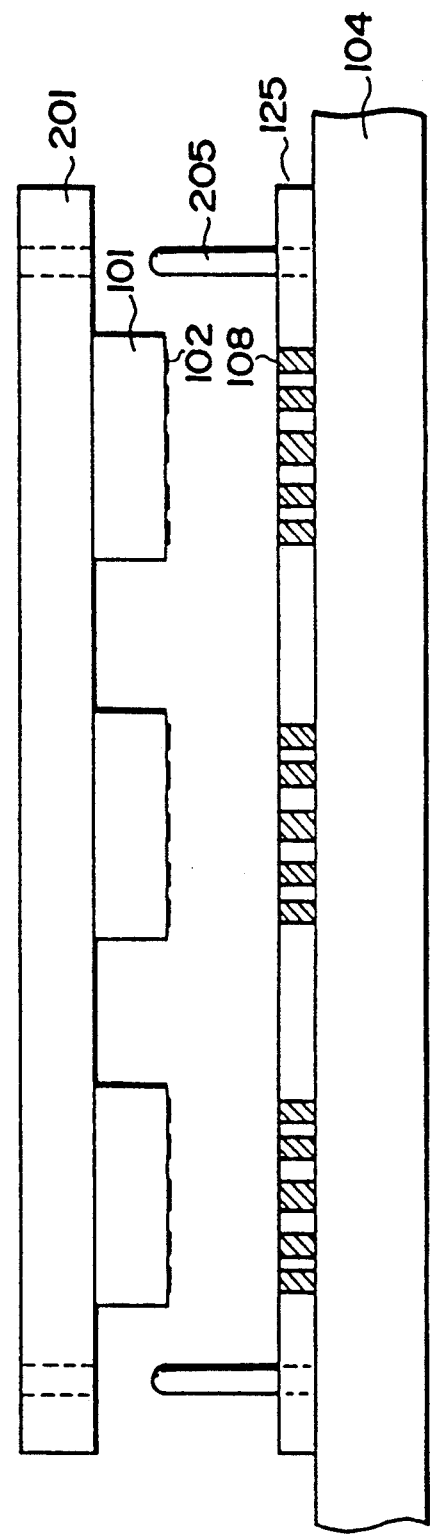

(3) A method in which the circuit substrate 104 and the electrically connecting member 125 are positioned, and the conjunction portions 105 of the circuit substrate 104 and the conjunction portions 109 of the electrically connecting member 125 are connected to each other by metallizing and/or alloying. And then, the glass substrate 201 is positioned and the conjunction portion of 108 of the electrically connecting member 125 and the conjunction portions 102 of the semiconductor devices are connected to each other by metallizing and/or alloying (see FIGS. 40(a) to 40(c).

According to this embodiment, although the position pins 205 are provided for the circuit substrate 104, it is apparent that a similar effect can be obtained even if the same is provided for the glass substrate 201 which serves as the electric circuit holding member. In addition, a structure may be employed which is arranged such that positioning holes are formed in both the glass substrate 201 serving as the electric circuit holding member and the circuit substrate 104 positioning pins are provided for both. In addition, a similar effect can be obtained from a structure arranged such that the positioning holes are formed in both the glass substrate and the circuit substrate but the positioning pins are not provided for the same. Alternately, the positioning pins are provided for the connecting position determining jig in the manner in which the pins are provided for the holding position determining jig used in FIGS. 38(a) and 38(b).

As an alternative to the positioning pins, positioning marks may be provided for the circuit substrate to perform the positioning required at the connection such that the positioning marks are present within the positioning holes formed in the electric circuit component holding member. In this case, a similar effect can be obtained if the electric circuit component holding member is made of a light transmissible material by arranging the structure such that light can pass through only the positioning holes as an alternative to forming the holes.

When the connection of the conjunction portions of the thus-manufactured electric circuit apparatus are examined, excellent reliability is exhibited.

Twenty-eighth embodiment

FIGS. 41(a) to 41(d) are views which illustrate a twenty-eighth embodiment.

Figure 41A:
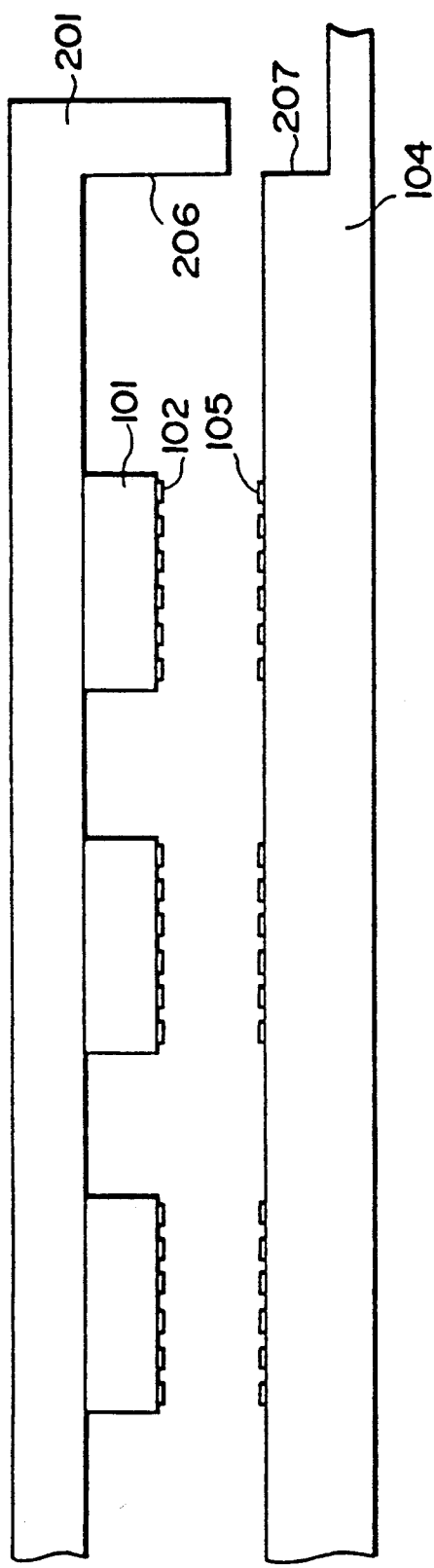
FIGS. 41A and 41B are cross-sectional views which illustrate the twenty-eighth embodiment.
Figure 41B:
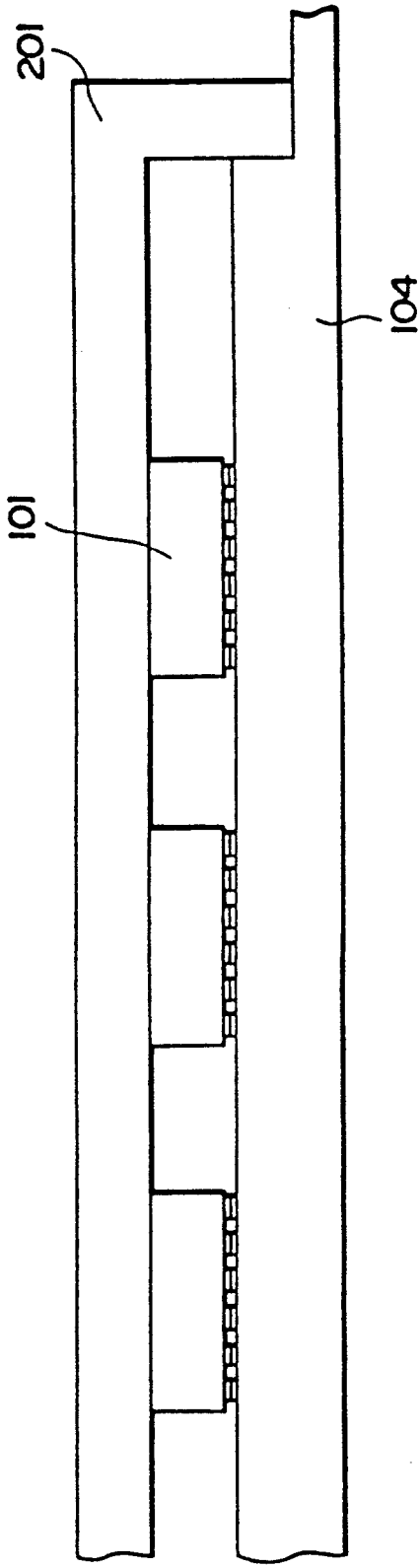

Referring to the cross-sectional view FIG. 41(a), reference numeral 206 represents a reference plane of the circuit component holding member, 207 represents a reference plane of the circuit substrate 104. These reference planes 206 and 207 are the mechanism portion or the functioning portion which serves as the reference for clarifying the positional relationship.

The semiconductor devices 101 are positioned to the reference plane 206 of the electric circuit component holding member 201 such that the designed positional relationship between the conjunction portions 102 of the semiconductor devices 101, and the conjunction portions 105 of the circuit substrate 104 is established to be held by the electric circuit component holding member 201. Then, the electric circuit component holding member 201 is turned to make the conjunction portions 201 of the semiconductor devices 101 and the conjunction portions 105 of the circuit substrate 104 confront each other, and the reference plane 206 of the electric circuit component holding member 201 is abutted against the reference plane 207 of the circuit substrate 104 to be positioned. Then the conjunction portions 102 of the semiconductor devices 101 and the conjunction portions 105 of the circuit substrate 104 are connected to each other by metallizing and/or alloying.

According to this embodiment, although the reference plane 206 of the electric circuit component holding member 201 is arranged in the form of a projection shape, a similar effect can be obtained from a structure arranged such that the projecting reference plane is, on the contrary, provided on the circuit substrate 104. If two or more reference planes are provided, the positioning can be completed simply by a single abutting. Alternately, as shown in FIG. 42(a), a reference plane abutting portion 208 is provided for the holding position determining jig 204 to position and hold the semiconductor devices 101 by abutting the electric circuit component holding member 201. Then, both the circuit substrate and the electric circuit component holding member are abutted against a reference plane abutting portion 210 provided for the connection position determining jig 209 to perform the positioning and establish the connection.

Twenty-ninth embodiment

According to this embodiment, an electrical connection between components is established similarly to the twenty-seventh embodiment except for the difference that the electrically connecting member according to the seventh embodiment is employed.

Also according to this embodiment, the conjunction portions exhibit excellent reliability.

Thirtieth embodiment

According to this embodiment, an electrical connection between components is established similarly to the twenty-seventh embodiment except for the difference that the electrically connecting member according to the eighth embodiment is employed.

Also according to this embodiment, the conjunction portions exhibit excellent reliability.

Thirty-first embodiment

A thirty-first embodiment according to the present invention will be described with reference to FIGS. 43(a) to 43(c).

FIG. 43(a) is a cross-sectional view which illustrates a state in which the plurality of the semiconductor devices 101 serving as the electric circuit components are held by the electric circuit component holding member 201. The semiconductor devices 101 include the conjunction portions 102. Any number of the semiconductor devices 101 can be used. A projection portions 201' is provided on the peripheral portion of the electric circuit component holding member 201 so that the overall contour is formed in a cap-like shape.

FIG. 43(b) is a view which illustrates a state where the semiconductor devices 101 held by the electric circuit component holding member 201 and the circuit substrate 104 serving as the other electric circuit component confront each other with the electrically connecting member 125 therebetween.

In the electrically connecting member 125, the metal members 107 serving as the electrically conductive members are embedded in the holding body 111 made of an organic material, and end portions 108 of the metal members 107 appear on one side of the holding body 111 while end portions 109 of the metal members 107 appear on the other side of the holding body 111.

The electric circuit component holding member 201 is made of ceramics, and it holds, with an adhesion force, at least one side of each of the semiconductor devices 101 not having any conjunction portions 102 thereon. The electric circuit component holding member 201 also functions as a cap.

The semiconductor devices 101 including the conjunction portions 102 at which the semiconductor devices 101 are connected to the end portions 108 of the metal members 107 which appear on one side of the holding body 111 by alloying.

The circuit substrate 104 includes the conjunction portions 105 which are connected to the other end portions 109 of the metal members 107 which appear on the other side of the holding body 111 by alloying. Epoxy resin 202 is applied to the circuit substrate 104 in the portion which confronts the sealing projection portion 201' of the electric circuit component holding member 201.

Figure 43C:
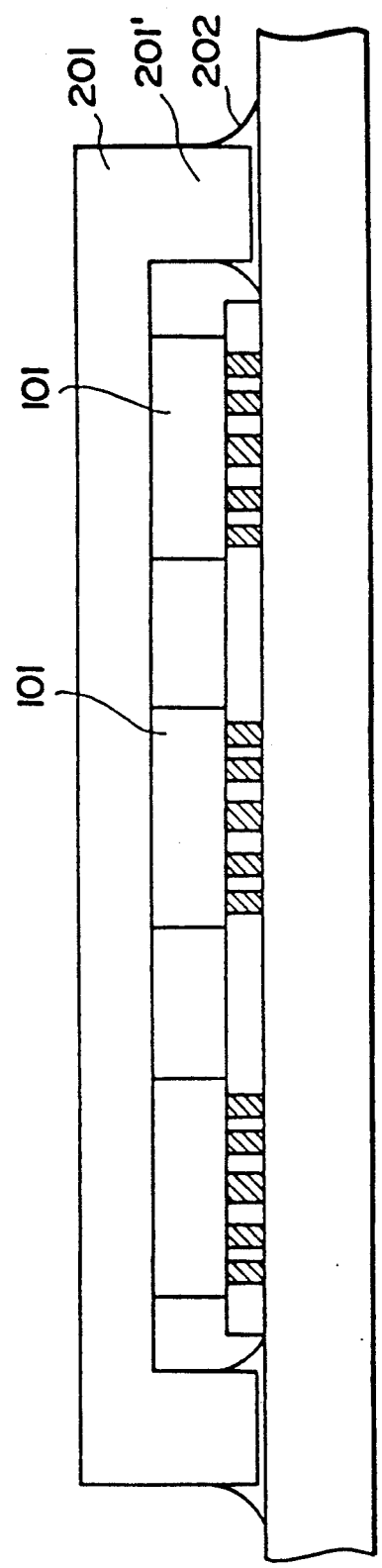

FIG. 43(c) is a cross-sectional view which illustrates a state in which the overall body is integrated by the above-described connection, and the semiconductor devices 101 are simultaneously sealed by the electric circuit component member 201.

Now, this embodiment will be further described.

As shown in FIG. 43(a), the semiconductor devices 101 are positioned against the electric circuit component holding member 201 to realize the designed positional relationship between the conjunction portions 102 of the semiconductor devices 101 and the conjunction portions 105 of the circuit substrate 104 and to be held by the electric circuit component holding member 201, the electric circuit component holding member 201 is turned to make the conjunction portions 102 of the semiconductor devices 101 confront the conjunction portions 105 of the circuit substrate 104, and the electrically connecting member 125 is inserted therebetween (see FIG. 43(b)).

Then, positioning is performed such that the conjunction portions 102 of the semiconductors 101 held by the electric circuit component holding member 201 and end portions 108 of the electrically conductive member 125 confront each other and the positions of the conjunction portions 105 of the circuit substrate 104 and the positions of the conjunction portions 109 of the electrically connecting member 125 correspond to each other. The circuit substrate 104 is applied with epoxy resin 202 in the portions thereof which confront the sealing projections 201' disposed on the peripheral portion of the electric circuit component holding member 201.

After this positioning, a connection between Al of the conjunction portions 102 of the semiconductor devices 101 and Au of the conjunction portions 108 of the electrically connecting member 125 and a connection between Au of the conjunction portions 105 of the circuit substrate 104 and Au of the conjunction portions 109 of the electrically connecting member 125 are established by metallizing and/or alloying (see FIG. 43(c)). At this time, the sealing projection 201' disposed on the periphery of the electric circuit component holding member 201 is simultaneously brought into contact with the epoxy resin 202 so that the portion between the sealing projection 201' and the circuit substrate 104 is perfectly enclosed by the epoxy resin by the pressure applied due to the connecting action. The thus-applied epoxy resin 202 is hardened, and the sealing is completed.

In this state, any of the following three methods can be employed to connect the semiconductor devices 101, the electrically connecting member 125 and the circuit substrate 104 by metallizing and/or alloying.

(1) method in which, after positioning the electric circuit component holding member 201, the electrically connecting member 125, and the circuit substrate 104, a connection between the conjunction portions 102 of the semiconductor devices 101 and the end portions 108 of the electrically connecting member 125 and a connection between the conjunction portions 105 of the circuit substrate 104 and the other end portions 109 of the electrically connecting member 125 are established simultaneously by metallizing and/or alloying.

(2) A method in which the electric circuit component holding member 201 and the electrically connecting member 125, and then the conjunction portions 102 of the semiconductor devices 101 and the end portions 108 of the electrically connecting member 125 are connected to each other by alloying. Then, the circuit substrate 104 is positioned so that the other end portions 109 of the electrically connecting member 125 and the conjunction portions 105 of the circuit substrate 104 are connected to each other by metallizing and/or alloying.

(3) A method in which the circuit substrate 104 and the electrically connecting member 125 are positioned, and the conjunction portions 105 of the circuit substrate 104 and the other end portions 109 of the electrically connecting member 125 are connected to each other by alloying. Then, the electric circuit component holding member 201 is positioned to connect the end portions 108 of the electrically connecting member 125 and the conjunction portions 102 of the semiconductor devices 101 by metallizing and/or alloying.

The thus-manufactured electric circuit apparatus exhibits reliable connections in the conjunction portions.

According to this embodiment, the sealing projections 201' at the peripheral portion of the electric circuit component holding member 201 vertically come in contact with the circuit substrate. An additional sealing effect can be obtained, and reliability can be improved by arranging the shape of the sealing projection 201' in an L-shape to increase the area of contact. As shown in FIGS. 44(a) and 44(b), similar sealing can be conducted even if the resin 202 is brought to a higher position by a frame 203 provided for the circuit substrate 104, and the shape of the electric circuit component holding member 201 is designed to be a flat shape.

Thirty-second embodiment

FIGS. 45(a) and 45(b) are views which illustrate a thirty-second embodiment.

FIG. 45(a) is a cross-sectional view which illustrates a state before the connection between the semiconductor devices 101 serving as the electric circuit component held by the electric circuit component holding member 201 and the circuit substrate 104 serving as the other electric circuit component is established. The shape of the electric circuit component holding member 201 is the same as that of the member according to the twenty-second embodiment. The semiconductor devices 101 include conjunction portions 102 and are held by the electric circuit component holding member 201 after positioning. The circuit substrate 104 includes conjunction portions 105 in which recessed portions 104', into which sealing projections 201' of the holding member 201 are fitted, are formed. The recessed portions 104' are arranged to be filled with the resin 202.

Then, after positioning the electric circuit component holding member 201 holding the semiconductor devices 101 and the circuit substrate 104, the conjunction portions 102 and 105 are connected to each other by metallizing and/or alloying, and the resin 202 is hardened to seal them (see FIGS. 45(b)).

According to this embodiment, since the recessed portion 104' is formed in the circuit substrate 104, the pressure due to establishing connection is applied only to the semiconductor devices 101. As a result, connection can be strongly performed, and since the water invasion route within the sealing portion comprising the recessed portions 201' and 104' toward the inside portion of the apparatus can be elongated, reliably is improved.

Thirty-third embodiment

According to this embodiment, an electrical connection between components is established similarly to the thirty-first embodiment except for the difference that the electrically connecting member according to the seventh embodiment is employed.

Also according to this embodiment, the conjunction portions exhibit excellent reliability, and excellent reliability in other various characteristics.

Thirty-fourth embodiment

According to this embodiment, an electrical connection between components is established similarly to the thirty-first embodiment except for the difference that the electrically connecting member according to the eighth embodiment is employed.

Also according to this embodiment, the conjunction portions exhibit excellent reliability.

Since the present invention is structured as described above, the following various advantages can be obtained:

(1) A reliable connection can be obtained in the connection of the electric circuit parts such as connection of the semiconductor devices and the circuit substrates and/or lead frames. Therefore, the conventional methods such as a wire bonding method, a TAB method, and a CCB method and the like can be replaced by the method according to the present invention.

(2) According to the present invention, the conjunction portions of the electric circuit parts can be disposed at any positions desired (particularly in the inner portion). Therefore, a further great number of contacts can be used for the connection with respect to the conventional wire bonding method or the TAB method. Therefore, a system suitable for multi-pin connection can be obtained. In addition, since an insulating material is previously present in the neighboring metals of the electrically conjunction members, electrical conduct between the neighboring metals can be prevented. Therefore, a further number of contacts can be employed with respect to the CCB method.

(3) Since the quantity of the metal used in the electrically connecting members can be reduced with respect to the conventional system, the overall cost can be reduced with respect to the conventional apparatus even if expensive metal such as gold is used as the metal member.

(4) Dense electric circuit apparatus such as semiconductors can be obtained.

(5) In the case where either of the electric circuit components is connected by a method other than the connection established by metallizing and/or alloying, any deterioration which can be caused from heat of the electric circuit components at the time of performing the metallizing and/or alloying can be prevented. When the electric circuit component is intended to be detachable, this intention can be realized by performing the connection of the electric circuit components by a method other than the connection by metallizing and/or alloying.

When of the electric circuit components are connected to each other by a conjunction layer formed by metallizing and/or alloying via an electrically connecting member, the electric circuit components can be strongly and assuredly connected to each other. As a result, a mechanically strong electric circuit apparatus exhibiting significantly reduced defection ratio can be obtained.

(6) When the holding body of the electrically connecting member is arranged such that the insulating body thereof is made of either power or fiber or a material obtained by dispersing both the powder and fiber comprising one or a plurality of metals or inorganic materials exhibiting excellent heat conductivity, or the insulating body is made of a metal or an inorganic material whose electrically conductive member can be insulated, heat from the electric circuit components can be discharged though the electrically connecting member or the other electric circuit components. Therefore, an electric circuit apparatus exhibiting excellent heat discharging performance can be obtained.

When the electric circuit component holding member is formed by one type of metal or an inorganic material exhibiting excellent heat conductivity, heat from the electric circuit components can be discharged through the electrically connecting member or the other electric circuit components. As a result, an electric circuit apparatus exhibiting excellent heat discharging performance can be obtained.

(7) Since the other electric circuit components are connected after the electric circuit component is held by the electric circuit component holding member, the shape of the holding member can be designed to correspond to the electric circuit component to be held. Therefore, the connection can be performed regardless of the size, shape, and the type of the electric circuit component. Therefore, free and dense mounting can be achieved, causing a free design to be performed.

(8) By classifying the electric circuit components to be held on the basis of their functions, they can be classified into function blocks for the holding members. As a result, a variety of electric circuit apparatuses can be obtained from the same manufacturing process, enabling the mounting and design to be widely used.

(9) By arranging the structure such that either of the electric circuit component held by the electric circuit component holding member or the other electric circuit component can be attached to or detached from the electrically connecting member, if the electric circuit component the other electric circuit component is defective, it can be readily replaced. In addition, since the electric circuit components are connected to and/or held by the electric circuit component holding member arranged such that at least one or more sides thereof is formed with the circuits, handling of it can be readily performed. Since the electrically connecting member is held by either of the electric circuit component, positioning required at the time of performing a connection can be readily conducted. In addition, the thus-established connection exhibits excellent reliability.

(10) By unifying the positional relationship of the conjunction portions, a connection between the electric circuit component whose function is changed held by the electric circuit component holding member and the other electric circuit component can be readily connected to each other. As a result, whenever the electric circuit component holding member holding the electric circuit component is changed, the same electric circuit apparatus can display another function. Therefore, a systematized electric circuit apparatus can be obtained.

(11) The electric circuit components or the other electric circuit components held by or connected to the electric circuit component holding member exhibiting excellent characteristics can be replaced if they are determined as being defective during inspection, even after the production of the electric circuit apparatus. As a result, manufacturing yield can be improved and manufacturing cost can be reduced.

(12) When a double-sided substrate, multilayered substrate or a substrate in which through holes are formed are employed as the electric circuit component holding member, a multilayered structure can be realized by the same method, and 3-D mounting can be performed. As a result, the signal delay time can be shortened by the reduction in the length of the signal line. Therefore, a high speed electric circuit apparatus can be obtained.

In addition, the conjunction portions between the electric circuit apparatuses can be significantly reduced, and a smaller sized apparatus can be manufactured. As a result, product design can be more freely conducted.

(13) By arranging the structure such that, after the electric circuit components are connected to and/or held by the electric circuit component holding member on which the circuit is formed, it is connected to the other electric circuit component, a connection regardless of the size, shape and type of the electric circuit components can be achieved. As a result, free and dense mounting can be performed, and the freedom to design is significantly improved.

(14) By arranging the structure such that after the electric circuit components are connected to and/or held by the electric circuit component holding member on which the circuits are formed, the other circuits and the electric circuit components are connected, and a multilayered structure can be formed by the same method. Therefore, ultra dense 3-D mounting can be performed, and the length of the signal lines can be reduced, enabling the involved delay time to be reduced. In addition, the size of the electric circuit apparatus can be reduced, and the freedom to design can be improved.

(15) By classifying the electric circuit components to be connected to and/or held by the electric circuit component holding member on which the circuits are formed, they can be classified into blocks on the basis of their functions. Therefore, a variety of types of electric circuit apparatuses can be obtained from the same manufacturing process, and their use can be widely expanded.

(16) Since the connection can be collectively performed, the more the number of connecting portions increases, the more reliable a connection can be obtained in a short time.

(17) By arranging the structure that the circuits on the electric circuit component holding member are connected to the electrically connecting member as well as the electric circuit components, a considerably high mounting density can be obtained.

(18) By arranging the structure such that the mechanism or functioning portions for enhancing the positional relationship between the electric circuit component holding member, the other electric circuit components, and the electrically connecting member are provided for the latter, and the positioning between the electric circuit component holding member and the electric circuit components, between the electric circuit component holding member and the other electric circuit components, or between the electric circuit component holding member, the electrically connecting member and the other electric circuit components can be performed with increased precision. That is, the positioning between the conjunction portions of the electric circuit components held or connected to the electric circuit component holding member or the position between the same and the electrically conductive members which appear on the two sides of the electrically connecting member can be performed precisely. Therefore, more precise and wider connections can be performed. The advantage of its reduced positional error will improve the reliability since that area of connection is maintained constant.

(19) When mechanical fittings or abuttings are employed in the electric circuit component holding member, the other electric circuit components, and the electrically connecting member as the reference mechanical portions, the positioning between the electric circuit component holding member, the other electric circuit components, and the electrically connecting member can be readily performed. As a result, the electric circuit components can be connected without the necessity of special positioning.

(20) By arranging the structure that the electric circuit components are sealed by the electric circuit component holding member, any water invasion can be prevented, and corrosion of the wire portions of the connecting areas or the electric circuit components is prevented. As a result, a reliable electric circuit apparatus can be obtained.

In addition, since the functioning portions of the conjunction portions are the electric circuit components are sealed in a hollow manner, any influence of the thermal stress and strain which can generate when connecting a wide area and a large number of the electric circuit components is prevented. As a result, a reliable electric circuit component can be obtained.

In addition, since the electric circuit component holding member can also be used as a cap, the number of required parts can be reduced, and the number of the required manufacturing processes can be reduced since the sealing can be performed at the time of performing the connection. As a result, the cost can be significantly reduced.

(21) When an insulating material made of a conductive material or made of a material in which the conductive material is uniformly mixed is used as the electric circuit component holding member, an electric circuit apparatus exhibiting a shielding effect can be obtained.

We claim:

1. An electric circuit apparatus, comprising:
   an electrically connecting member including a holding body made of an electrically insulating material and a plurality of electrically conductive members embedded in said holding body, wherein first end portions of said electrically conductive members contain a first set of atoms and extend through one side of said holding body and second end portions of said electrically conductive members extend through the other side of said holding body;
   a holding member for holding a plurality of first electric circuit components containing a second set of atoms and being connected to said first end portions of said electrically conductive members;
   a base member for supporting at least one second electric circuit component connected to said second end portions of said electrically conductive members; and positioning means for positioning said electrically conductive member to said holding member and the second electric circuit, wherein the first electric circuit components and said first end portions are connected by contacting together the first and second sets of atoms, and said holding member and said base member are positioned with said electrically connecting member by inserting positioning projections provided at one of said holding member or said base member into holes provided at the other member, and by penetrating said positioning projections through a plurality of holes on said electrically connecting member.

2. An electric circuit apparatus according to claim 1, wherein said holding member is provided with a circuit which establishes an electrical connection with the first electric circuit components.

3. An electric circuit apparatus according to claim 1, wherein the plurality of first electric circuit components are detachably connected to said electrically connecting member.

4. An electric circuit apparatus according to claim 1, wherein the second electric circuit components are detachably connected to said electrically connecting member.

5. An electric circuit apparatus according to claim 1, wherein said first end portions of said electrically conductive members are alloyed with conjunction portions of the plurality of first electric circuit components.

6. An electric circuit apparatus according to claim 1, wherein said second end portions of said electrically conductive member are alloyed with conjunction portions of the second electric circuit components.

7. An electric circuit apparatus according to claim 1, wherein said holding member seals the plurality of first electric circuit components.

8. An electric circuit apparatus according to claim 1, wherein said electrically connecting member has a contour surface with rising portions extending vertically from said one side, and wherein said rising portions fit into complementary spaces formed between the first electric circuit components.

* * * * *

UNITED STATES PATENT AND TRADEMARK OFFICE
CERTIFICATE OF CORRECTION

PATENT NO. : 5,283,468
DATED : February 1, 1994
INVENTOR(S) : Kondo et al.

It is certified that error appears in the above-indentified patent and that said Letters Patent is hereby corrected as shown below: On the title page, item:

[57] ABSTRACT:

Line 7, "member" should read --members--.
Line 9, "member" should read --members--.
Line 10, "connected to the" should read --connected to first end portions of the electrically conductive members and held by a holding member, and second elastic circuit components are connected to the--.

COLUMN 3:

Line 5, "conjunctions" should read --conjunction--.
Line 14, "needs" should be deleted.

COLUMN 5:

Line 28, "which two layered" should read --which a two-layered--.

COLUMN 6:

Line 41, "located" should read --present--.

COLUMN 7:

Line 14, "metyl" should read --methyl-- and "polystylene" should read --polystyrene--.

COLUMN 8:

Line 13, "forced" should read --formed--.
Line 55, "polystylene" should read --polystyrene-- and "metyl" should read --methyl--.

UNITED STATES PATENT AND TRADEMARK OFFICE
CERTIFICATE OF CORRECTION

PATENT NO. : 5,283,468            Page 2 of 6
DATED      : February 1, 1994
INVENTOR(S): Kondo et al.

It is certified that error appears in the above-indentified patent and that said Letters Patent is hereby corrected as shown below:

COLUMN 9:

Line 4, "exemplified" should read --exemplified by--.

COLUMN 10:

Line 9, "made" should read --made of--.
Line 14, "portions" should read --portion--.
Line 63, "201" should be deleted.

COLUMN 11:

Line 42, "each" should read --each other--.
Line 50, delete in its entirety.
Line 51, "electrically" should be deleted.
Line 60, "pressure" should read --pressure applied--.

COLUMN 12:

Line 12, "the melting" should read --the higher melting--.
Line 16, "components" should read --component--.
Line 21, "ponents" should read --ponent--.
Line 38, "no" should read --not--.
Line 51, "function" should read --functioning--.
Line 54, "components" should read --component--.
Line 56, "components," should read --component--.

COLUMN 13:

Line 1, "portions" should read --portion--.
Line 2, "components" should read --component--.
Line 46, "components" should read --component--.

UNITED STATES PATENT AND TRADEMARK OFFICE
CERTIFICATE OF CORRECTION

PATENT NO. : 5,283,468
DATED : February 1, 1994
INVENTOR(S) : Kondo et al.

It is certified that error appears in the above-indentified patent and that said Letters Patent is hereby corrected as shown below:

COLUMN 14:

Line 18, "holding members have" should read --has--.
Line 20, "member" should read --member,--.
Line 42, "components" should read --component--.
Line 45, "nents have" should read --nent has--.
Line 54, "components" should read --component and the other electric circuit component--.
Line 56, "components have" should read --component has--.
Line 66, "the electrically" should read --the electric circuit component and the electrically--.

COLUMN 15:

Line 4, "conduct" should read --conductivity--.
Line 27, "nection" should read --necting--.
Line 54, "member" should read --members--.

COLUMN 16:

Line 40, "member 25;" should read --member 125;--.
Line 58, "allowing" should read --alloying,--.
Line 60, "boy" should read --body--.

COLUMN 17:

Line 3, "and" should read --to--.
Line 9, "polyamide" should read --polyimide--.
Line 25, "end" should read --end portions of the same appear on the side confronting the--.

UNITED STATES PATENT AND TRADEMARK OFFICE
CERTIFICATE OF CORRECTION

PATENT NO. : 5,283,468
DATED : February 1, 1994
INVENTOR(S) : Kondo et al.

Figure 10A:
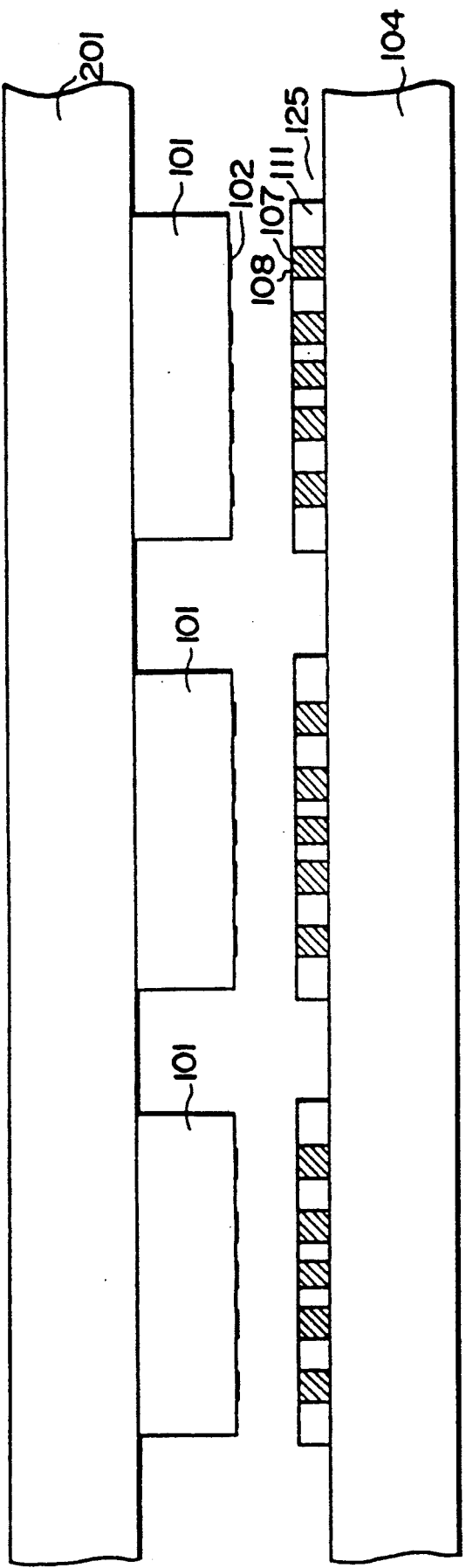
FIGS. 10A and 10B are cross-sectional views which illustrate the states before and after the electrically connecting member of each of the semiconductor devices which have been connected to the circuit substrate are connected to the semiconductor device by using the electric circuit holding member.
Figure 10B:
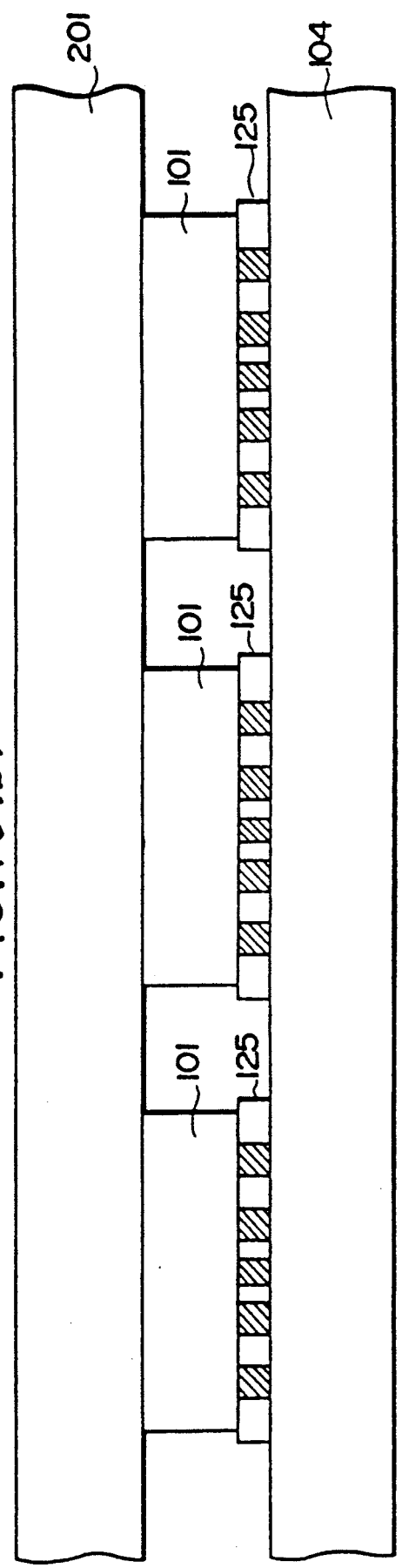

It is certified that error appears in the above-indentified patent and that said Letters Patent is hereby corrected as shown below:

COLUMN 19:

Line 3, "FIG. 19(a)" should read --FIG. 10(a)--.
  Line 41, "portions 1-9" should read --portions 109--.

COLUMN 20:

Line 16, "frame 2" should read --frame 206--.
  Line 27, "positioned" should read --positioned, and then, the electric circuit component holding member 208 and the circuit substrate 104 are positioned--.
  Line 65, "circuit 104" should read --circuit substrate 104--.

COLUMN 26:

Line 59, "FIG. 33(c)" should read --FIG. 33(d)--.

COLUMN 27:

Line 38, "are stacked" should read --are held by the circuit substrate 201. Then, the electrically connecting member 125 and the semiconductor devices 101 are stacked--.
  Line 66, "layer 204 (see" should read --layer 204 made of Mo, W, Pd or the like is formed by spattering. An Au-Sn (20 wt%) layer is formed on this barrier layer 204 (see--.

COLUMN 28:

Line 66, "in" should be deleted.

UNITED STATES PATENT AND TRADEMARK OFFICE
CERTIFICATE OF CORRECTION

PATENT NO. : 5,283,468            Page 5 of 6
DATED     : February 1, 1994
INVENTOR(S) : Kondo et al.

It is certified that error appears in the above-indentified patent and that said Letters Patent is hereby corrected as shown below:

COLUMN 29:

Line 6, "ing" should read --ion--.
Line 44, "is" should be deleted.

COLUMN 31:

Line 38, "which" should read --at which--.

COLUMN 32:

Line 29, "allying" should read --alloying.--

COLUMN 33:

Line 6, "substrate 104" should read --substrate 104 and--.
Line 27, "connection" should read --connections--.

COLUMN 35:

Line 19, "201, the" should read --201 by using an adhesive. After all of the desired semiconductor devices 101 are held by the electric circuit component holding member 201, the--.

COLUMN 37:

Line 64, "When" should read --When both--.

COLUMN 38:

Line 6, "power" should read --powder--.

UNITED STATES PATENT AND TRADEMARK OFFICE
CERTIFICATE OF CORRECTION

PATENT NO. : 5,283,468
DATED : February 1, 1994
INVENTOR(S) : Kondo et al.

It is certified that error appears in the above-indentified patent and that said Letters Patent is hereby corrected as shown below:

Line 21, delete in its entirety.
Line 22, "circuit components." should read --electric circuit component holding member.--.
Line 45, "component" should read --component or--.
Line 58, "changed held" should read --changed and held--.

Signed and Sealed this

Twenty-second Day of November, 1994

Attest:

BRUCE LEHMAN

Attesting Officer

Commissioner of Patents and Trademarks